(12) United States Patent
Takahashi et al.

(10) Patent No.: US 7,914,965 B2
(45) Date of Patent: Mar. 29, 2011

(54) RESIST COMPOSITION AND METHOD OF PATTERN FORMATION WITH THE SAME

(75) Inventors: Hyou Takahashi, Shizuoka (JP); Kenji Wada, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 894 days.

(21) Appl. No.: 11/229,518

(22) Filed: Sep. 20, 2005

(65) Prior Publication Data

US 2006/0068320 A1  Mar. 30, 2006

(30) Foreign Application Priority Data

Sep. 30, 2004 (JP) ................ P.2004-288236

(51) Int. Cl.
*G03F 7/038* (2006.01)
*G03F 7/039* (2006.01)
*G03F 7/30* (2006.01)

(52) U.S. Cl. ............... 430/270.1; 430/915; 430/325; 430/326; 430/175; 522/31; 522/32

(58) Field of Classification Search ........... 522/31, 522/32; 430/915, 175
See application file for complete search history.

(56) References Cited

U.S. PATENT DOCUMENTS

| | | | | |
|---|---|---|---|---|
| 3,976,822 A * | 8/1976 | Thomas et al. | ............... | 428/500 |
| 4,288,562 A * | 9/1981 | Kresta et al. | ............... | 521/121 |
| 5,347,040 A | 9/1994 | Reiser et al. | | |
| 5,527,655 A * | 6/1996 | Bonham et al. | ............... | 430/175 |
| 6,410,204 B1 | 6/2002 | Kodama et al. | | |
| 6,479,211 B1 * | 11/2002 | Sato et al. | ............... | 430/270.1 |
| 7,189,492 B2 * | 3/2007 | Kodama et al. | ............ | 430/270.1 |
| 2002/0058200 A1 * | 5/2002 | Fujimori et al. | ............ | 430/270.1 |
| 2003/0017411 A1 * | 1/2003 | Shimada et al. | ............ | 430/270.1 |
| 2004/0005513 A1 | 1/2004 | Takahashi et al. | | |
| 2004/0180289 A1 | 9/2004 | Shimada et al. | | |
| 2004/0185373 A1 | 9/2004 | Kodama | | |
| 2004/0234888 A1 * | 11/2004 | Lamanna | ............... | 430/270.1 |
| 2005/0064326 A1 * | 3/2005 | Yasunami et al. | ......... | 430/270.1 |

FOREIGN PATENT DOCUMENTS

| | | |
|---|---|---|
| EP | 0 869 393 A1 | 10/1998 |
| EP | 1 517 179 A1 | 3/2005 |
| JP | 6-263720 A | 9/1994 |
| JP | 10-39500 A | 2/1998 |
| JP | 2002-128831 A | 5/2002 |
| JP | 2002-268217 A | 9/2002 |
| JP | 2003-342254 A | 12/2003 |
| JP | 2004-86188 A | 3/2004 |
| WO | WO 97/22910 A1 | 6/1997 |
| WO | WO 02/082185 A1 | 10/2002 |
| WO | WO 2004/107051 A2 | 12/2004 |

OTHER PUBLICATIONS

English translation of JP, 2003-342254, A (2003) from machine translation from AIPN Japan Patent Office National center for Industrial Property Information and Training, generated Jan. 18, 2010, 15 pages.*
European Search Report dated May 30, 2006.
Japanese Office Action dated Jul. 15, 2009.

* cited by examiner

*Primary Examiner* — Cynthia Hamilton
(74) *Attorney, Agent, or Firm* — Sughrue Mion, PLLC

(57) ABSTRACT

A resist composition comprises (A) a compound having a molecular weight of 3,000 or lower which has in its molecule a structure having two or more monovalent anions and a structure having two or more monovalent cations.

19 Claims, 1 Drawing Sheet

RESIST COMPOSITION AND METHOD OF PATTERN FORMATION WITH THE SAME

BACKGROUND OF THE INVENTION

1. Filed of the Invention

The present invention relates to a resist composition which reacts upon irradiation with actinic rays or a radiation and thus changes in property and to a method of pattern formation with the composition. More particularly, the invention relates to a resist composition for use in the production of semiconductor devices, e.g., IC's, production of circuit boards for liquid crystals, thermal heads, etc., and other photofabrication processes, and to a method of pattern formation with the composition.

2. Description of the Related Art

A chemical amplification type resist composition is a material for pattern formation which functions by the following mechanism. Upon irradiation with a radiation such as, e.g., far ultraviolet rays, the composition generates an acid in the exposed areas and undergoes a reaction catalyzed by this acid. As a result, the composition comes to have a difference in solubility in a developing solution between the areas irradiated with the actinic radiation and the unirradiated areas to thereby form a pattern on the substrate.

In the case where a KrF excimer laser is employed as an exposure light source, a resin having a poly(hydroxystyrene) backbone, which shows reduced absorption mainly in a 248-nm region, is used as the main component. Because of this, the composition has high sensitivity and forms satisfactory patterns with high resolution. It is hence a better system as compared with the naphthoquinonediazide/novolak resin system heretofore in use.

On the other hand, in the case where a light source having a shorter wavelength, e.g., an ArF excimer laser (193 nm), is used as an exposure light source, even the chemical amplification type system has been insufficient because compounds having aromatic groups intrinsically show considerable absorption in a 193-nm region.

Because of this, resists for an ArF excimer laser which contain a resin having an alicyclic hydrocarbon structure have been developed.

With respect to the acid generator also, which is a major component of chemical amplification type resists, various compounds were found to be useful. In JP-A-10-39500 is described a resist composition containing a sulfonium salt having two or more anions in the molecule.

However, this resist composition was still insufficient in PEB temperature dependence and sensitivity, and improvements in these properties have been desired.

SUMMARY OF THE INVENTION

Accordingly, an object of the invention is to provide a resist composition improved in PEB temperature dependence and sensitivity. Another object of the invention is to provide a method of pattern formation with the composition.

The invention has the following constitutions, with which the objects of the invention are accomplished.

(1) A resist composition comprising (A) a compound having a molecular weight of 3,000 or lower which has in the same molecule a structure having two or more monovalent anions and a structure having two or more monovalent cations.

(2) The resist composition as described under (1) above wherein the compound as ingredient (A) has a structure represented by the following general formula (I) and/or a structure represented by the following general formula (II):

$$A_1\text{-}(A_2\text{-}Y_1^{\ominus})_{n1} \quad (I)$$

wherein $A_1$ represents a connecting group having a valence of $n_1$;

$A_2$ represents a single bond, a divalent aliphatic group, or an arylene group, provided that the $n_1$ $A_2$'s may be the same or different;

$Y_1$ represents $SO_3$, $CO_2$, or $PO_3H$, provided that the $Y_1$'s may be the same or different; and $n_1$ represents an integer of 2 to 4, $$\left[\left(R_1\right)_l \left\{(R_1)_l \atop X_1^{\oplus} \atop R_2\right\} \left(A\right) \left(X_1^{\oplus} \atop \oplus\right)_m \right]_n \left(A\right) \quad (II)$$

wherein $X_1$ represents a sulfur atom, an iodine atom, or a nitrogen atom, provided that the $X_1$'s may be the same or different;

$R_1$ and $R_2$ each independently represent an alkyl group, a cycloalkyl group, or an aryl group, provided that when two or more $R_1$'s are present, the $R_1$'s may be the same or different and that when two or more $R_2$'s are present, the $R_2$'s may be the same or different;

A represents a hydrocarbon structure which connects $X_1$'s to each other, provided that when two or more A's are present, the A's may be the same or different;

$R_1$ and $R_2$, $R_1$ and A, or $R_2$ and A may be bonded to each other to form a ring;

l represents 0, 1, or 2, provided that when $X_1$ is a nitrogen atom, then l is 2, when $X_1$ is a sulfur atom, then l is 1, and when $X_1$ is an iodine atom, then l is 0;

m represents an integer of 0 to 10; and n represents an integer of 1 to 6, provided that when m is 0, then n is an integer of 2 or larger.

(3) The resist composition as described under (2) above wherein at least one of the $Y_1$'s in general formula (I) is selected from $SO_3$ and $CO_2$, and at least one of the group represented by $A_1$ and the groups represented by $A_2$ has one or more fluorine atoms.

(4) The resist composition as described under any one of (1) to (3) above which further comprises a compound having in the molecule a structure having one monovalent anion.

(5) The resist composition as described under (4) above wherein the structure having one monovalent anion is represented by the following general formula (III):

$$A_3\text{-}Y_2^{\ominus} \quad (III)$$

wherein $A_3$ represents an alkyl group, an alicyclic group, or an aryl group; and $Y_2$ represents $SO_3$, $CO_2$, or $PO_3H$.

(6) The resist composition as described under (5) above wherein $Y_2$ in general formula (III) is selected from $SO_3$ and $CO_2$.

(7) The resist composition as described under any one of (1) to (6) above which further comprises a compound having a structure represented by the following general formula (IV):

(IV)

wherein $X_2$ represents a sulfur atom, an iodine atom, or a nitrogen atom;

$R_{1a}$ represents an alkyl group, a cycloalkyl group, or an aryl group, provided that the $R_{1a}$'s may be the same or different and that two or more of the $R_{1a}$'s may be bonded to each other to form a ring; and q represents 2, 3, or 4, provided that when $X_2$ is a nitrogen atom, then q is 4, when $X_2$ is a sulfur atom, then q is 3, and when $X_2$ is an iodine atom, then q is 2.

(8) The resist composition as described under any one of (1) to (7) above which further comprises: a resin selected from (B) a resin which decomposes by the action of an acid to come to have enhanced solubility in an alkaline developer and (D) a resin soluble in an alkaline developer; and (H) an organic solvent.

(9) A method of pattern formation which comprises forming a film from the resist composition as described under any one of (1) to (8) above, exposing the film to a light, and then developing the film.

Other preferred embodiments of the invention are shown below.

(10) A positive resist composition as described under any one of (1) to (8) above further comprising (B) a resin which decomposes by the action of an acid to come to have enhanced solubility in an alkaline developer.

(11) The positive resist composition as described under (10) above wherein the resin (B) which decomposes by the action of an acid to come to have enhanced solubility in an alkaline developer has fluorine atoms in the main chain or side chains thereof.

(12) The positive resist composition as described under (11) above wherein the resin (B) which decomposes by the action of an acid to come to have enhanced solubility in an alkaline developer has a hexafluoroisopropanol structure.

(13) The positive resist composition as described under (10) above wherein the resin (B) which decomposes by the action of an acid to come to have enhanced solubility in an alkaline developer has hydroxystyrene structural units.

(14) The positive resist composition as described under (10) above wherein the resin (B) which decomposes by the action of an acid to come to have enhanced solubility in an alkaline developer has a monocyclic or polycyclic, alicyclic hydrocarbon structure.

(15) The positive resist composition as described under (14) above wherein the resin (B) which decomposes by the action of an acid to come to have enhanced solubility in an alkaline developer further has repeating units having a lactone structure.

(16) The positive resist composition as described under any one of (10) to (15) above which further comprises (C) a dissolution inhibitive compound having a molecular weight of 3,000 or lower which decomposes by the action of an acid to come to have enhanced solubility in an alkaline developing solution.

(17) A positive resist composition as described under any one of (1) to (8) above further comprising
(D) a resin soluble in an alkaline developer and
(C) a dissolution inhibitive compound having a molecular weight of 3,000 or lower which decomposes by the action of an acid to come to have enhanced solubility in an alkaline developer.

(18) A negative resist composition as described under any one of (1) to (8) above further comprising
(D) a resin soluble in an alkaline developer and
(E) an acid-sensitive crosslinking agent which, by the action of an acid, crosslinks the resin soluble in an alkaline developer.

(19) The resist composition as described under any one of (1) to (8) and (10) to (18) above which further comprises (F) a basic compound and/or (G) a fluorochemical and/or silicone surfactant (i.e., a surfactant having at least one of a fluorine atom and a silicon atom).

(20) The resist composition as described under (19) above wherein the basic compound (F) is a compound having a structure selected from an imidazole structure, diazabicyclo structure, onium hydroxide structure, onium carboxylate structure, trialkylamine structure, aniline structure, and pyridine structure, an alkylamine derivative having a hydroxyl group and/or an ether bond, or an aniline derivative having a hydroxyl group and/or an ether bond.

Figure 1:
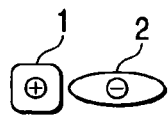
FIG. 1 is a diagrammatic view illustrating an ion pair composed of one monovalent cation and one monovalent anion.

1 denotes a monovalent cation; 2 denotes a monovalent anion; 3 denotes a structure represented by general formula (I); 4 denotes a structure represented by general formula (II); and 5 denotes a pseudo-polymer.

DETAILED DESCRIPTION OF THE INVENTION

The invention will be explained below in detail.

With respect to expressions of groups (atomic groups) in this specification, the expressions including no statement as to whether the groups are substituted or unsubstituted imply both of groups having no substituents and groups having one or more substituents. For example, "alkyl group" implies both an alkyl group having no substituents (unsubstituted alkyl group) and an alkyl group having one or more substituents (substituted alkyl group).

The resist composition of the invention, more preferably the positive resist composition, contains (A) a compound having a molecular weight of 3,000 or lower which has in the same molecule a structure having two or more monovalent anions and a structure having two or more monovalent cations and (B) a resin which decomposes by the action of an acid to come to have enhanced solubility in an alkaline developer, and optionally further contains (C) a dissolution inhibitive compound having a molecular weight of 3,000 or lower which decomposes by the action of an acid to come to have enhanced solubility in an alkaline developer. Alternatively, the resin composition contains (A) a compound having a molecular weight of 3,000 or lower which has in the same molecule a structure having two or more monovalent anions and a structure having, two or more monovalent cations, (D) a resin soluble in an alkaline developer, and (C) a dissolution inhibitive compound having a molecular weight of 3,000 or lower which decomposes by the action of an acid to come to have enhanced solubility in an alkaline developer.

The resist composition of the invention, more preferably the negative resist composition, contains (A) a compound having a molecular weight of 3,000 or lower which has in the same molecule a structure having two or more monovalent anions and a structure having two or more monovalent cations, (D) a resin soluble in an alkaline developer, and (E) an acid-sensitive crosslinking agent which, by the action of an acid, crosslinks the resin soluble in an alkaline developer.

[1] (A) Compound Having Molecular Weight of 3,000 or Lower which has, in the Same Molecule, Structure Having Two or More Monovalent Anions and Structure Having Two or More Monovalent Cations The resist composition of the invention contains a compound having a molecular weight of 3,000 or lower which has in the same molecule a structure having two or more monovalent anions and a structure having two or more monovalent cations (referred to also as "compound (A)").

The structure having two or more monovalent anions preferably is a structure represented by the following general formula (I).

In general formula (I), $A_1$ represents a connecting group having a valence of $n_1$;

$A_2$ represents a single bond, a divalent aliphatic group, or an arylene group, provided that the $n_1$ $A_2$'s may be the same or different;

$Y_1$ represents $SO_3$, $CO_2$, or $PO_3H$, provided that the $Y_1$'s may be the same or different; and $n_1$ represents an integer of 2 to 4.

Examples of the connecting group represented by $A_1$ include an alkylene group, cycloalkylene group, arylene group, alkenylene group, single bond, ether bond, ester bond, amide bond, sulfide bond, urea bond, and connecting group made up of two or more of these connected to each other.

The alkylene group represented by $A_1$ may have one or more substituents. Preferred examples thereof include alkylene groups having 1-8 carbon atoms, such as, e.g., methylene, ethylene, propylene, butylene, hexylene, and octylene.

The cycloalkylene group represented by $A_1$ may have one or more substituents. Preferred examples thereof include cycloalkylene groups having 3-8 carbon atoms, such as, e.g., cyclopentylene and cyclohexylene.

The alkenylene group represented by A, may have one or more substituents. Preferred examples thereof include alkenylene groups having 2-6 carbon atoms, such as, e.g., ethenylene, propenylene, and butenylene.

The arylene group represented by $A_1$ may have one or more substituents. Preferred examples thereof include arylene groups having 6-15 carbon atoms, such as, e.g., phenylene, tolylene, and naphthylene.

Examples of the substituents which may be possessed by those groups include cycloalkyl groups, aryl groups, substituents having active hydrogen, such as amino, amide, ureido, urethane, hydroxyl, and carboxyl groups, halogen atoms (fluorine, chlorine, bromine, and iodine atoms), alkoxy groups (e.g., methoxy, ethoxy, propoxy, and butoxy), thioether groups, acyl groups (e.g., acetyl, propanoyl, and benzoyl), acyloxy groups (e.g., acetoxy, propanoyloxy, and benzoyloxy), alkoxycarbonyl groups (e.g., methoxycarbonyl, ethoxycarbonyl, and propoxycarbonyl), cyano, and nitro. With respect to the arylene group, examples of the substituents further include alkyl groups (e.g., methyl, ethyl, propyl, and butyl).

The divalent aliphatic group represented by $A_2$ preferably is an alkylene or cycloalkylene group having 1-8 carbon atoms, and more preferably is an alkylene or cycloalkylene group substituted by one or more fluorine atoms or fluoroalkyl groups.

The alkylene group represented by $A_2$ may have one or more substituents. Preferred examples thereof include alkylene groups having 1-8 carbon atoms, such as methylene, ethylene, propylene, butylene, hexylene, and octylene.

The cycloalkylene group represented by $A_2$ may have one or more substituents. Preferred examples thereof include cycloalkylene groups having 3-8 carbon atoms, such as cyclopentylene and cyclohexylene.

The fluoroalkyl groups (alkyl groups in which at least one hydrogen atom has been replaced by a fluorine atom) which are preferably possessed by the alkylene or cycloalkylene group represented by $A_2$ may have one or more substituents. The fluoroalkyl groups each have preferably 1-8 carbon atoms, more preferably 1-3 carbon atoms. Examples thereof include monofluoromethyl, difluoromethyl, trifluoromethyl, 2,2,2-trifluoroethyl, pentafluoroethyl, 2,2,3,3,3-pentafluoropropyl, heptafluoropropyl, 2,2,3,3,4,4,4-heptafluorobutyl, nonafluorobutyl, and perfluorohexyl. Examples of the substituents which may be possessed by the fluoroalkyl groups include hydroxyl, alkoxy groups (preferably having 1-5 carbon atoms), halogen atoms, and cyano.

At least one of the group represented by $A_1$ and the groups represented by $A_2$ preferably has one or more fluorine atoms.

$A_2$ preferably is an aliphatic group comprising a structure represented by the following formula (V).

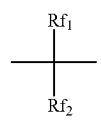

$Rf_1$ and $Rf_2$ each independently represent a hydrogen atom, halogen atom, alkyl group, or cycloalkyl group, provided that at least one of these is a fluorine atom or a fluoroalkyl group.

The alkyl groups represent by $Rf_1$ and $Rf_2$ may have one or more substituents and each preferably are an alkyl group having 1-8 carbon atoms. Preferred examples of the alkyl groups include methyl, ethyl, propyl, n-butyl, and sec-butyl. Preferred examples of the substituents which may be possessed by the alkyl groups represented by $Rf_1$ and $Rf_2$ include halogen atoms.

The cycloalkyl groups represented by $Rf_1$ and $Rf_2$ may have one or more substituents and each preferably are a cycloalkyl group having 3-8 carbon atoms. Preferred examples thereof include cyclopentyl and cyclohexyl.

The fluoroalkyl groups represented by $Rf_1$ and $Rf_2$ each are a group formed by substituting any of the aforementioned alkyl and cycloalkyl groups with one or more fluorine atoms. Examples thereof include the same groups as those enumerated above as examples of the fluoroalkyl groups described above.

Symbol $n_1$ represents an integer of 2 to 4, preferably 2 or 3, more preferably 2.

It is preferred that the structure represented by general formula (V) be bonded to the position adjacent to the group represented by $Y_1$ (e.g., to the sulfur atom of the sulfonic acid group).

The structure represented by general formula (I) preferably is a structure represented by the following general formula (VI).

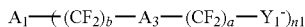
(VI)

$A_1$, $Y_1$, and $n_1$ have the same meanings as the $A_1$, $Y_1$, and $n_1$ in general formula (I).

$A_3$ represents a single bond, ether bond, sulfide bond, alkylene group, cycloalkylene group, or arylene group, and more preferably is a single bond or an ether bond. The n $A_3$'s may be the same or different.

Symbol a represents an integer of 1 to 4.

Symbol b represents an integer of 0 to 4.

With respect to the alkylene, cycloalkylene, or arylene group represented by $A_3$, the same explanation made above on the alkylene, cycloalkylene, or arylene group represented by $A_1$ applies.

Symbol a preferably represents 1 or 2.

Symbol b preferably represents 0 to 2.

The structure represented by general formula (I) more preferably is a structure represented by any of the following general formulae (Ia) to (Ih).

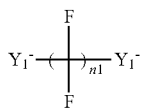
(Ia)

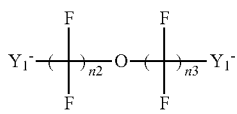
(Ib)

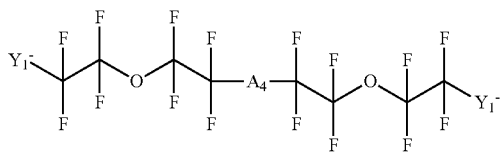
(Ic)

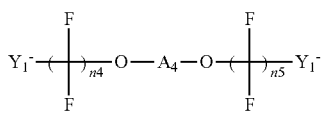
(Id)

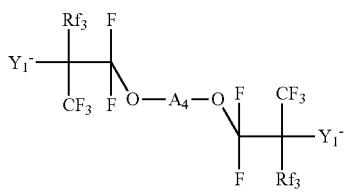
(Ie)

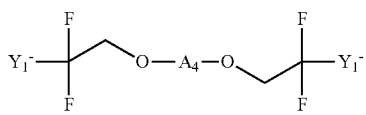
(If)

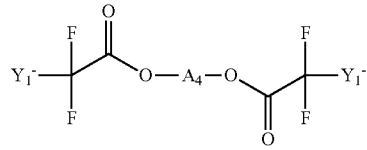
(Ig)

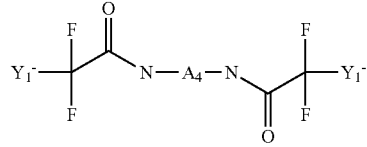
(Ih)

$Y_1$ has the same meaning as the $Y_1$ in general formula (I).

$A_4$ represents an alkylene group, cycloalkylene group, or arylene group or a group comprising two or more of these connected to each other through at least one of a single bond, ether bond, ester bond, amide bond, sulfide bond, and urea bond.

Symbols n1 to n5 each represent an integer of 1 to 8, preferably an integer of 1 to 4.

$Rf_3$'s each independently represent a fluorine atom or a fluoroalkyl group.

With respect to the alkylene, cycloalkylene, or arylene group represented by $A_4$, the same explanation made above on the alkylene, cycloalkylene, or arylene group represented by $A_1$ applies.

Examples of the fluoroalkyl group represented by $Rf_3$ are the same as those enumerated above.

In general formula (I), it is preferred that at least one of the $Y_1$'s be selected from $SO_3$ and $CO_2$ and at least one of the group represented by $A_1$ and groups represented by $A_2$ have one or more fluorine atoms.

Preferred examples of the structure represented by general formula (I) are shown below.

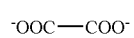
(I)-1

(I)-2

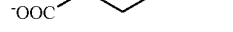
(I)-3

(I)-4

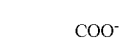
(I)-5

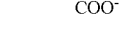
(I)-6

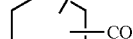
(I)-7

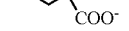

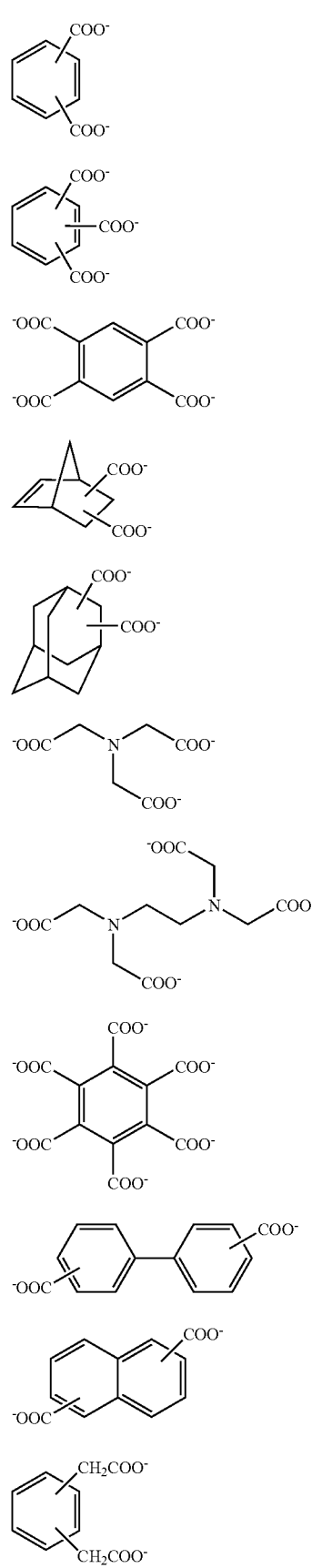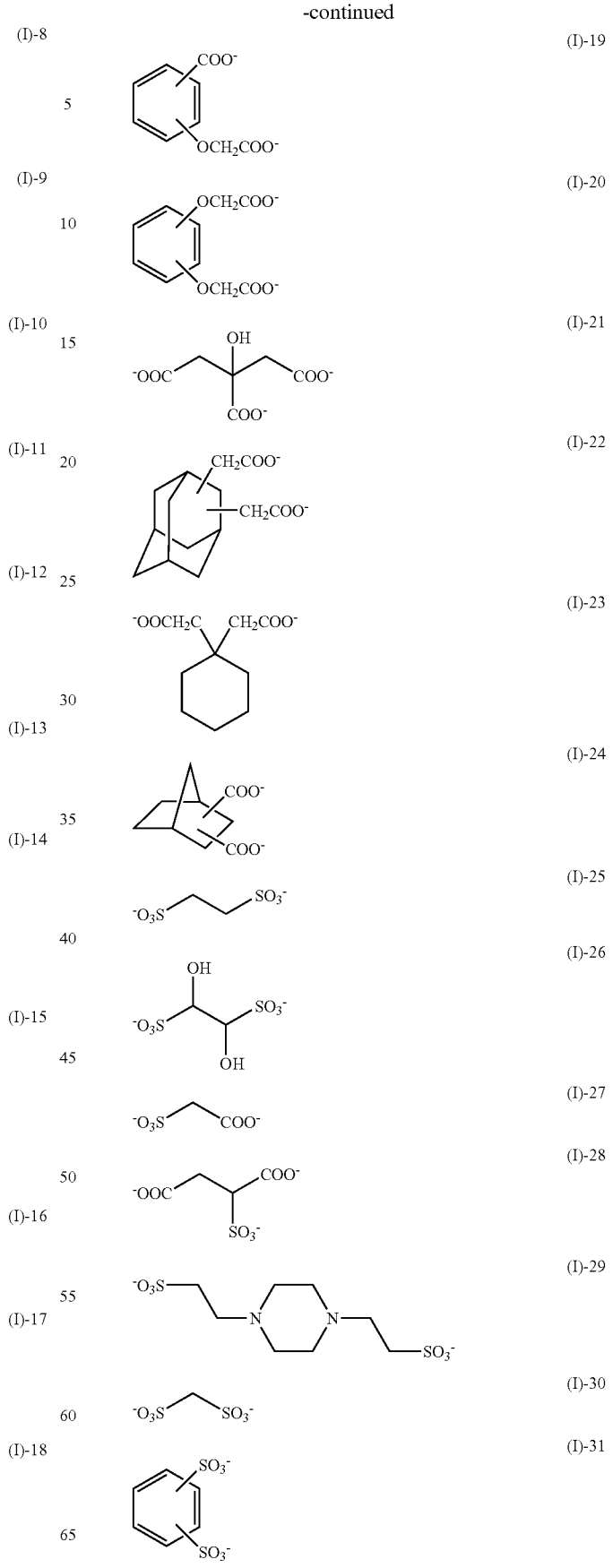

11 -continued
(I)-32 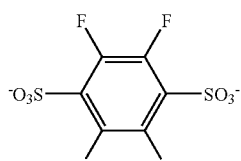
(I)-33 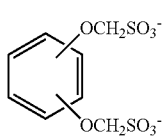
(I)-34 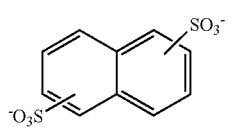
(I)-35 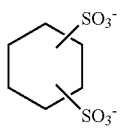
(I)-36 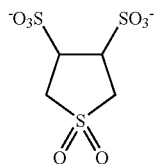
(I)-37 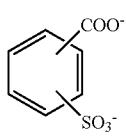
(I)-38 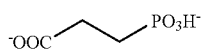
(I)-39 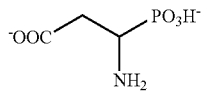
(I)-40 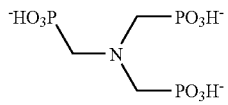
(I)-41 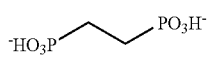
(I)-42 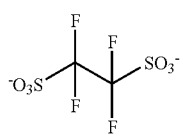
(I)-43 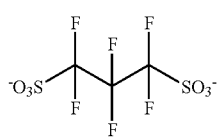
12 -continued
(I)-44 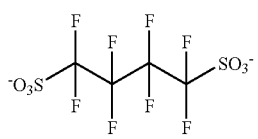
(I)-45 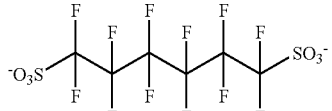
(I)-46 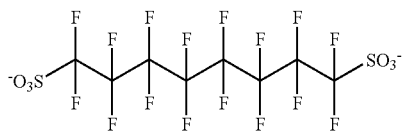
(I)-47 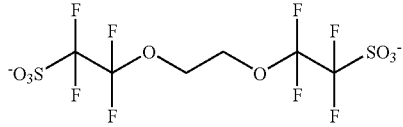
(I)-48 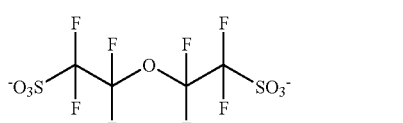
(I)-49 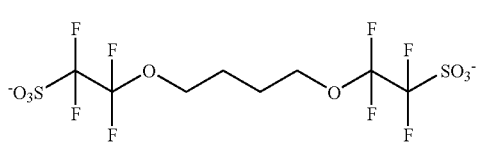
(I)-50 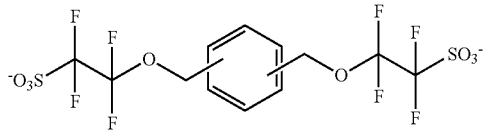
(I)-51 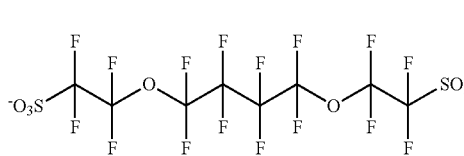
(I)-51 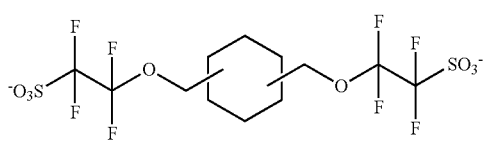
(I)-52 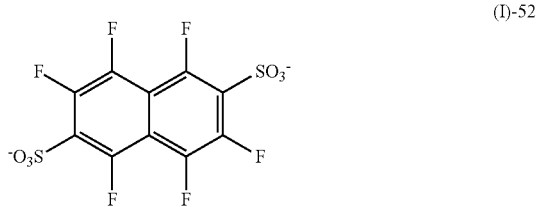

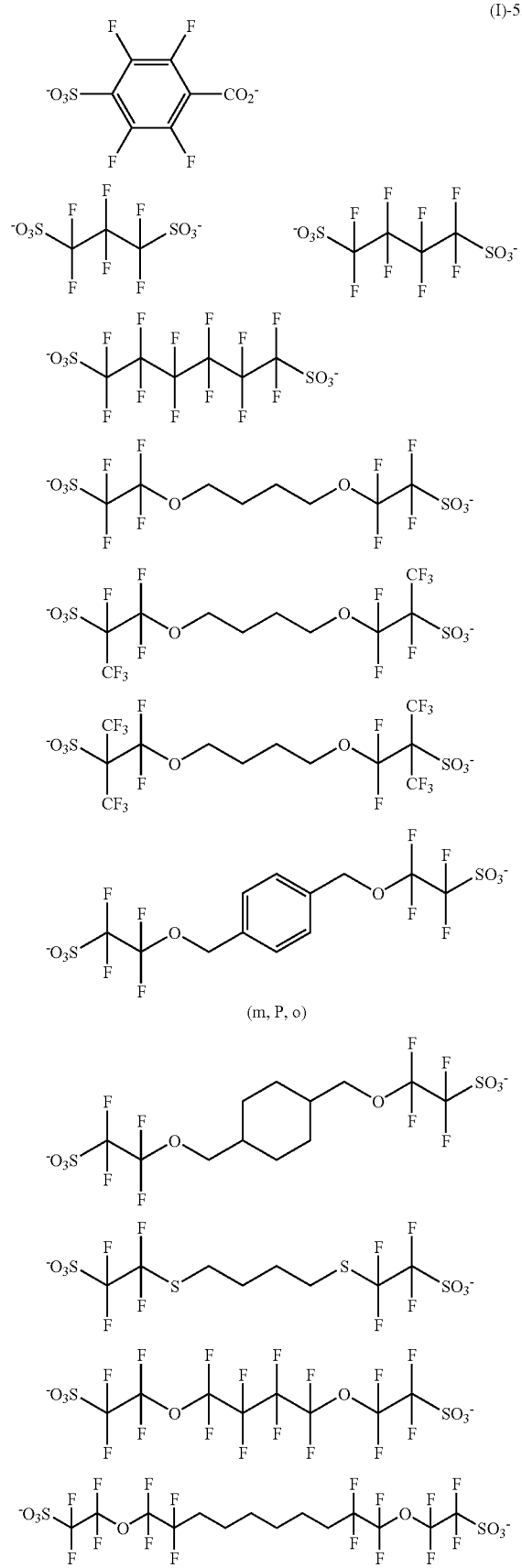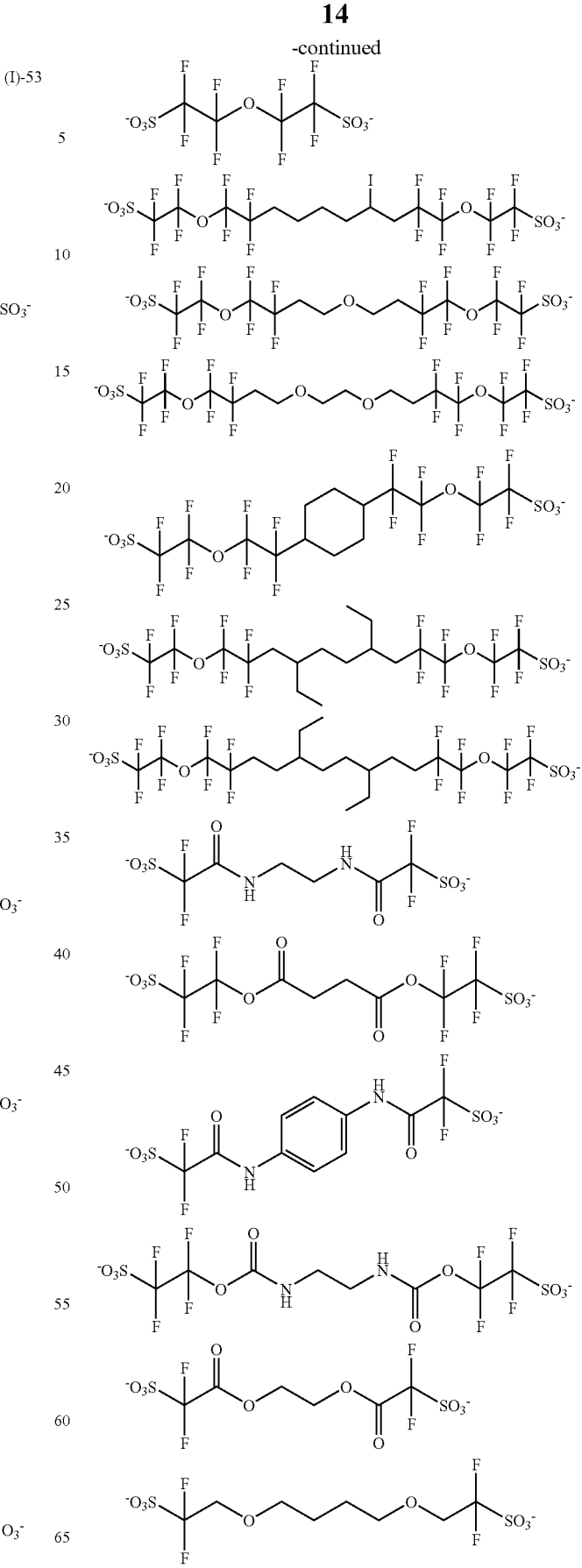

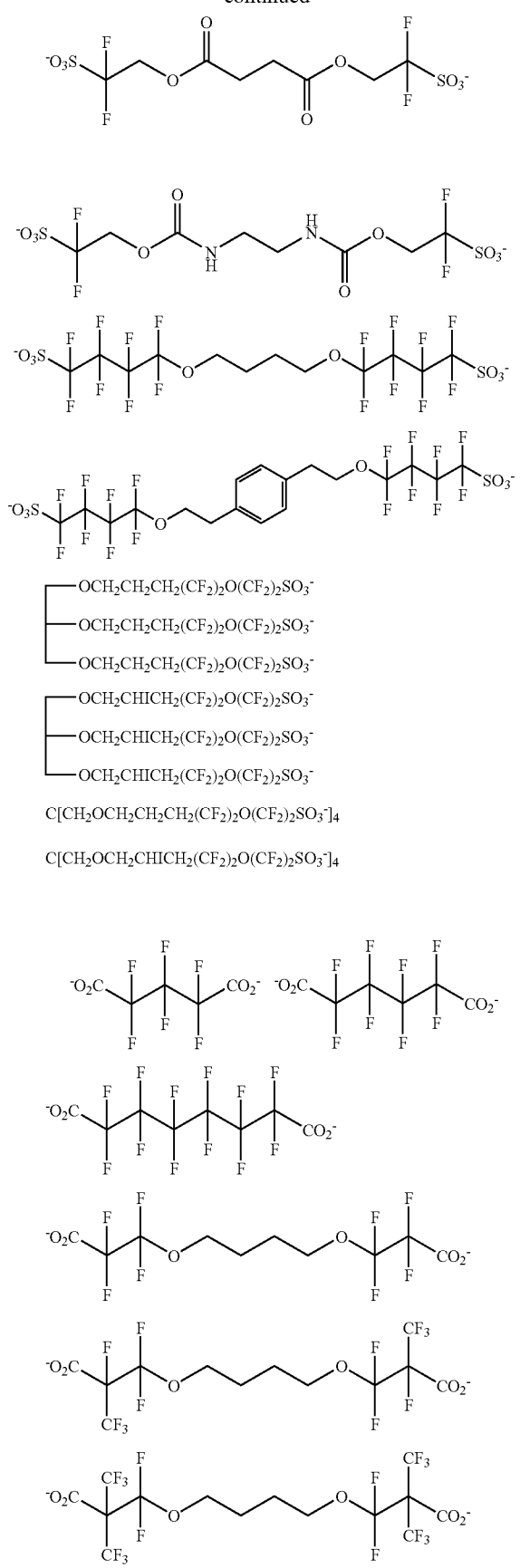
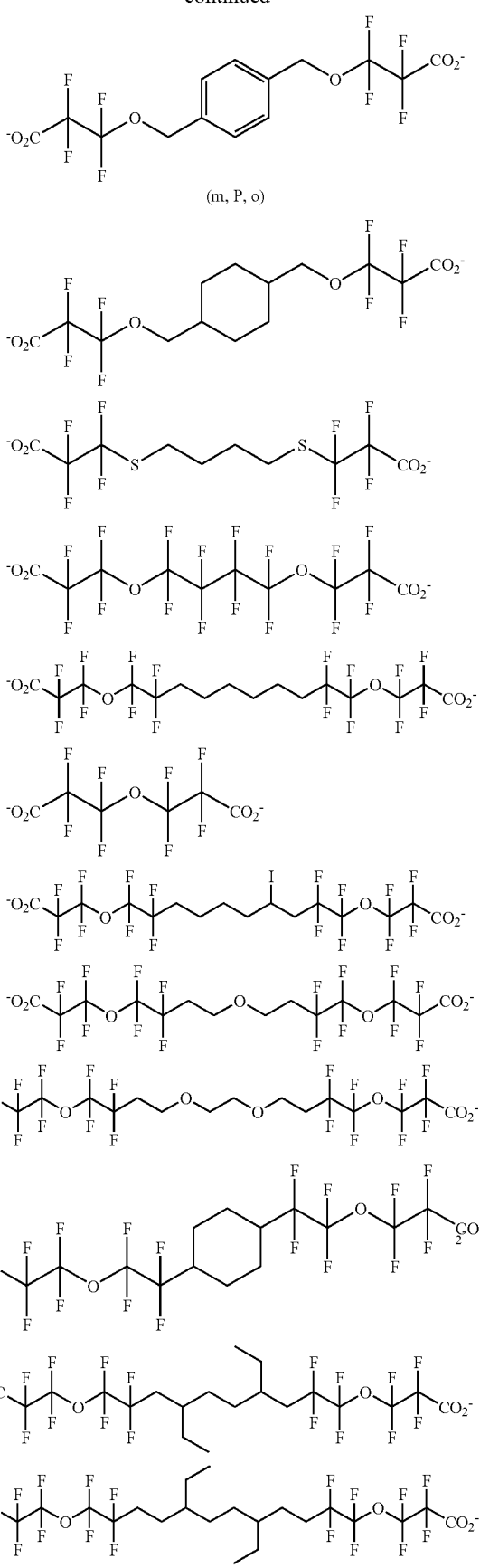

-continued
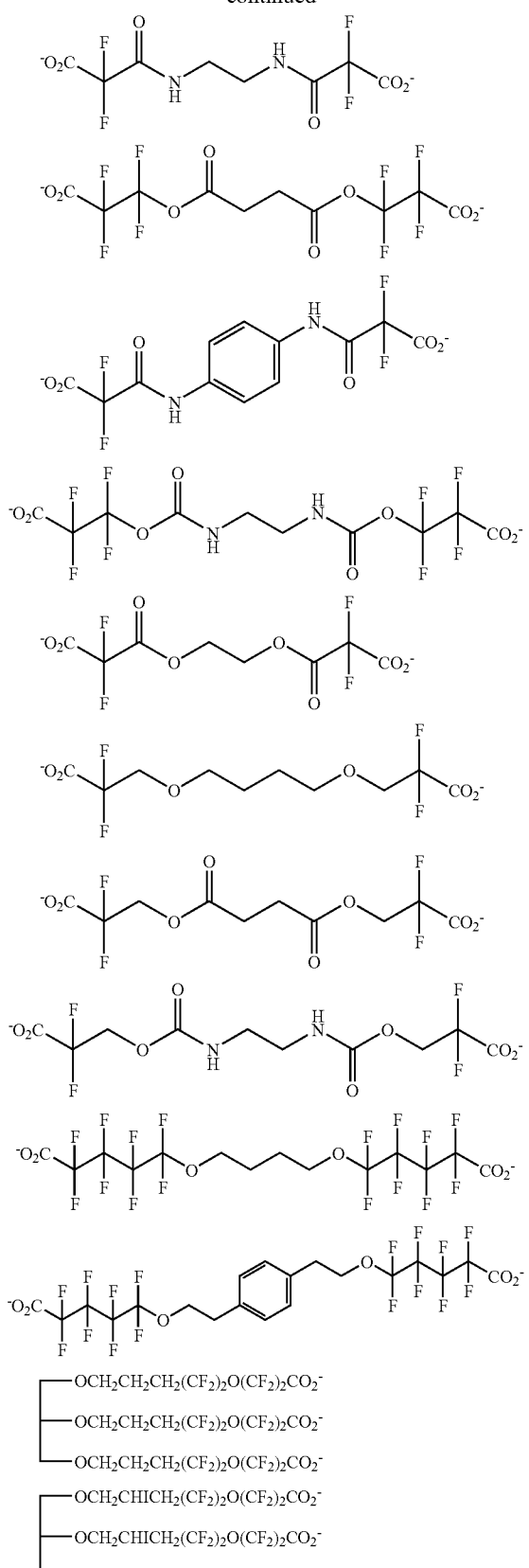
-continued
C[CH$_2$OCH$_2$CHICH$_2$(CF$_2$)$_2$O(CF$_2$)$_2$CO$_2^-$]$_4$
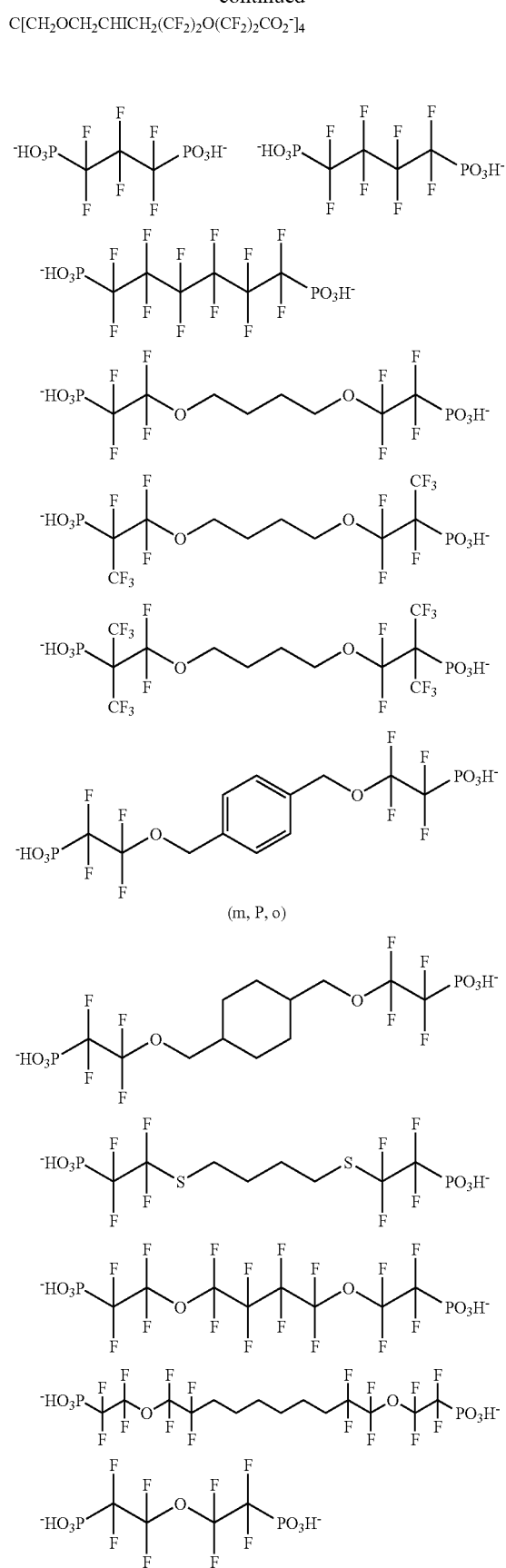
(m, P, o)

-continued

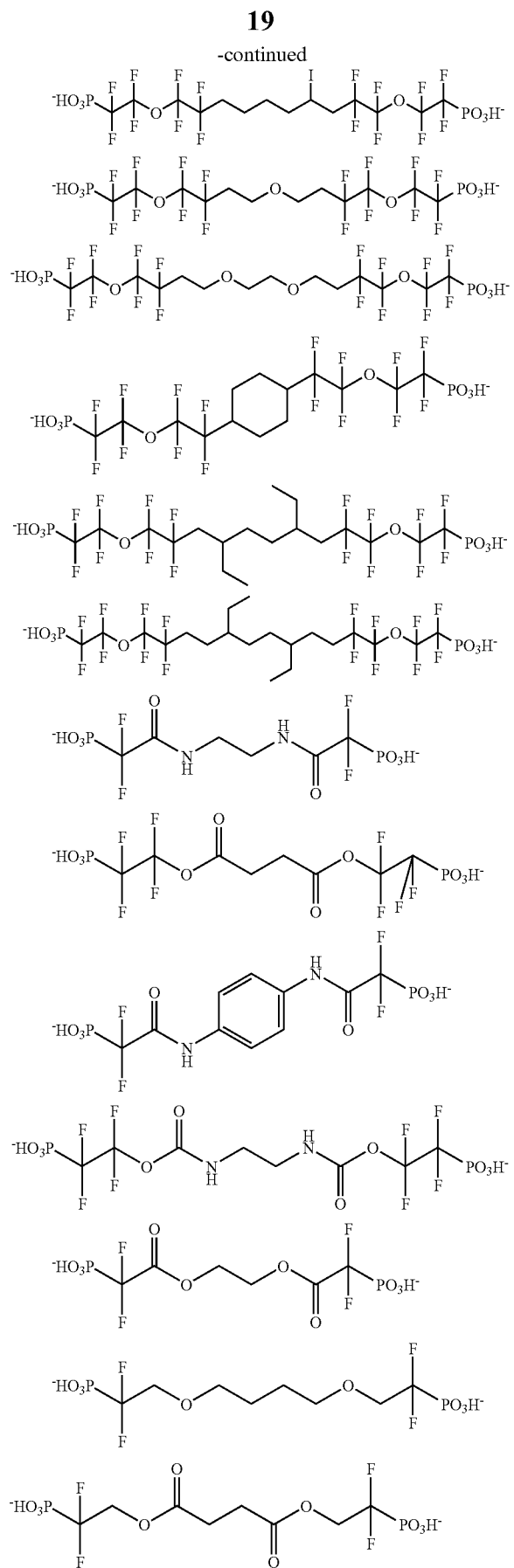

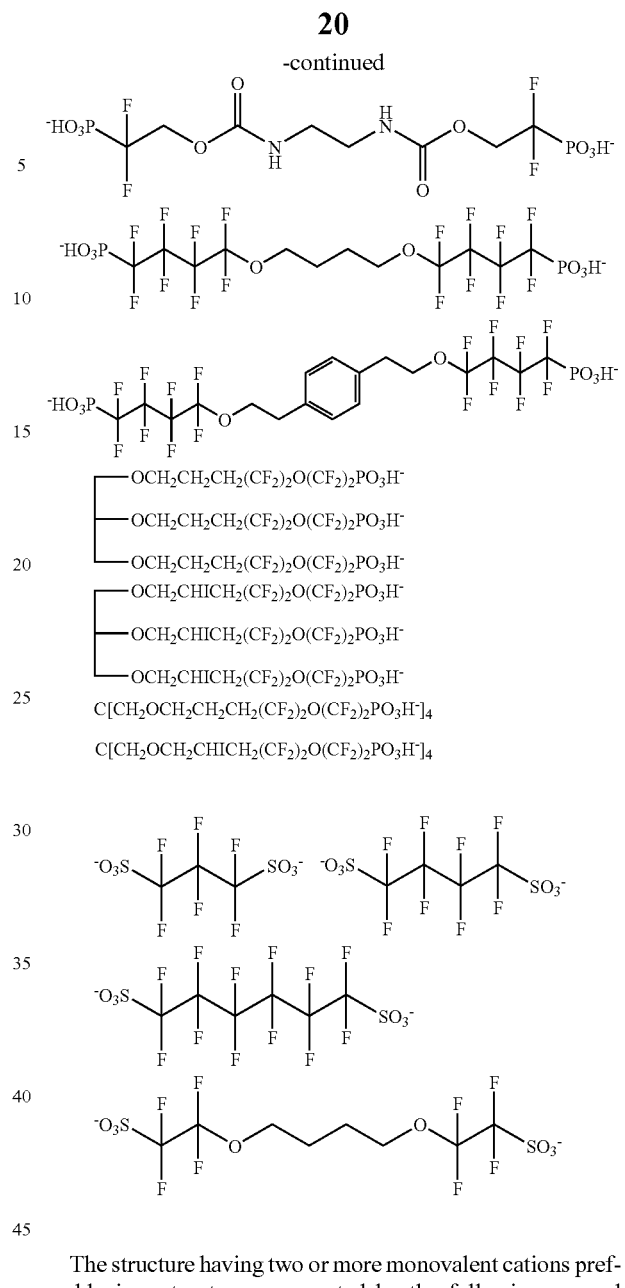

The structure having two or more monovalent cations preferably is a structure represented by the following general formula (II).

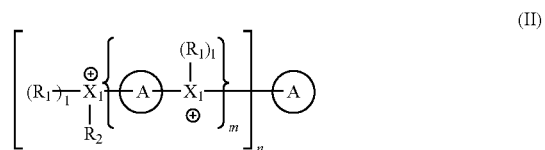

In general formula (II), $X_1$ represents a sulfur atom, an iodine atom, or a nitrogen atom, provided that the $X_1$'s may be the same or different;

$R_1$ and $R_2$ each independently represent an alkyl group, a cycloalkyl group, or an aryl group, provided that when two or more $R_1$'s are present, the $R_1$'s may be the same or different and that when two or more $R_2$'s are present, the $R_2$'s may be the same or different;

A represents a hydrocarbon structure which connects $X_1$'s to each other, provided that when two or more A's are present, the A's may be the same or different;

$R_1$ and $R_2$, $R_1$ and A, or $R_2$ and A may be bonded to each other to form a ring;

l represents 0, 1, or 2, provided that when $X_1$ is a nitrogen atom, then l is 2, when $X_1$ is a sulfur atom, then l is 1, and when $X_1$ is an iodine atom, then l is 0;

m represents an integer of 0 to 10; and n represents an integer of 1 to 6, provided that when m is 0, then n is an integer of 2 or larger.

The alkyl groups represented by $R_1$ and $R_2$ in general formula (II) preferably are alkyl groups having 1-8 carbon atoms and may be either linear or branched alkyl groups. Examples thereof include methyl, ethyl, propyl, isopropyl, butyl, isobutyl, t-butyl, pentyl, neopentyl, hexyl, heptyl, and octyl.

The cycloalkyl groups represented by $R_1$ and $R_2$ preferably are cycloalkyl groups having 3-8 carbon atoms. Examples thereof include cyclopropyl, cyclobutyl, cyclopentyl, cyclohexyl, norbornyl, and adamantyl.

The aryl groups represented by $R_1$ and $R_2$ preferably are aryl groups having 6-16 carbon atoms. Examples thereof include phenyl, naphthyl, anthranyl, phenanthrenyl, and pyrenyl.

The hydrocarbon structure represented by A has 4-16 carbon atoms and is constituted of a combination of bonds selected from C—C single, double, and triple bonds, provided that these bonds may be separated by an oxygen atom, sulfur atom, or nitrogen atom. The hydrocarbon structure preferably is one having a conjugated structure, and most preferably is one having an aromatic ring structure. Examples of such hydrocarbon structures are shown below. However, the hydrocarbon structure in the invention should not be construed as being limited to the following examples, wherein $R_3$ represents a hydrogen atom, an alkyl group having 1-12 carbon atoms, or a halogen atom and n represents an integer of 1-20. The hydrocarbon structure represented by A may have one or more substituents, and examples of the substituents include alkyl groups having 1-12 carbon atoms, halogen atoms, hydroxyl, carboxyl, cyano, nitro, alkoxy groups having 1-10 carbon atoms, and amino.

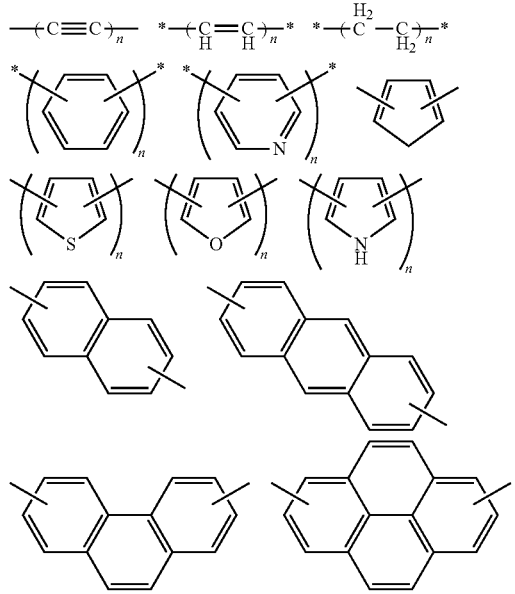

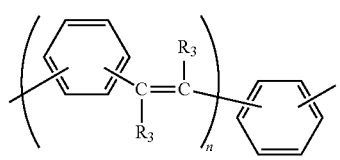

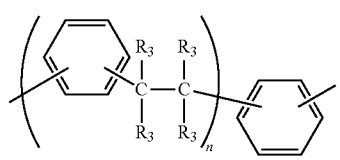

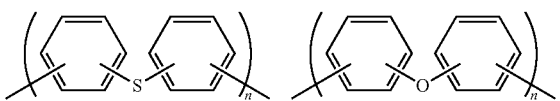

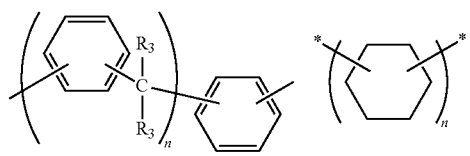

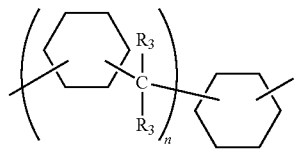

Preferred examples of the structure represented by general formula (II) are shown below.

(II)-1

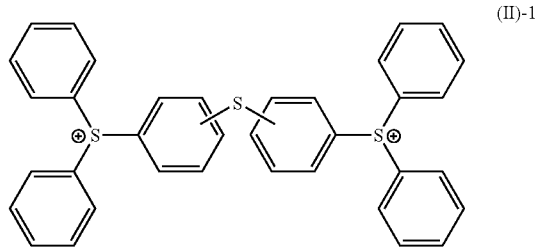

(II)-2

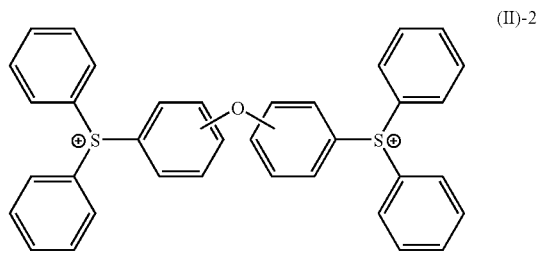

(II)-3

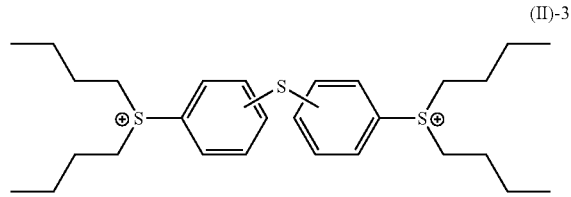

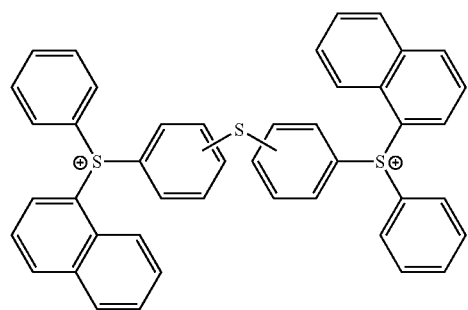
(II)-4
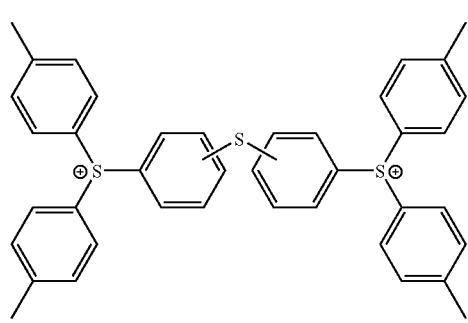
(II)-5
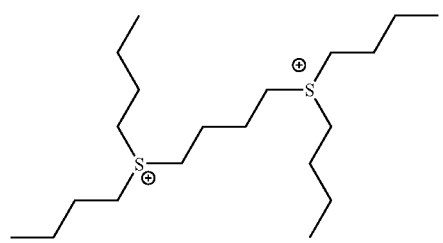
(II)-6
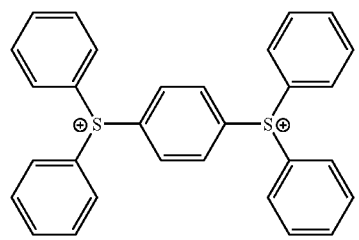
(II)-7
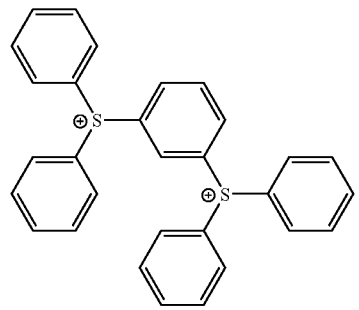
(II)-8
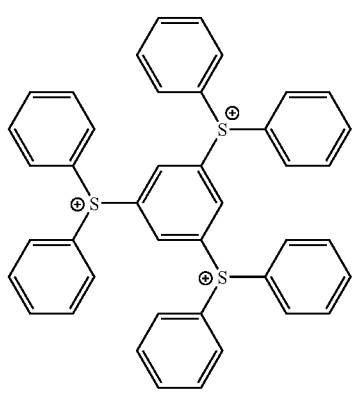
(II)-9
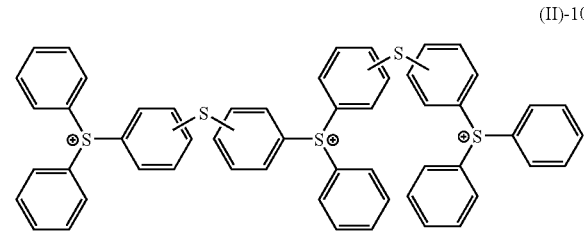
(II)-10
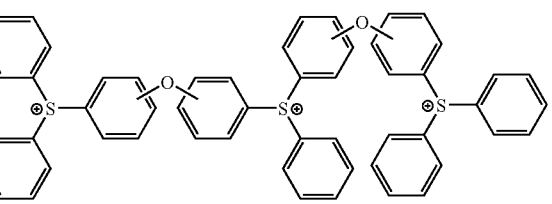
(II)-11
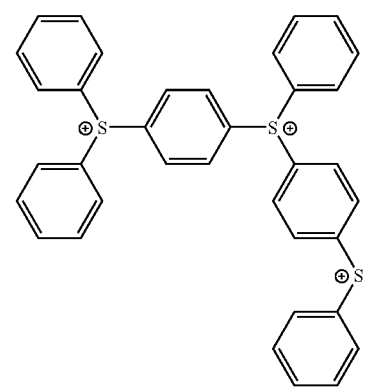
(II)-12
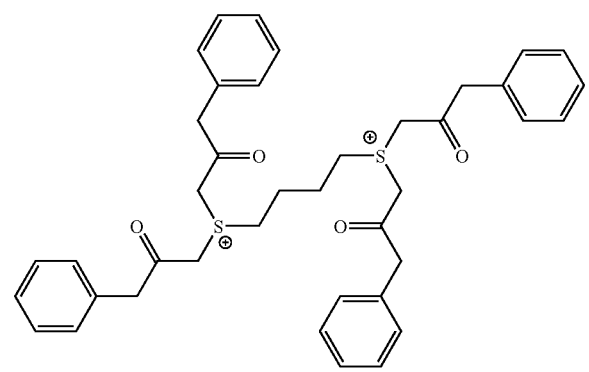
(II)-13

-continued
(II)-14
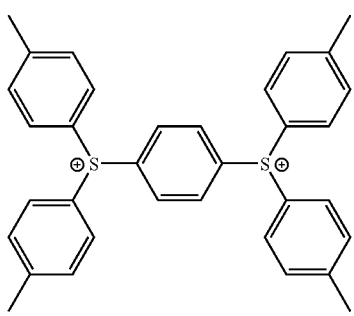
(II)-15
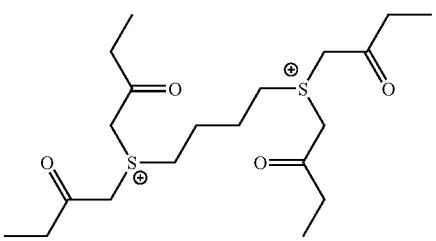
(II)-16
(II)-17
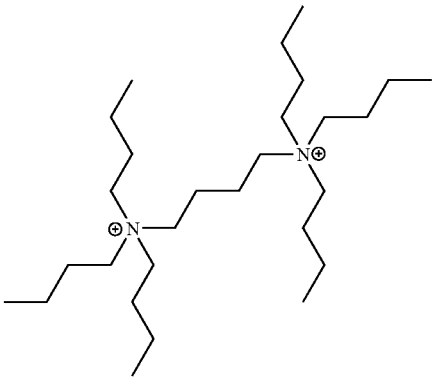
(II)-18
(II)-19
(II)-20
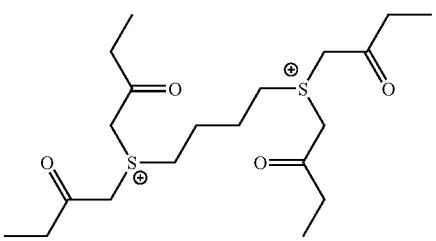
(II)-21
(II)-22
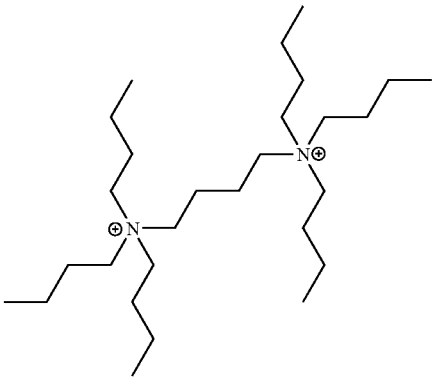
(II)-23
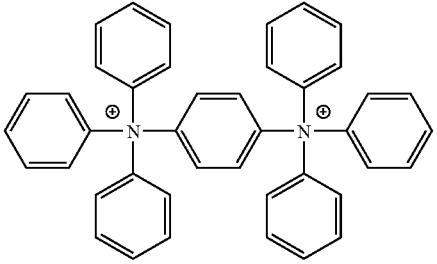
(II)-24
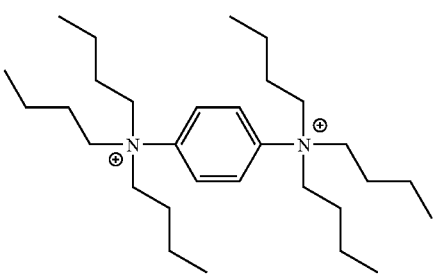

(II)-25

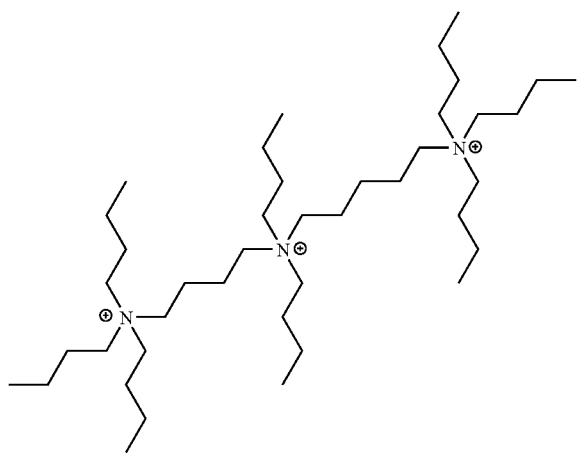

(II)-26

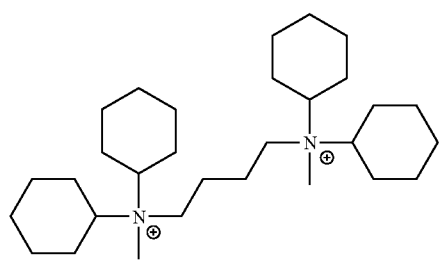

(II)-27

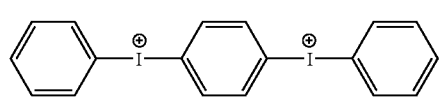

(II)-28

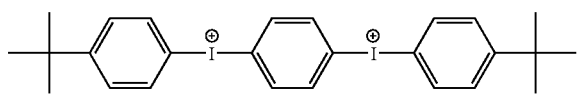

Compound (A) preferably has a structure represented by general formula (I) and/or a structure represented by general formula (II), and more preferably has a structure represented by general formula (I) and a structure represented by general formula (II).

The content of compound (A) in the resist composition (solid ingredients) is regulated to preferably 0.5-90% by mass, more preferably 0.5-30% by mass, even more preferably 1.0-20% by mass.

The molecular weight of compound (A) is 3,000 or lower, preferably 400-3,000, more preferably 500-2,000.

The structure (anion) having two or more monovalent anions, in compound (A), can be synthesized by subjecting the corresponding diiodoperfluoroalkane to sulfination and then converting the sulfination product to a sulfonic acid through an oxidation reaction.

(Aa) Compound Having Structure Having One Monovalent Anion in Molecule

The resist composition of the invention preferably further contains a compound having in the molecule a structure having one monovalent anion (hereinafter referred to also as "compound (Aa)").

The structure having one monovalent anion preferably is a structure represented by the following general formula (III).

$$A_3\text{-}Y_2^{\ominus} \quad \text{(III)}$$

In general formula (III), $A_3$ represents an alkyl group, alicyclic group, or aryl group; and $Y_2$ represents $SO_3$, $CO_2$, or $PO_3H$.

The alkyl group represented by $A_3$ in general formula (III) preferably is a linear or branched alkyl group having 1-30 carbon atoms. Examples thereof include methyl, ethyl, propyl, isopropyl, n-butyl, isobutyl, sec-butyl, pentyl, neopentyl, hexyl, heptyl, octyl, nonyl, decyl, undecyl, dodecyl, tridecyl, tetradecyl, pentadecyl, hexadecyl, heptadecyl, octadecyl, nonadecyl, and eicosyl.

The alicyclic group represented by $A_3$ may be either monocyclic or polycyclic. The monocyclic alicyclic group preferably has 3-8 carbon atoms, and examples thereof include cyclopropyl, cyclobutyl, cyclopentyl, cyclohexyl, and cyclooctyl. The polycyclic alicyclic group preferably has 6-20 carbon atoms, and examples thereof include adamantyl, norbornyl, isobornyl, camphanyl, dicyclopentyl, α-pinenyl, tricyclodecanyl, tetracyclododecyl, and androstanyl.

The aryl group represented by $A_3$ preferably is an aryl group having 6-14 carbon atoms. Examples thereof include phenyl, naphthyl, anthryl, phenanthryl, biphenyl residues (groups formed by removing one hydrogen atom from biphenyl), and p-terphenyl residues (groups formed by removing one hydrogen atom from p-terphenyl).

The alkyl group, alicyclic group, and aryl group represented by $A_3$ may have one or more substituents. Examples of the substituents which may be possessed by the alkyl group, alicyclic group, and aryl group represented by $A_3$ include fluorine atoms, carbonyl, hydroxy, alkyl groups (preferably having 1-15 carbon atoms), and alkoxy groups (preferably having 1-12 carbon atoms). The alkyl groups may be substituted by one or more fluorine atoms.

Examples of the structure represented by general formula (III) are shown below, but the structure in the invention should not be construed as being limited to the following examples.

 (III)-1

 (III)-2

 (III)-3

 (III)-4

 (III)-5

 (III)-6

 (III)-7

 (III)-8

 (III)-9

 (III)-10

-continued
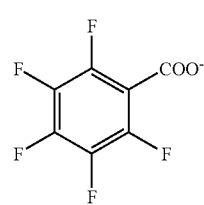 (III)-11
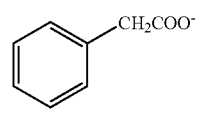 (III)-12
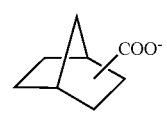 (III)-13
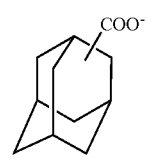 (III)-14
⁻O₃S—CH₃ (III)-15
⁻O₃S—C₄H₉ (III)-16
⁻O₃S—C₈H₁₇ (III)-17
⁻O₃S—CF₃ (III)-18
⁻O₃S—C₄F₉ (III)-19
⁻O₃S—C₈F₁₇ (III)-20
⁻O₃S—C₂F₄OC₂F₅ (III)-21
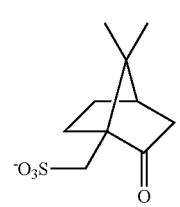 (III)-22
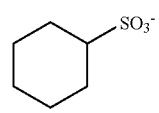 (III)-23
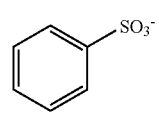 (III)-24
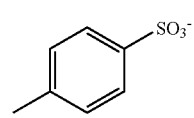 (III)-25
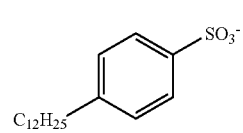 (III)-26
-continued
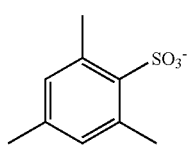 (III)-27
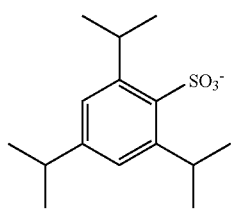 (III)-28
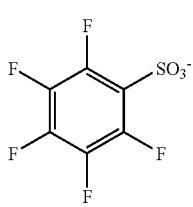 (III)-29
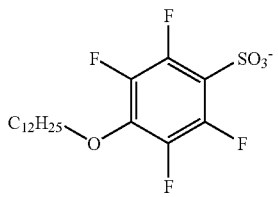 (III)-30
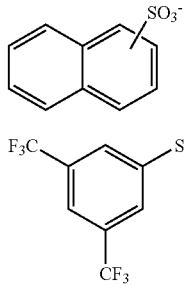 (III)-31
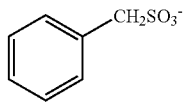 (III)-32
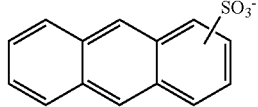 (III)-33
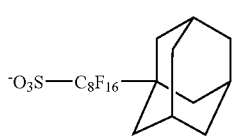 (III)-34
⁻O₃S—C₈F₁₆—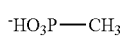 (III)-35
⁻HO₃P—CH₃ (III)-36
⁻HO₃P—C₄H₉ (III)-37
⁻HO₃P—C₈H₁₇ (III)-38

Compound (Aa) has in the molecule a cationic structure besides the structure having one monovalent anion.

Examples of the cationic structure possessed by compound (Aa) include structures represented by general formula (II) given above and structures represented by general formula (IV) which will be given later.

The compound having in the molecule a cationic structure represented by general formula (IV) besides the structure having one monovalent anion is especially referred to also as "compound (Aab)".

(Ab) Compound Having Structure Represented by General Formula (IV)

The resist composition of the invention preferably further contains a compound having a structure represented by the following general formula (IV) (hereinafter referred to also as "compound (Ab)").

(IV)

In general formula (IV), $X_2$ represents a sulfur atom, an iodine atom, or a nitrogen atom;

$R_{1a}$ represents an alkyl group, a cycloalkyl group, or an aryl group, provided that the $R_{1a}$'s may be the same or different and that two or more of the $R_{1a}$'s may be bonded to each other to form a ring; and q represents 2, 3, or 4, provided that when $X_2$ is a nitrogen atom, then q is 4, when $X_2$ is a sulfur atom, then q is 3, and when $X_2$ is an iodine atom, then q is 2.

The structure represented by general formula (IV) preferably is a structure represented by any of the following general formulae (VII) to (IX).

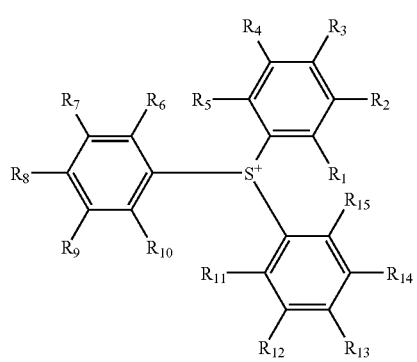
(VII)

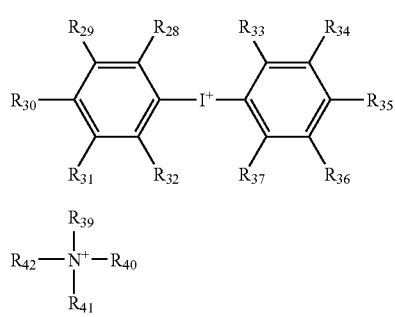
(VIII)

(IX)

In general formulae (VII) to (IX), $R_1$ to $R_{15}$ and $R_{28}$ to $R_{37}$ each independently represent a hydrogen atom, linear or branched alkyl group, cycloalkyl group, linear, branched, or cyclic alkoxy group, hydroxyl, halogen atom, or —S—$R_{38}$ group.

$R_{38}$ represents a linear or branched alkyl group, cycloalkyl group, or aryl group.

Two or more of $R_1$ to $R_{15}$ and $R_{28}$ to $R_{37}$ may be bonded to each other to form a ring comprising one or more members selected from a single bond and carbon, oxygen, sulfur, and nitrogen atoms.

$R_{39}$ to $R_{42}$ each independently represent a linear or branched alkyl group, cycloalkyl group, or aryl group.

Examples of the linear or branched alkyl groups represented by $R_1$ to $R_{15}$, $R_{28}$ to $R_{37}$, $R_{38}$, and $R_{39}$ to $R_{42}$ in general formulae (VII) to (IX) include ones having 1-20 carbon atoms, such as methyl, ethyl, propyl, n-butyl, sec-butyl, and t-butyl which each may have one or more substituents. The cycloalkyl groups may have one or more substituents. Examples thereof include cycloalkyl groups having 3-8 carbon atoms, such as cyclopropyl, cyclopentyl, and cyclohexyl which each may have one or more substituents.

Examples of the linear or branched alkoxy groups represented by $R_1$ to $R_{37}$ include ones having 1-4 carbon atoms, such as methoxy, ethoxy, hydroxyethoxy, propoxy, n-butoxy, isobutoxy, sec-butoxy, and t-butoxy.

Examples of the cyclic alkoxy groups include cyclopentyloxy and cyclohexyloxy.

Examples of the halogen atoms represented by $R_1$ to $R_{15}$ and $R_{28}$ to $R_{37}$ include fluorine, chlorine, bromine, and iodine atoms.

Examples of the aryl groups represented by $R_{38}$ and $R_{39}$ to $R_{42}$ include ones which have 6-14 carbon atoms and may have one or more substituents, such as phenyl, tolyl, methoxyphenyl, and naphthyl.

Preferred examples of those substituents include alkoxy groups having 1-4 carbon atoms, halogen atoms (fluorine, chlorine, and iodine atoms), aryl groups having 6-40 carbon atoms, alkenyl groups having 2-6 carbon atoms, cyano, hydroxy, carboxy, alkoxycarbonyl groups, and nitro.

In particular, the linear or branched alkyl groups and cycloalkyl groups represented by $R_{39}$ to $R_{42}$ may be bonded through an oxygen atom, sulfur atom, nitrogen atom, or —C(=O)— or through a combination of two or more of these, and may have one or more substituents selected from aryl groups, cycloalkyl groups, halogen atoms, and the like. Furthermore, especially the aryl groups represented by $R_{39}$ to $R_{42}$ may have one or more substituents selected from linear or branched alkyl groups, cycloalkyl groups, linear, branched, or cyclic alkoxy groups, hydroxyl, halogen atoms, and the like.

Examples of the ring which is formed by the bonding of two or more of $R_1$ to $R_{15}$ and $R_{28}$ to $R_{37}$ and comprises one or more members selected from a single bond and carbon, oxygen, sulfur, and nitrogen atoms include a furan ring, dihydrofuran ring, pyran ring, trihydropyran ring, thiophene ring, and pyrrole ring.

Examples of the structure represented by general formula (IV) are shown below, but the structure in the invention should not be construed as being limited to the following examples.

(IV)-1 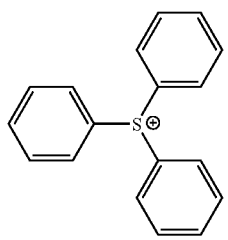
(IV)-2 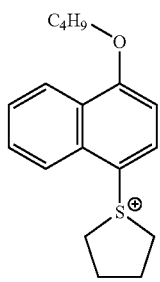
(IV)-3 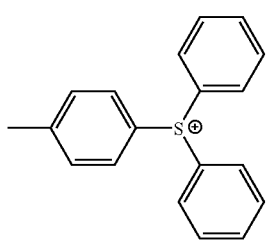
(IV)-4 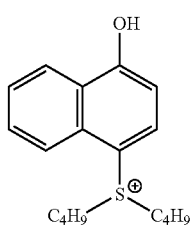
(IV)-5 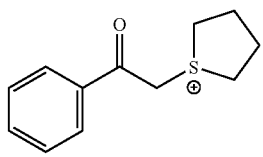
(IV)-6 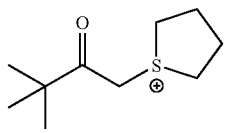
(IV)-7 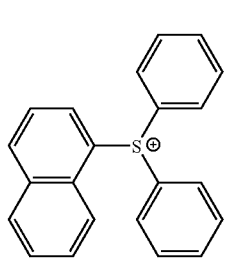
(IV)-8 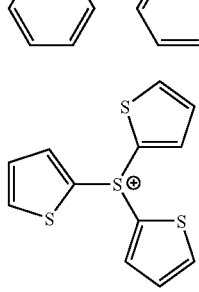
(IV)-9 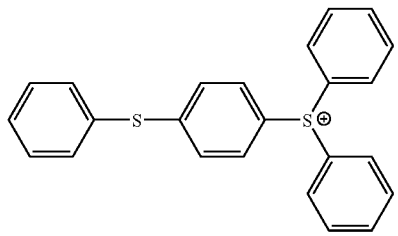
(IV)-10
(IV)-11
(IV)-12
(IV)-13

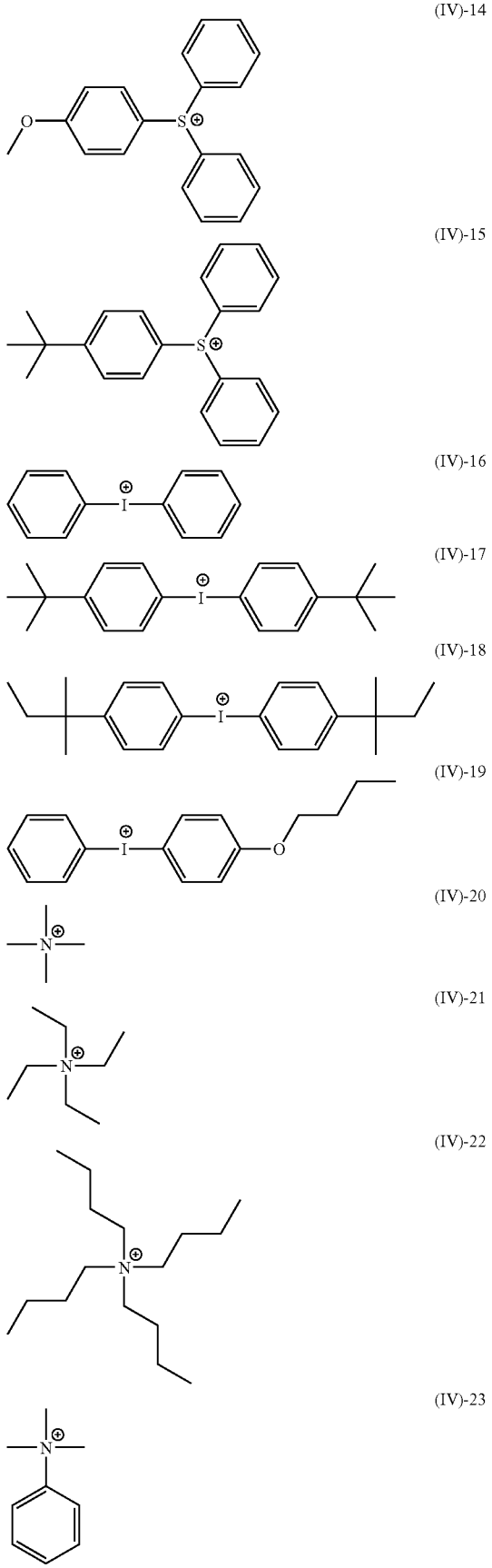
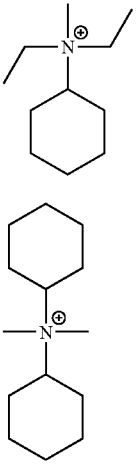

Compound (Ab) has in the molecule an anionic structure besides the structure represented by general formula (IV).

Examples of the anionic structure possessed by compound (Ab) include structures represented by general formula (I) given above and structures represented by general formula (III) given above.

The total content of compounds (Aa), (Ab), and (Aab) in the resist composition (solid ingredients) is regulated to preferably 0.5-20% by mass, more preferably 0.6-15% by mass, even more preferably 0.8-10% by mass.

In general, a salt compound forms an ion pair composed of one monovalent cation (1) and one monovalent anion (2). The molecular weights of such salt compounds are up to 1,000 in many cases (see FIG. 1).

Figure 2:
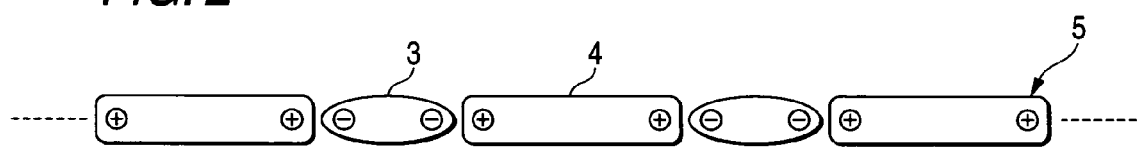
FIG. 2 is a diagrammatic view illustrating a pseudo-polymer composed of structures represented by general formula (I) and structures represented by general formula (II)
Figure 3:
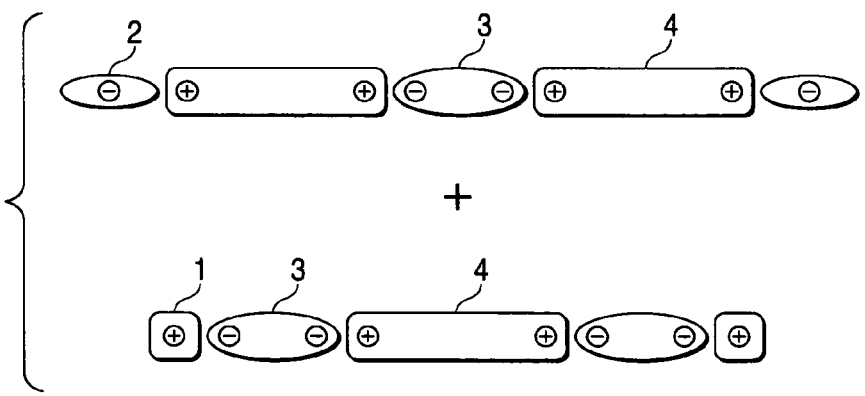
FIG. 3 is a diagrammatic view illustrating a state obtained by adding monovalent cations and monovalent anions to the pseudo-polymer composed of structures represented by general formula (I) and structures represented by general formula (II).

On the other hand, a structure (3) represented by general formula (I) and a structure (4) represented by general formula (II) each are a low-molecular ingredient. However, these two kinds of structures form an ion-pair structure composed of units represented by general formula (I) and units represented by general formula (II), and this ion-pair structure can be regarded as a pseudo-polymer (5) (see FIG. 2). Functions of polymeric compounds such as those of resins can hence be imparted. Furthermore, the pseudo-polymer (5) decomposes into lower-molecular ingredients upon irradiation with actinic rays when an actinic-ray-decomposable ingredient such as, e.g., a photo-acid generator is used. Thus, the elimination of inhibition is easy and effects such as, e.g., high sensitivity are obtained. Moreover, the molecular weight of the pseudo-polymer (5) composed of structures (3) represented by general formula (I) and structures (4) represented by general formula (II) can be regulated by mixing monovalent cations (1) or anions (2), e.g., ion pairs each composed of one anion and one cation such as that shown in FIG. 1, with the pseudo-polymer (see FIG. 3). Hitherto, it has been necessary that a polymeric compound, e.g., a resin, should be synthesized each time in order to obtain a desired molecular weight. In the invention, however, molecular weight regulation can be attained by mixing low-molecular ion pairs in a necessary amount, and is exceedingly easy.

[2] (B) Resin Decomposing by Action of Acid to Come to Have Enhanced Solubility in Alkaline Developer (Hereinafter Referred to Also as "Ingredient (B)")

The resin which decomposes by the action of an acid to come to have enhanced solubility in an alkaline developer and is to be used in the positive resist composition of the invention is a resin which has groups dissociable with an acid (hereinafter referred to also as "acid-dissociable groups") in the main chain or side chains thereof or in both the main chain and side chains thereof. Preferred of such resins are ones which have acid-dissociable groups in side chains thereof.

Preferred acid-dissociable groups are groups formed by replacing the hydrogen atom of a —COOH or —OH group by a group eliminable with an acid.

The acid-dissociable groups in the invention preferably are acetal groups or tertiary ester groups.

In the case of a resin having such acid-dissociable groups bonded as side chains, the base resin may be an alkali-soluble resin having —OH or —COOH groups in side chains. Examples thereof include the alkali-soluble resins which will be described later.

The rate of alkali dissolution of these alkali-soluble resins is preferably 170 Å/sec or higher, especially preferably 330 Å/sec or higher (Å is angstrom), as measured in 0.261-N tetramethylammonium hydroxide (TMAH) (23° C.).

From that standpoint, especially preferred alkali-soluble resins are alkali-soluble resins having structural hydroxystyrene units, such as poly(o-, m-, or p-hydroxystyrene), copolymers thereof, hydrogenated poly(hydroxystyrene), halogen- or alkyl-substituted poly(hydroxystyrene), partly O-alkylated or O-acylated poly(hydroxystyrene), styrene/hydroxystyrene copolymers, α-methylstyrene/hydroxystyrene copolymers, and hydrogenated novolak resins.

Preferred examples of repeating units having an acid-dissociable group in the invention include units derived from t-butoxycarbonyloxystyrene, 1-alkoxyethoxystyrenes, and tertiary alkyl esters of (meth)acrylic acid.

Ingredient (B) to be used in the invention can be obtained by reacting an alkali-soluble resin with a precursor for an acid-dissociable group or by copolymerizing an alkali-soluble-resin monomer having an acid-dissociable group bonded thereto with various monomers, as disclosed in, e.g., European Patent 254,853, JP-A-2-25850, JP-A-3-223860, and JP-A-4-251259.

Specific examples of ingredient (B) to be used in the invention are shown below, but the ingredient in the invention should not be construed as being limited to these examples:

p-t-butoxystyrene/p-hydroxystyrene copolymers, p-(t-butoxycarbonyloxy)styrene/p-hydroxystyrene copolymers, p-(t-butoxycarbonylmethyloxy)styrene/p-hydroxystyrene copolymers, 4-(t-butoxycarbonylmethyloxy)-3-methylstyrene/4-hydroxy-3-methylstyrene copolymers, p-(t-butoxycarbonylmethyloxy)styrene/p-hydroxystyrene (10% hydrogenated) copolymers, m-(t-butoxycarbonylmethyloxy)styrene/m-hydroxystyrene copolymers, o-(t-butoxycarbonylmethyloxy)styrene/o-hydroxystyrene copolymers, p-(cumyloxycarbonylmethyloxy)styrene/p-hydroxystyrene copolymers, cumyl methacrylate/methyl methacrylate copolymers, 4-t-butoxycarbonylstyrene/dimethyl maleate copolymers, benzyl methacrylate/tetrahydropyranyl methacrylate copolymers, p-(t-butoxycarbonylmethyloxy)styrene/p-hydroxystyrene/styrene copolymers, p-t-butoxystyrene/p-hydroxystyrene/fumaronitrile copolymers, t-butoxystyrene/hydroxyethyl methacrylate copolymers, styrene/N-(4-hydroxyphenyl)maleimide/N-(4-t-butoxycarbonyloxyphenyl)maleimide copolymers, p-hydroxystyrene/t-butyl methacrylate copolymers, styrene/p-hydroxystyrene/t-butyl methacrylate copolymers, p-hydroxystyrene/t-butyl acrylate copolymers, styrene/p-hydroxystyrene/t-butyl acrylate copolymers, p-(t-butoxycarbonylmethyloxy)styrene/p-hydroxystyrene/N-methylmaleimide copolymers, t-butyl methacrylate/1-adamantylmethyl methacrylate copolymers, p-hydroxystyrene/t-butyl acrylate/p-acetoxystyrene copolymers, p-hydroxystyrene/t-butyl acrylate/p-(t-butoxycarbonyloxy)styrene copolymers, p-hydroxystyrene/t-butyl acrylate/p-(t-butoxycarbonylmethyloxy)styrene copolymers, and the following copolymers.

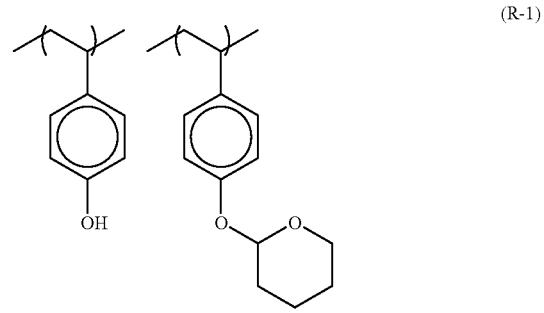

(R-1)

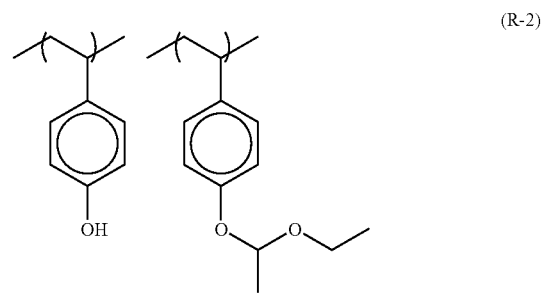

(R-2)

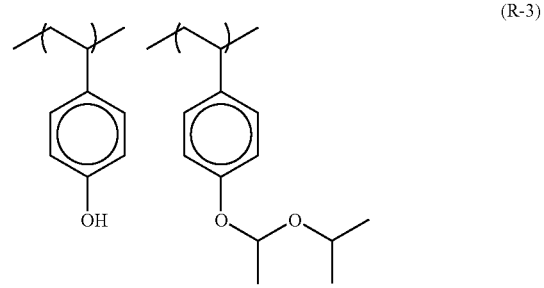

(R-3)

(R-4)
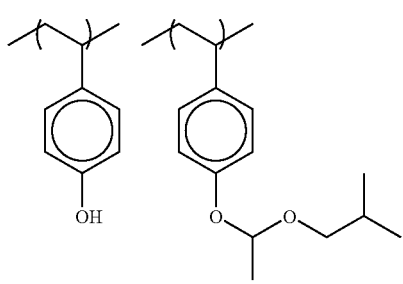
(R-8)
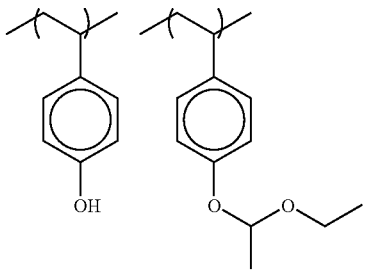
(R-5)
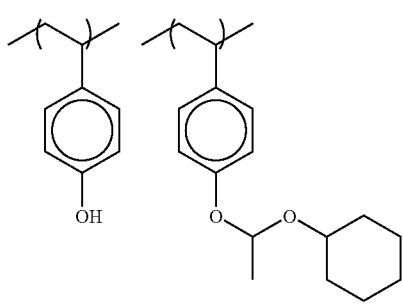
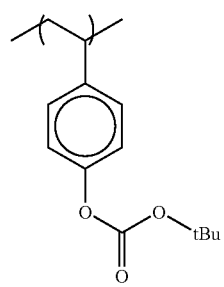
(R-6)
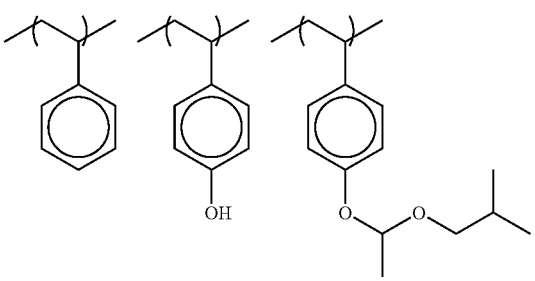
(R-9)
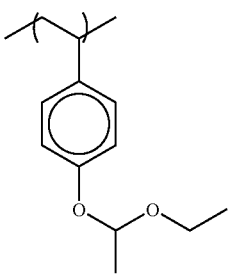 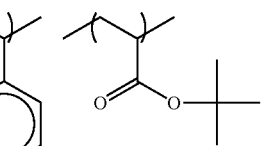
(R-7)
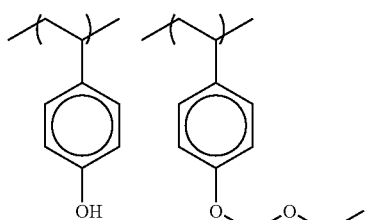
(R-10)
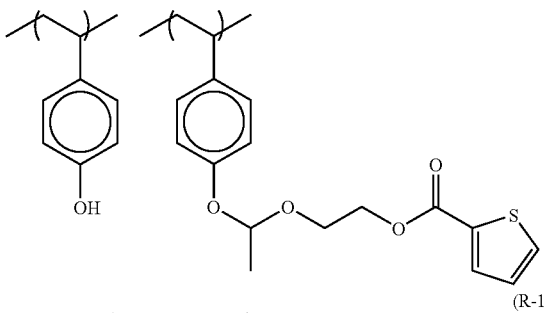
(R-11)
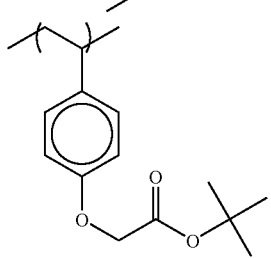
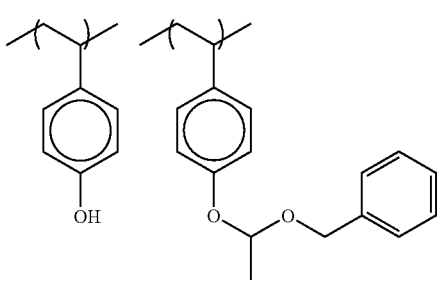

-continued
(R-12)
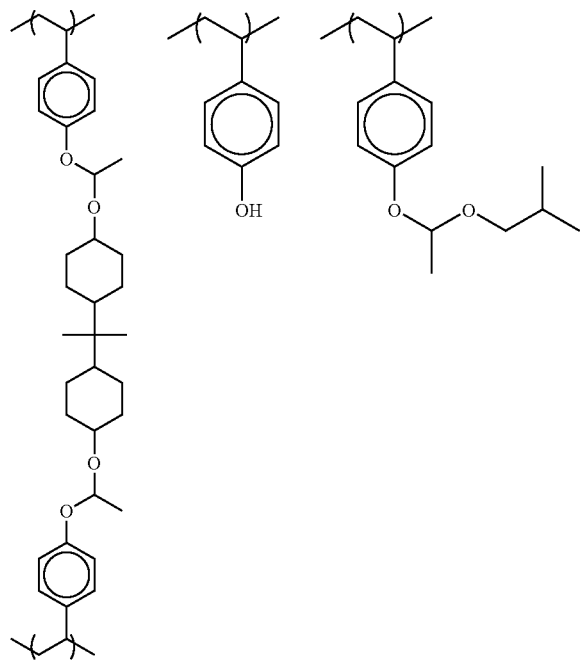
(R-13)
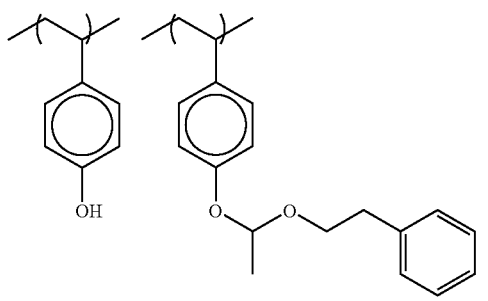
(R-14)
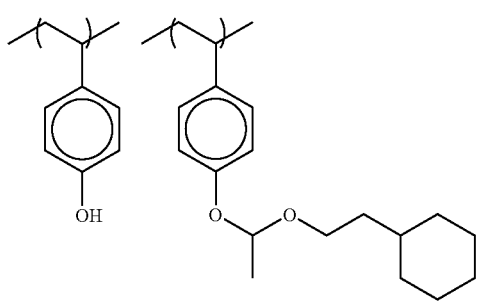
(R-15)
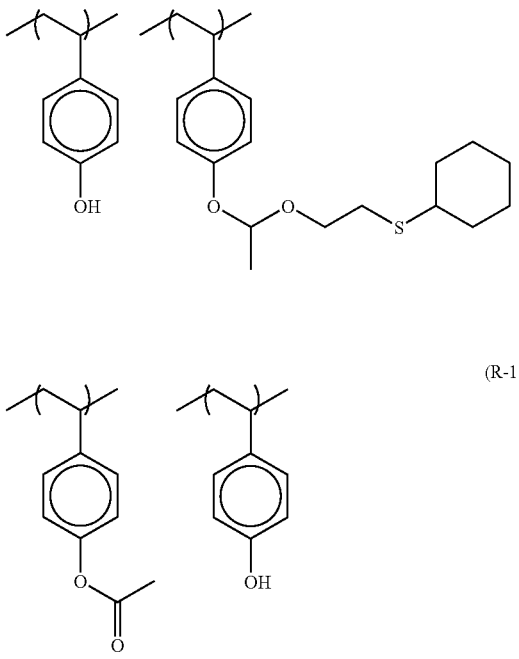
(R-16)
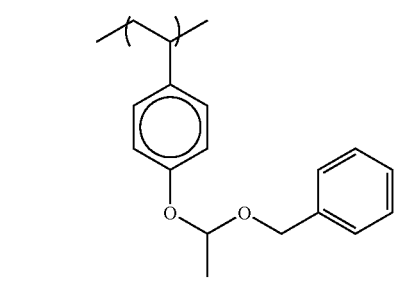
(R-17)
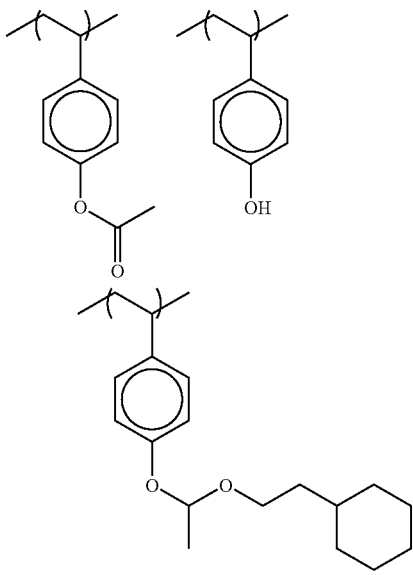

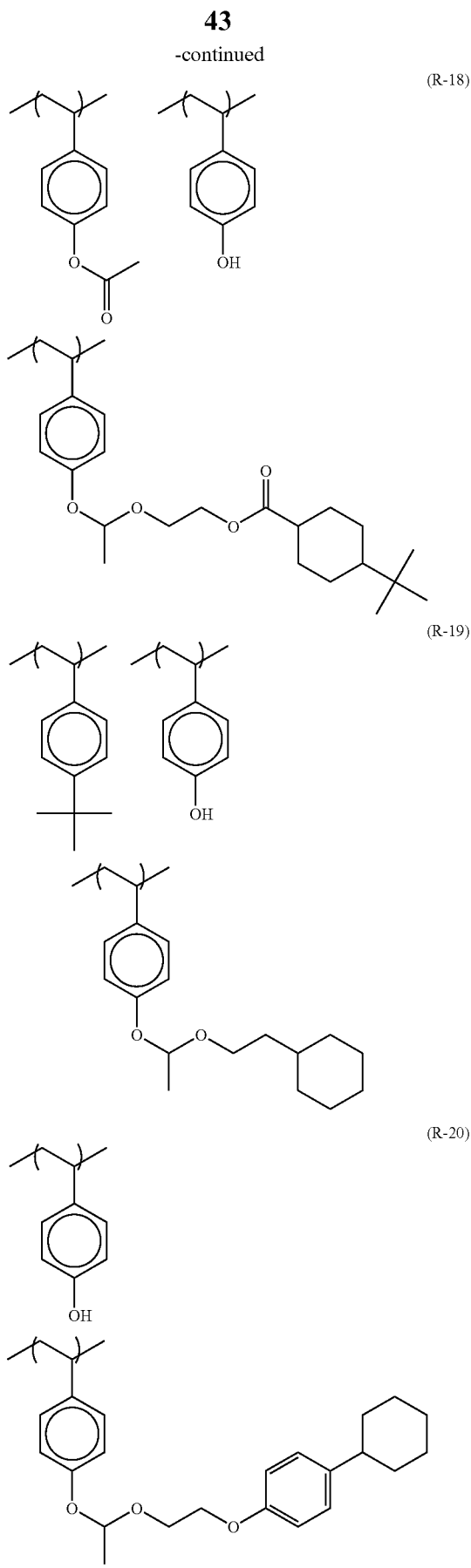
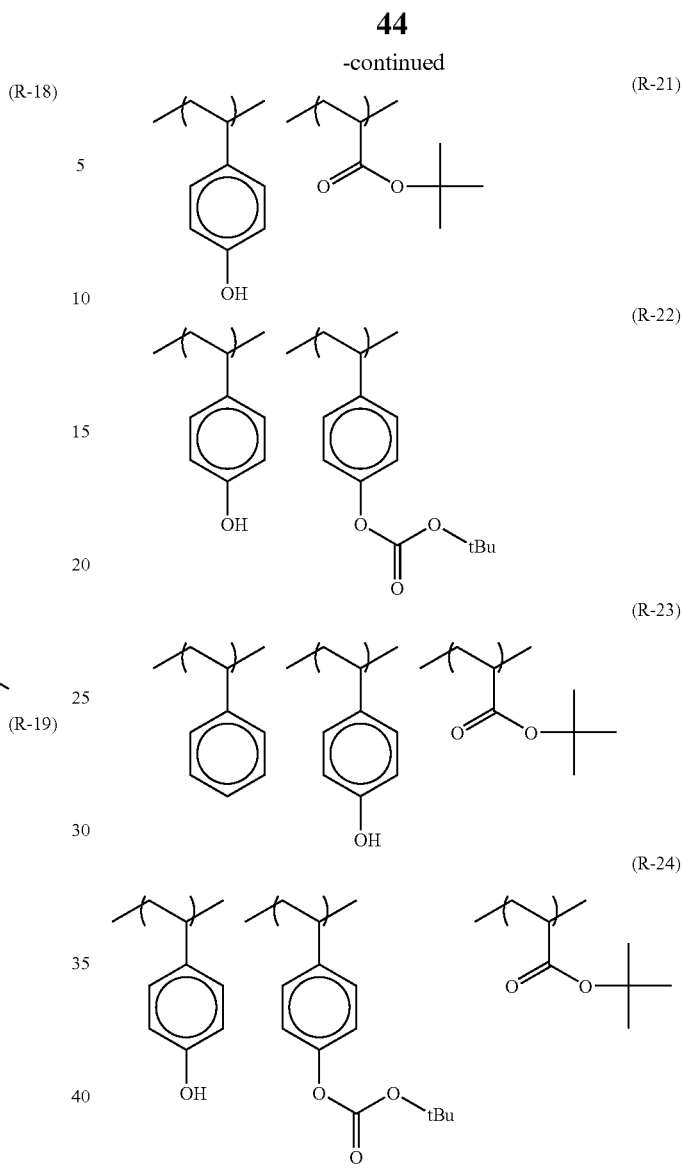

In the examples shown above, tBu represents t-butyl.

The content of acid-dissociable groups in a resin is expressed using the number of the acid-dissociable groups (B) and the number of alkali-soluble groups not protected with an acid-eliminable group (S). Specifically, the content is expressed by B/(B+S).

The content thereof is preferably 0.01-0.7, more preferably 0.05-0.50, even more preferably 0.05-0.40.

In the case where the positive resist composition of the invention is to be irradiated with ArF excimer laser light, the resin as ingredient (B) preferably is a resin which has a monocyclic or polycyclic alicyclic hydrocarbon structure and decomposes by the action of an acid to come to have enhanced solubility in an alkaline developer.

The resin which has a monocyclic or polycyclic alicyclic hydrocarbon structure and decomposes by the action of an acid to come to have enhanced solubility in an alkaline developer (hereinafter referred to also as "alicyclic-hydrocarbon-based acid-decomposable resin") preferably is a resin containing at least one kind of repeating units selected from the group consisting of repeating units having a partial structure which includes an alicyclic hydrocarbon and is represented by any of the following general formulae (pI) to (pVI) and repeating units represented by the following general formula (II-AB).

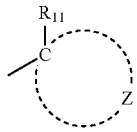
(pI)

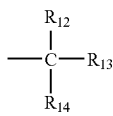
(pII)

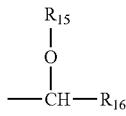
(pIII)

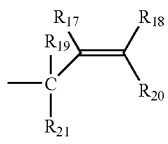
(pIV)

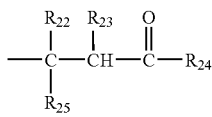
(pV)

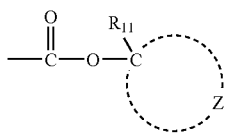
(pVI)

(In the formulae given above, $R_{11}$ represents methyl, ethyl, n-propyl, isopropyl, n-butyl, isobutyl, or sec-butyl, and Z represents an atomic group necessary for forming an alicyclic hydrocarbon group in cooperation with the carbon atom;

$R_{12}$ to $R_{16}$ each independently represent a linear or branched alkyl group having 1-4 carbon atoms or an alicyclic hydrocarbon group, provided that at least one of $R_{12}$ to $R_{14}$ or either of $R_{15}$ and $R_{16}$ represents an alicyclic hydrocarbon group;

$R_{17}$ to $R_{21}$ each independently represent a hydrogen atom, a linear or branched alkyl group having 1-4 carbon atoms, or an alicyclic hydrocarbon group, provided that at least one of $R_{17}$ to $R_{21}$ represents an alicyclic hydrocarbon group and that either of $R_{19}$ and $R_{21}$ represents a linear or branched alkyl group having 1-4 carbon atoms or an alicyclic hydrocarbon group; and $R_{22}$ to $R_{25}$ each independently represent a hydrogen atom, a linear or branched alkyl group having 1-4 carbon atoms, or an alicyclic hydrocarbon group, provided that at least one of $R_{22}$ to $R_{25}$ represents an alicyclic hydrocarbon group and that $R_{23}$ and $R_{24}$ may be bonded to each other to form a ring.)

(II-AB)

In formula (II-AB),
$R_{11}'$ and $R_{12}'$ each independently represent a hydrogen atom, cyano, halogen atom, or alkyl group; and
Z' represents an atomic group which forms an alicyclic structure in cooperation with the two carbon atoms (C—C) bonded thereto.

General formula (II-AB) more preferably is the following general formula (II-A) or general formula (II-B).

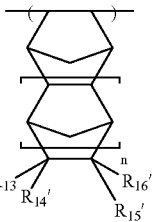
(II-A)

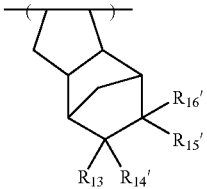
(II-B)

In formulae (II-A) and (II-B),
$R_{13}'$ to $R_{16}'$ each independently represent a hydrogen atom, halogen atom, cyano, —COOH, —COOR$_5$, group which decomposes by the action of an acid, —C(═O)—X-A'-R$_{17}'$, alkyl group, or alicyclic hydrocarbon group,
wherein $R_5$ represents an alkyl group, alicyclic hydrocarbon group, or group —Y shown below,
X represents an oxygen atom, sulfur atom, —NH—, —NHSO$_2$—, or —NHSO$_2$NH—, and
A' represents a single bond or a divalent connecting group.
$R_{17}'$ represents —COOH, —COOR$_5$, —CN, hydroxy, alkoxy, —CO—NH—R$_6$, —CO—NH—SO$_2$—R$_6$, or group —Y shown below.
$R_6$ represents an alkyl group or an alicyclic hydrocarbon group.
At least two of $R_{13}'$ to $R_{16}'$ may be bonded to each other to form a ring.
Symbol n represents 0 or 1.
Group —Y is as follows.

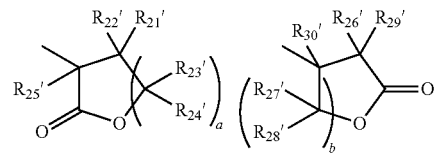

(In group —Y, $R_{21}'$ to $R_{30}'$ each independently represent a hydrogen atom or an alkyl group; and a and b each represent 1 or 2.)

In general formulae (pI) to (pVI), the alkyl groups represented by $R_{12}$ to $R_{25}$ are linear or branched alkyl groups having 1-4 carbon atoms. Examples of the alkyl groups include methyl, ethyl, n-propyl, isopropyl, n-butyl, isobutyl, sec-butyl, and t-butyl.

Examples of substituents which may be possessed by those alkyl groups include alkoxy groups having 1-4 carbon atoms, halogen atoms (fluorine, chlorine, bromine, and iodine atoms), and acyl, acyloxy, cyano, hydroxy, carboxy, alkoxycarbonyl, and nitro groups.

The alicyclic hydrocarbon groups represented by $R_{11}$ to $R_{25}$ and the alicyclic hydrocarbon group formed by Z and the carbon atom may be monocyclic or polycyclic. Examples thereof include groups having a monocyclic, bicyclic, tricyclic, or tetracyclic structure having 5 or more carbon atoms, preferably 6-30 carbon atoms, especially preferably 7-25 carbon atoms. These alicyclic hydrocarbon groups may have substituents.

Preferred examples of the alicyclic hydrocarbon groups include adamantyl, noradamantyl, decalin residues, tricyclodecanyl, tetracyclodecanyl, norbornyl, cedrol, cyclohexyl, cycloheptyl, cyclooctyl, cyclodecanyl, and cyclododecanyl. More preferred examples thereof include adamantyl, decalin residues, norbornyl, cedrol, cyclohexyl, cycloheptyl, cyclooctyl, cyclodecanyl, and cyclododecanyl.

Examples of the substituents of those alicyclic hydrocarbon groups include alkyl groups, halogen atoms, and hydroxy, alkoxy, carboxyl, and alkoxycarbonyl groups. The alkyl groups preferably are lower alkyl groups such as methyl, ethyl, propyl, isopropyl, and butyl, and more preferably are selected from the group consisting of methyl, ethyl, propyl, and isopropyl. Examples of the alkoxy groups include ones having 1-4 carbon atoms, such as methoxy, ethoxy, propoxy, and butoxy. Examples of substituents which may be possessed by those alkyl, alkoxy, and alkoxycarbonyl groups include hydroxy, halogen atoms, and alkoxy groups.

The structures represented by general formulae (pI) to (pVI) in the resin can be used for the protection of alkali-soluble groups. Examples of the alkali-soluble groups include various groups known in this technical field.

Examples thereof include carboxy, sulfo, phenol, and thiol groups. Preferred are carboxy and sulfo groups.

Preferred examples of the alkali-soluble groups protected by a structure represented by any of general formulae (pI) to (pVI) in the resin include the structure formed by replacing the hydrogen atom of a carboxyl group by the structure represented by any of general formulae (pI) to (pVI).

Repeating units having an alkali-soluble group protected by a structure represented by any of general formulae (pI) to (pVI) preferably are repeating units represented by the following general formula (pA).

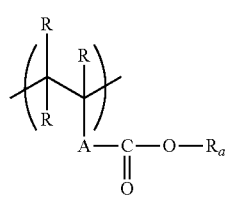

(pA)

In general formula (pA), R represents a hydrogen atom, halogen atom, or linear or branched alkyl group having 1-4 carbon atoms. The R's may be the same or different.

Symbol A represents one member or a combination of two or more members selected from the group consisting of a single bond and alkylene, ether, thioether, carbonyl, ester, amide, sulfonamide, urethane, and urea groups.

$R_a$ represents a group represented by any of formulae (pI) to (pVI).

The repeating units represented by general formula (pA) most preferably are repeating units derived from a 2-alkyl-2-adamantyl (meth)acrylate or a dialkyl(1-adamantyl)methyl (meth)acrylate.

Specific examples of the repeating units represented by general formula (pA) are shown below.

(In the formulae, Rx is H, $CH_3$, or $CF_3$.)

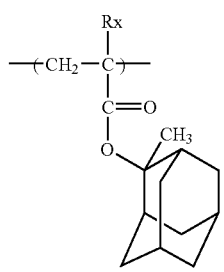

1

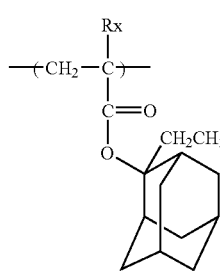

2

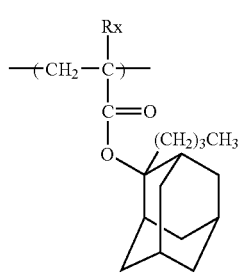

3

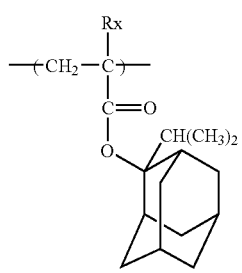

4

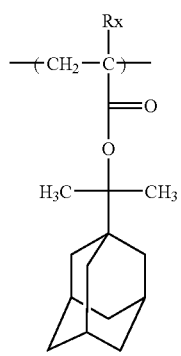
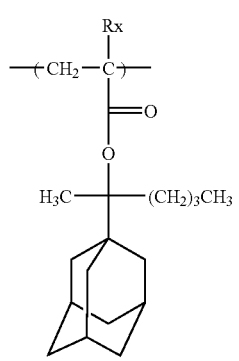
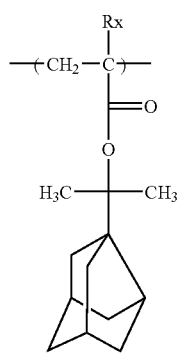
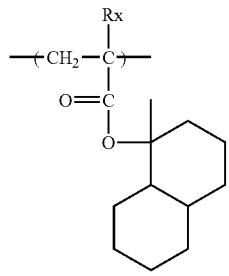
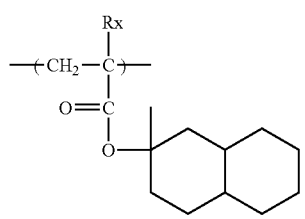
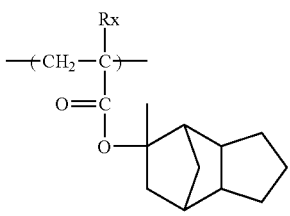
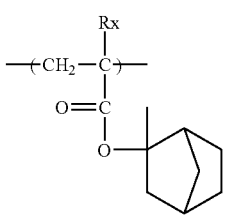
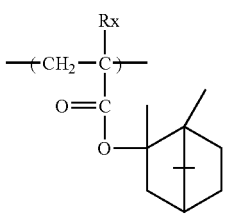
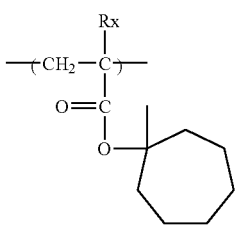
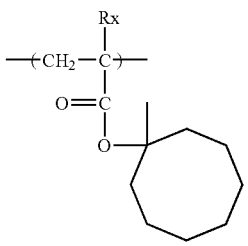
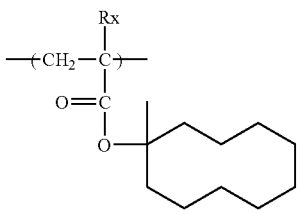
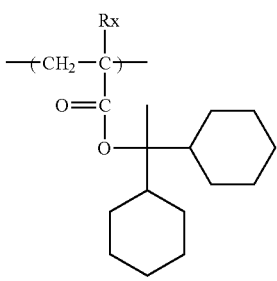

-continued

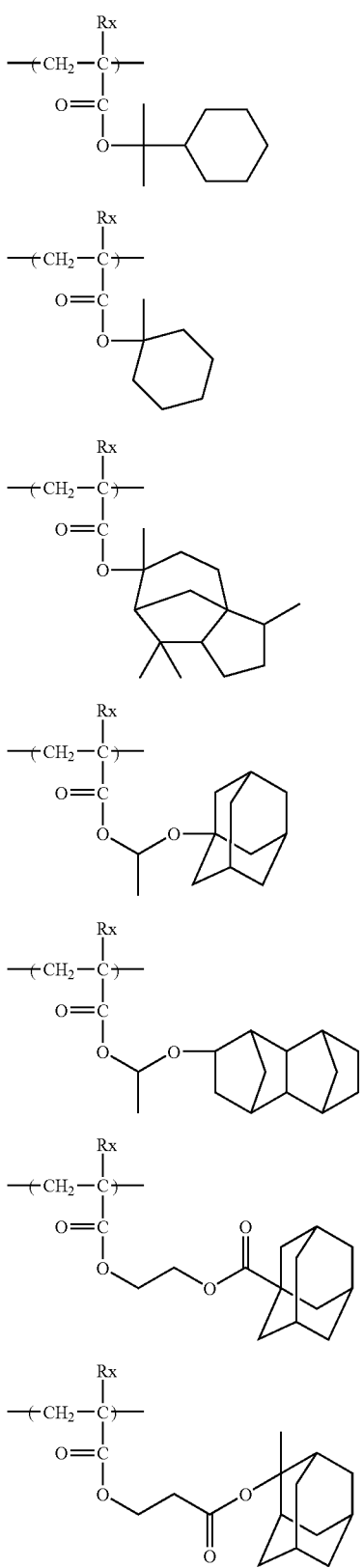

In general formula (II-AB), $R_{11}'$ and $R_{12}'$ each independently represent a hydrogen atom, cyano, halogen atom, or alkyl group.

Z' represents an atomic group which forms an alicyclic structure in cooperation with the two carbon atoms (C—C) bonded thereto.

Examples of the halogen atoms represented by $R_{11}'$ and $R_{12}'$ include chlorine, bromine, fluorine, and iodine atoms.

The alkyl groups represented by $R_{11}'$, $R_{12}'$, and $R_{21}'$ to $R_{30}'$ preferably are linear or branched alkyl groups having 1-10 carbon atoms, and more preferably are linear or branched alkyl groups having 1-6 carbon atoms. Even more preferably, the alkyl groups are methyl, ethyl, propyl, isopropyl, n-butyl, isobutyl, sec-butyl, or t-butyl.

Examples of substituents of those alkyl groups include hydroxy, halogen atoms, and carboxy, alkoxy, acyl, cyano, and acyloxy groups. Examples of the halogen atoms include chlorine, bromine, fluorine, and iodine atoms. Examples of the alkoxy groups include ones having 1-4 carbon atoms, such as methoxy, ethoxy, propoxy, and butoxy. Examples of the acyl groups include formyl and acetyl. Examples of the acyloxy groups include acetoxy.

The atomic group represented by Z', which forms an alicyclic structure, is an atomic group which serves to form, in the resin, repeating units of an alicyclic hydrocarbon which may have one or more substituents. Especially preferred is an atomic group which forms a bridged alicyclic structure for forming bridged repeating units of an alicyclic hydrocarbon.

Examples of the framework of the alicyclic hydrocarbon to be formed include the same frameworks as those of the alicyclic hydrocarbon groups represented by $R_{11}$ to $R_{25}$ in general formulae (pI) to (pVI).

The framework of the alicyclic hydrocarbon may have one or more substituents. Examples of the substituents include $R_{13}'$ to $R_{16}'$ in general formula (II-A) or (II-B).

Of the repeating units having a bridged alicyclic hydrocarbon, repeating units represented by general formula (II-A) or (II-B) are more preferred.

In the alicyclic-hydrocarbon-based acid-decomposable resin according to the invention, the acid-dissociable groups each may be contained in the —C(=O)—X-A'-$R_{17}'$ or may be contained as a substituent possessed by Z' in general formula (II-AB).

The structure of each acid-dissociable group can be expressed by —C(=O)—$X_1$—$R_0$.

Examples of $R_0$ in the formula include tertiary alkyl groups such as t-butyl and t-amyl, isobornyl, 1-alkoxyethyl groups such as 1-ethoxyethyl, 1-butoxyethyl, 1-isobutoxyethyl, and 1-cyclohexyloxyethyl, alkoxymethyl groups such as 1-methoxymethyl and 1-ethoxymethyl, 3-oxoalkyl groups, tetrahydropyranyl, tetrahydrofuranyl, trialkylsilyl ester groups, 3-oxocyclohexyl ester groups, 2-methyl-2-adamantyl, and mevalonolactone residues. $X_1$ has the same meaning as X described above.

Examples of the halogen atoms represented by $R_{13}'$ to $R_{16}'$ include chlorine, bromine, fluorine, and iodine atoms.

The alkyl groups represented by $R_5$, &, and $R_{13}'$ to $R_{16}'$ preferably are linear or branched alkyl groups having 1-10 carbon atoms, and more preferably are linear or branched alkyl groups having 1-6 carbon atoms. Even more preferably, the alkyl groups are methyl, ethyl, propyl, isopropyl, n-butyl, isobutyl, sec-butyl, or t-butyl.

Examples of the cyclic hydrocarbon groups represented by $R_5$, $R_6$, and $R_{13}'$ to $R_{16}'$ include cycloalkyl groups and bridged hydrocarbons. Specific examples thereof include cyclopropyl, cyclopentyl, cyclohexyl, adamantyl, 2-methyl-2-adamantyl, norbornyl, bornyl, isobornyl, tricyclodecanyl, dicyclopentenyl, norbornane epoxy groups, menthyl, isomenthyl, neomenthyl, and tetracyclododecanyl.

Examples of the ring formed by the bonding of at least two of $R_{13}'$ to $R_{16}'$ include rings having 5-12 carbon atoms, such as cyclopentene, cyclohexene, cycloheptane, and cyclooctane.

Examples of the alkoxy group represented by $R_{17}'$ include ones having 1-4 carbon atoms, such as methoxy, ethoxy, propoxy, and butoxy.

Examples of substituents of those alkyl groups, cyclic hydrocarbon groups, and alkoxy groups include hydroxy, halogen atoms, and carboxyl, alkoxy, acyl, cyano, acyloxy, alkyl, and cyclic hydrocarbon groups. Examples of the halogen atoms include chlorine, bromine, fluorine, and iodine atoms. Examples of the alkoxy groups include ones having 1-4 carbon atoms, such as methoxy, ethoxy, propoxy, and butoxy. Examples of the acyl groups include formyl and acetyl. Examples of the acyloxy groups include acetoxy.

Examples of the alkyl groups and cyclic hydrocarbon groups include those enumerated above.

Examples of the divalent connecting group represented by A' include one group or a combination of two or more groups selected from the group consisting of alkylene, ether, thioether, carbonyl, ester, amide, sulfonamide, urethane, and urea groups.

In the alicyclic-hydrocarbon-based acid-decomposable resin according to the invention, groups which dissociate by the action of an acid can be contained in at least one kind of repeating units selected from the group consisting of repeating units having a partial structure which includes an alicyclic hydrocarbon and is represented by any of general formulae (pI) to (pVI), repeating units represented by general formula (II-AB), and repeating units derived from the comonomer ingredients which will be described later.

Various substituents of $R_{13}'$ to $R_{16}'$ in general formula (II-A) or (II-B) serve as substituents of the atomic group forming an alicyclic structure in general formula (II-AB) or of the atomic group Z forming a bridged alicyclic structure in the formula.

Specific examples of the repeating units represented by general formula (II-A) or (II-B) include the following. However, the repeating units in the invention should not be construed as being limited to the following examples.

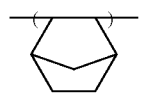

[II-1]

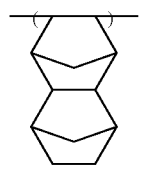

[II-2]

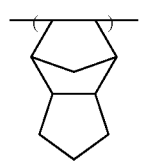

[II-3]

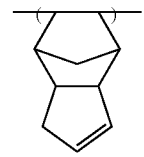

[II-4]

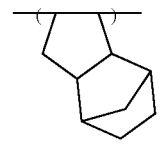

[II-5]

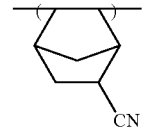

[II-6]

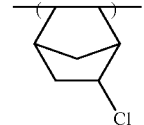

[II-7]

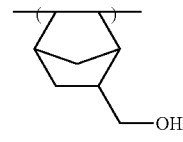

[II-8]

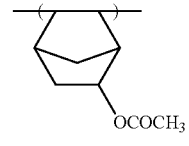

[II-9]

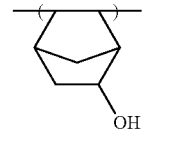

[II-10]

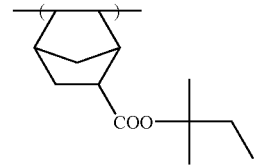

[II-11]

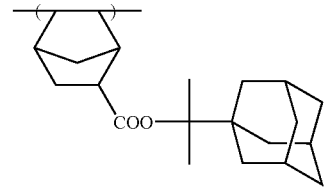

[II-12]

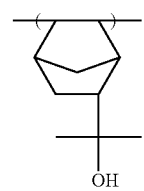

[II-13]

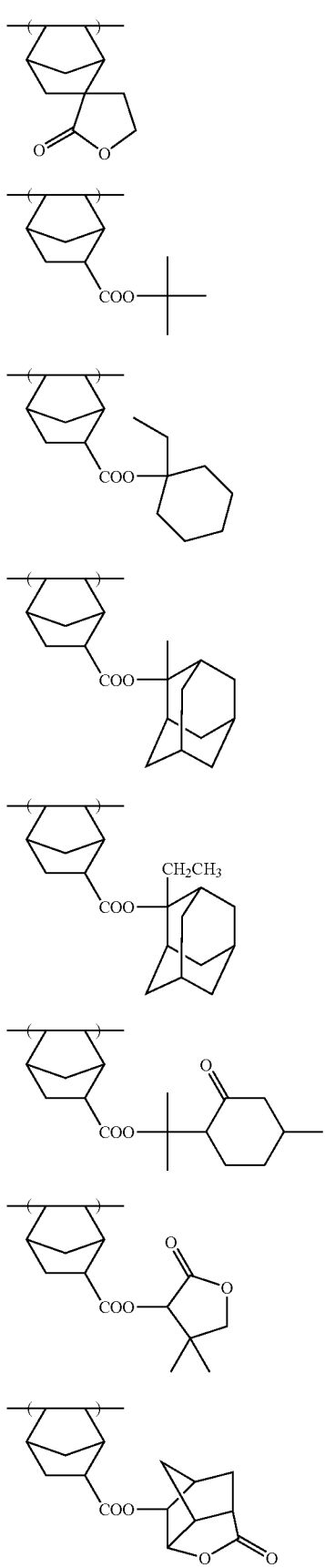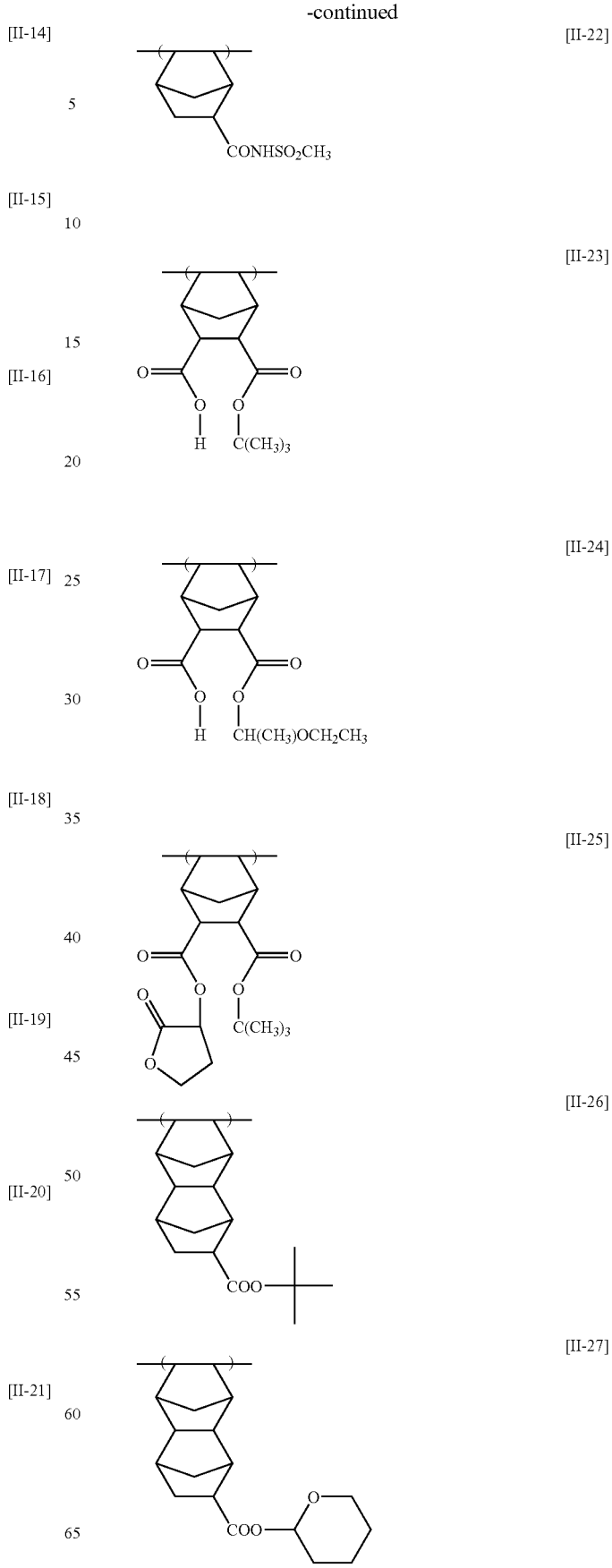

[II-28]
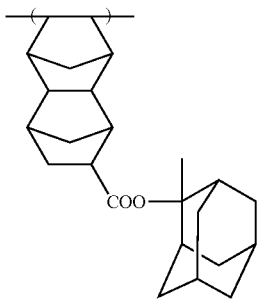

[II-29]
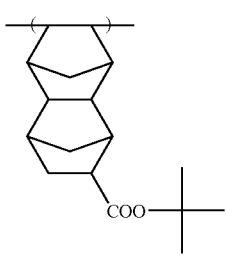

[II-30]
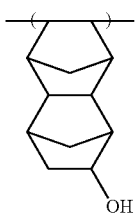

[II-31]
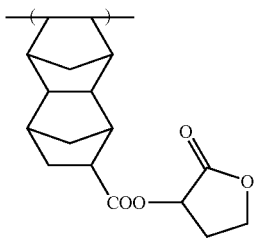

[II-32]
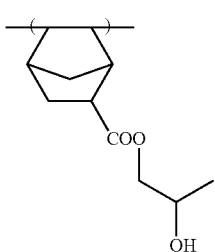

The alicyclic-hydrocarbon-based acid-decomposable resin according to the invention preferably has a lactone group, and more preferably has repeating units having a lactone structure represented by the following general formula (Lc) or any of the following general formulae (V-1) to (V-5). The resin may have groups having a lactone structure which have been directly bonded to the main chain.

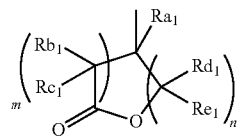
(Lc)

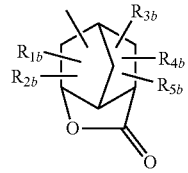
(V-1)

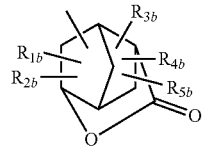
(V-2)

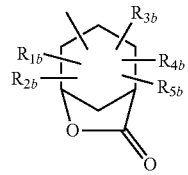
(V-3)

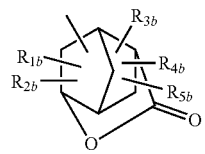
(V-4)

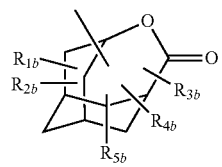
(V-5)

$Ra_1$, $Rb_1$, $Rc_1$, $Rd_1$, and $Re_1$ in general formula (Lc) each independently represent a hydrogen atom or an alkyl group. Symbols m and n each independently represent an integer of 0 to 3, provided that m+n is from 2 to 6.

In general formulae (V-1) to (V-5), $R_{1b}$ to $R_{5b}$ each independently represent a hydrocarbon atom or an alkyl, cycloalkyl, alkoxy, alkoxycarbonyl, alkylsulfonylimino, or alkenyl group, provided that two of $R_{1b}$ to $R_{5b}$ may be bonded to each other to form a ring.

Examples of the alkyl groups represented by $Ra_1$ to $Re_1$ in general formula (Lc) and of the alkyl groups in the alkyl, alkoxy, alkoxycarbonyl, and alkylsulfonylimino groups represented by $R_{1b}$ to $R_{5b}$ in general formulae (V-1) to (V-5) include linear or branched alkyl groups which may have substituents.

Examples of the repeating units having a group having a lactone structure represented by general formula (Lc) or any of general formulae (V-1) to (V-5) include: repeating units represented by general formula (II-A) or (II-B) in which at least one of $R_{13}'$ to $R_{16}'$ has a group represented by general formula (Lc) or any of general formulae (V-1) to (V-5) (e.g., units in which the $R_5$ in —$COOR_5$ is a group represented by general formula (Lc) or any of general formulae (V-1) to (V-5)); and repeating units represented by the following general formula (AI).

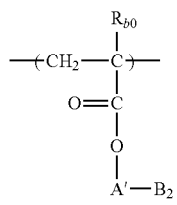 (AI)

In general formula (AI), $R_{b0}$ represents a hydrogen atom, halogen atom, or alkyl group having 1-4 carbon atoms.

Examples of the halogen atom represented by $R_{b0}$ include fluorine, chlorine, bromine, and iodine atoms. $R_{b0}$ preferably is a hydrogen atom.

A' represents a single bond, an ether, ester, carbonyl, or alkylene group, or a divalent group consisting of a combination of two or more of these.

$B_2$ represents a group represented by general formula (Lc) or any of general formulae (V-1) to (V-5).

Specific examples of the repeating units having a group having a lactone structure are shown below, but the repeating units in the invention should not be construed as being limited to the following examples.

(In the formulae, Rx is H, $CH_3$, or $CF_3$.)

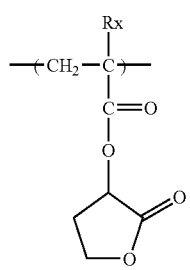 (IV-1)

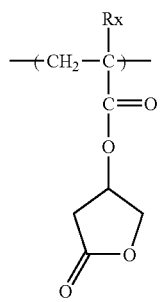 (IV-2)

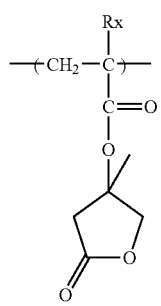 (IV-3)

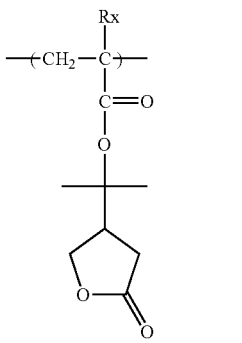 (IV-4)

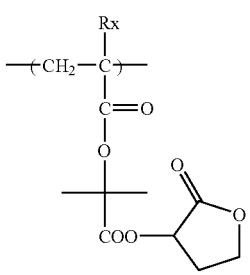 (IV-5)

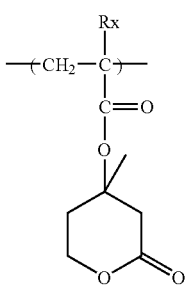 (IV-6)

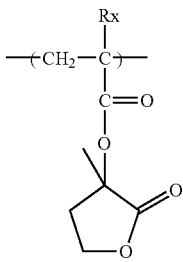 (IV-7)

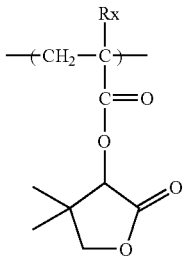 (IV-8)

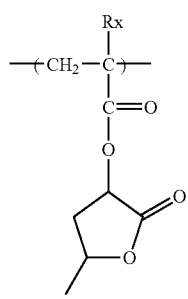 (IV-9)
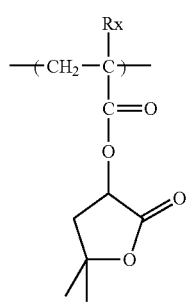 (IV-10)
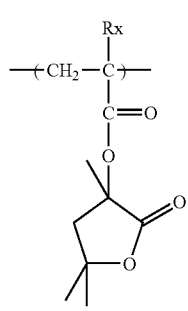 (IV-11)
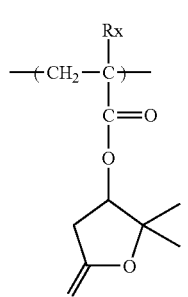 (IV-12)
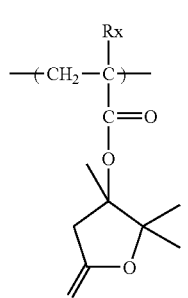 (IV-13)
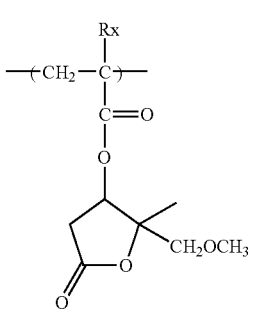 (IV-14)
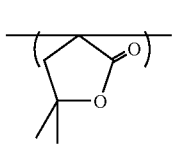 (IV-15)
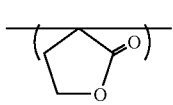 (IV-16)
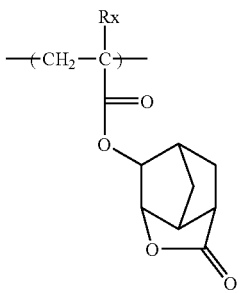 (Ib-1)
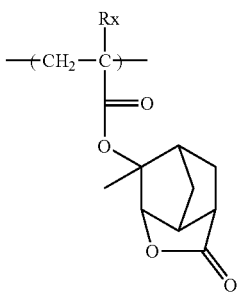 (Ib-2)
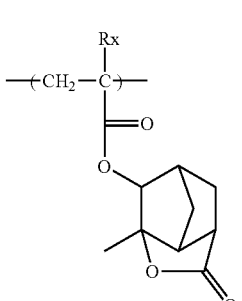 (Ib-3)

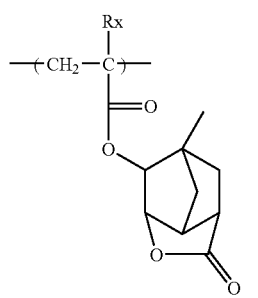
(Ib-4)
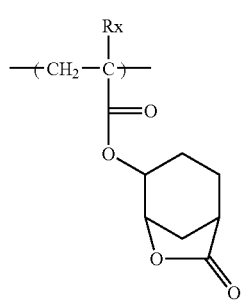
(Ib-5)
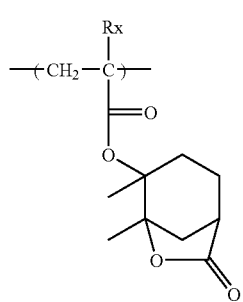
(Ib-6)
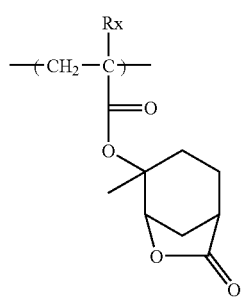
(Ib-7)
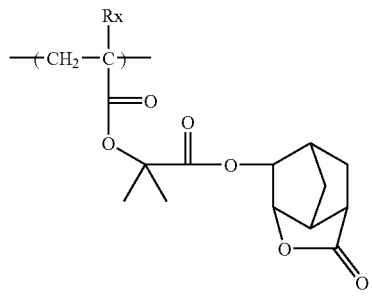
(Ib-8)
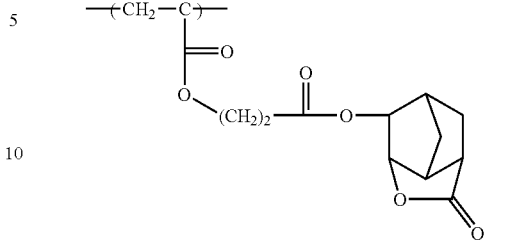
(Ib-9)
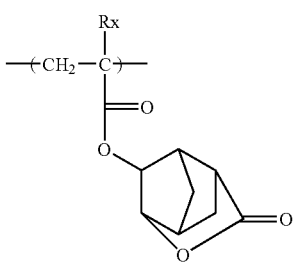
(Ib-10)
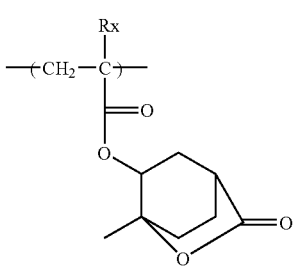
(Ib-11)
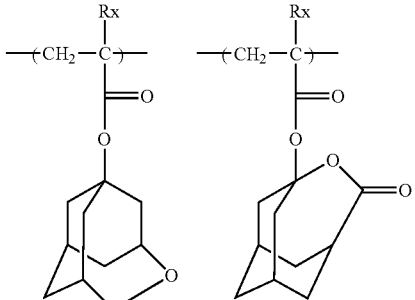
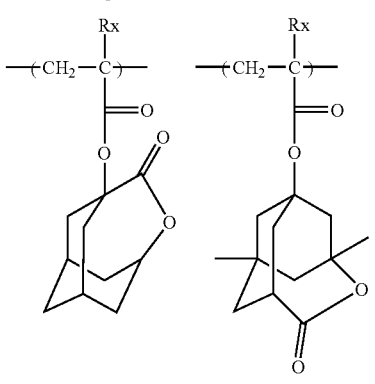

-continued

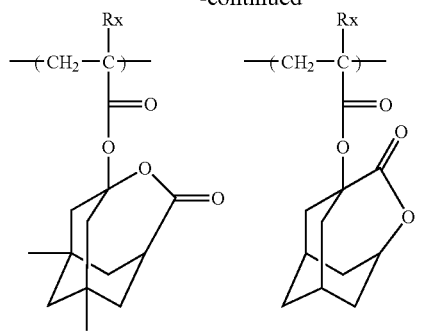

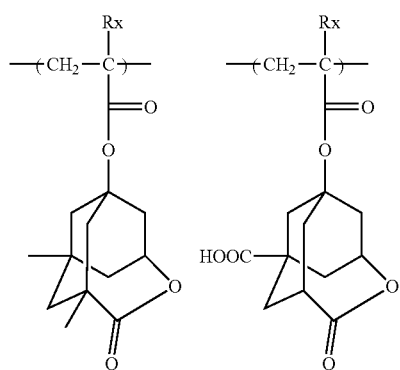

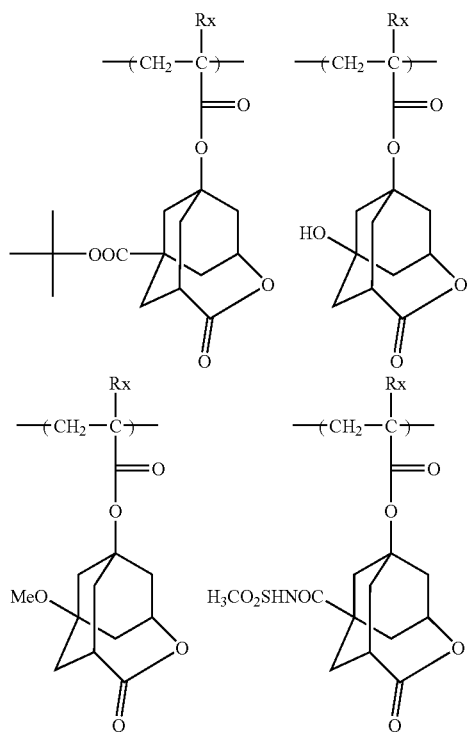

The alicyclic-hydrocarbon-based acid-decomposable resin according to the invention may contain repeating units having a group represented by the following general formula (VII).

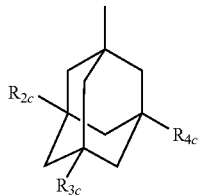
(VII)

In general formula (VII), $R_{2c}$ to $R_{4c}$ each independently represent a hydrogen atom or hydroxy, provided that at least one of $R_{2c}$ to $R_{4c}$ represents hydroxy.

The group represented by general formula (VII) preferably is a group having two hydroxy groups or one hydroxy group, and more preferably is a group having two hydroxy groups.

Examples of the repeating units having a group represented by general formula (VII) include: repeating units represented by general formula (II-A) or (II-B) in which at least one of $R_{13}'$ to $R_{16}'$ has a group represented by general formula (VII) (e.g., units in which the $R_5$ in —$COOR_5$ is a group represented by general formula (VII)); and repeating units represented by the following general formula (AII).

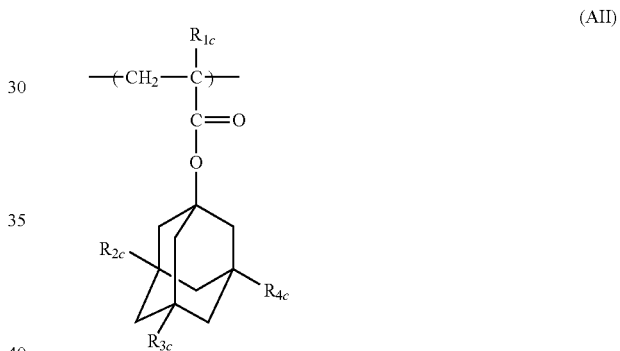
(AII)

In general formula (AII), $R_{1c}$ represents a hydrogen atom or methyl.

$R_{2c}$ to $R_{4c}$ each independently represent a hydrogen atom or hydroxy, provided that at least one of $R_{2c}$ to $R_{4c}$ represents hydroxy. The repeating units preferably are ones in which two of $R_{2c}$ to $R_{4c}$ are hydroxy.

Specific examples of the repeating units represented by general formula (AII) are shown below, but the repeating units in the invention should not be construed as being limited to the following examples.

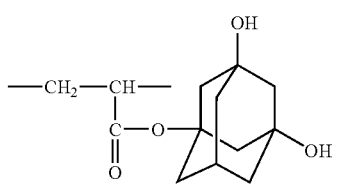
(1)

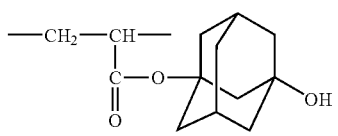
(2)

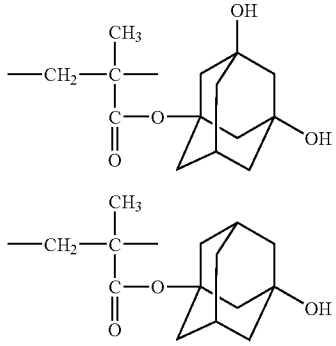

The alicyclic-hydrocarbon-based acid-decomposable resin according to the invention may contain repeating units represented by the following general formula (VIII).

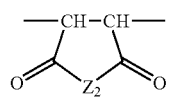

In general formula (VIII), $Z_2$ represents —O— or —N($R_{41}$)—. $R_{41}$ represents a hydrogen atom, hydroxy, alkyl group, or —OSO$_2$—$R_{42}$. $R_{42}$ represents an alkyl group, cycloalkyl group, or camphor residue. The alkyl group represented by $R_{41}$ or $R_{42}$ may be substituted by a halogen atom (preferably fluorine atom), etc.

Specific examples of the repeating units represented by general formula (VIII) include the following, but the repeating units in the invention should not be construed as being limited to these examples.

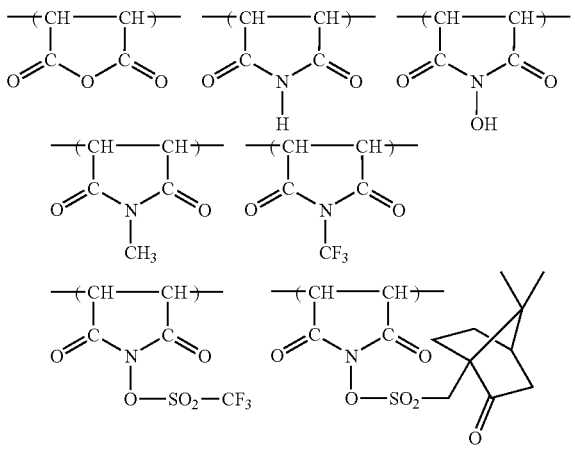

The alicyclic-hydrocarbon-based acid-decomposable resin according to the invention can contain various repeating structural units besides the repeating structural units described above for the purpose of regulating dry etching resistance, suitability for standard developing solutions, adhesion to substrates, resist profile, and general properties required of resists, such as resolution, heat resistance, sensitivity, etc.

Examples of such repeating structural units include the repeating structural units corresponding to the monomers shown below, but the optional units should not be construed as being limited to these.

Thus, performances required of the alicyclic-hydrocarbon-based acid-decomposable resin, in particular, (1) solubility in solvent for application,
(2) film-forming properties (glass transition point),
(3) alkali developability,
(4) resist loss (hydrophilicity/hydrophobicity, selection of alkali-soluble group),
(5) adhesion of unexposed areas to substrate,
(6) dry etching resistance, and the like can be delicately regulated.

Examples of such monomers include compounds having one addition-polymerizable unsaturated bond, such as acrylic esters, methacrylic esters, acrylamide and analogues thereof, methacrylamide and analogues thereof, allyl compounds, vinyl ethers, and vinyl esters.

Besides such monomers corresponding to those various repeating structural units, any addition-polymerizable unsaturated compound copolymerizable with those monomers may have been copolymerized.

In the alicyclic-hydrocarbon-based acid-decomposable resin, the molar proportion of each kind of repeating structural units to be contained is suitably determined in order to regulate resist properties including dry etching resistance, suitability for standard developing solutions, adhesion to substrates, and resist profile and general performances required of resists, such as resolution, heat resistance, and sensitivity.

Preferred embodiments of the alicyclic-hydrocarbon-based acid-decomposable resin according to the invention include the following:

(1) one containing repeating units having a partial structure which includes an alicyclic hydrocarbon and is represented by any of general formulae (PI) to (pVI) (side chain type); and (2) one containing repeating units represented by general formula (II-AB) (main chain type), provided that examples of the resin (2) include the following:

(3) one comprising repeating units represented by general formula (II-AB), a maleic anhydride derivative, and a (meth)acrylate structure (hybrid type).

In the alicyclic-hydrocarbon-based acid-decomposable resin, the content of the repeating units having an acid-dissociable group is preferably 10-60% by mole, more preferably 20-50% by mole, even more preferably 25-40% by mole, based on all repeating structural units.

In the alicyclic-hydrocarbon-based acid-decomposable resin, the content of the repeating units having a partial structure which includes an alicyclic hydrocarbon and is represented by any of general formulae (pI) to (pVI) is preferably 30-70% by mole, more preferably 35-65% by mole, even more preferably 40-60% by mole, based on all repeating structural units.

In the alicyclic-hydrocarbon-based acid-decomposable resin, the content of the repeating units represented by general formula (II-AB) is preferably 10-60% by mole, more preferably 15-55% by mole, even more preferably 20-50% by mole, based on all repeating structural units.

The content of the repeating structural units derived from those optionally usable comonomers in the resin also can be suitably determined according to the desired resist performances. In general, however, the content thereof is preferably 99% by mole or lower, more preferably 90% by mole or lower, even more preferably 80% by mole or lower, based on the total amount of the repeating structural units having a partial structure which includes an alicyclic hydrocarbon and is represented by any of general formulae (pI) to (pVI) and the repeating units represented by general formula (II-AB).

In the case where the composition of the invention is to be used for ArF exposure, the resin preferably has no aromatic group from the standpoint of transparency to ArF light.

The alicyclic-hydrocarbon-based acid-decomposable resin to be used in the invention can be synthesized by ordinary methods (e.g., radical polymerization). For example, a general synthesis method is as follows. Monomers are charged into a reaction vessel at a time or in the course of reaction. According to need, the monomers are dissolved in a reaction solvent, e.g., an ether such as tetrahydrofuran, 1,4-dioxane, or diisopropyl ether, a ketone such as methyl ethyl ketone or methyl isobutyl ketone, an ester solvent such as ethyl acetate, or a solvent capable of dissolving the resist composition of the invention therein, such as those enumerated later, e.g., propylene glycol monomethyl ether acetate, to prepare a homogeneous solution. Thereafter, polymerization of the reaction mixture is initiated with a commercial free-radical initiator (e.g., azo initiator or peroxide) in an inert gas atmosphere such as nitrogen or argon optionally with heating. The initiator may be added additionally or in portions according to need. After completion of the reaction, the reaction mixture is poured into a solvent and the target polymer is recovered as a powder, solid, etc. The reactant concentration is 20% by mass or higher, preferably 30% by mass or higher, more preferably 40% by mass or higher. The reaction temperature is 10-150° C., preferably 30-120° C., more preferably 50-100° C.

In the case where the resist composition of the invention is to be used for forming an upper resist layer in a multilayered resist, the resin as ingredient (B) preferably has silicon atoms.

Any resin which has silicon atoms in at least either of the main chain or side chains thereof can be used as that resin which has silicon atoms and decomposes by the action of an acid to come to have enhanced solubility in an alkaline developer. Examples of the resin having siloxane structures in side chains thereof include copolymers of an olefinic monomer having one or more silicon atoms in a side chain thereof, maleic anhydride, and a (meth)acrylic acid monomer having an acid-dissociable group in a side chain thereof.

In the case where the positive resist composition of the invention is to be irradiated with $F_2$ excimer laser light, the resin as ingredient (B) preferably is a resin which has fluorine-substituted structures in the main chain and/or side chains of the polymer backbone and which decomposes by the action of an acid to come to have enhanced solubility in an alkaline developer (hereinafter referred to also as "fluorine group-containing resin"). More preferred is a resin which contains structures each having in the 1-position a hydroxy group substituted by a fluorine atom or fluoroalkyl group or contains structures each having in the 1-position a group formed by protecting with an acid-dissociable group a hydroxy group substituted by a fluorine atom or fluoroalkyl group. Most preferred is a resin which contains hexafluoro-2-propanol structures or structures formed by protecting the hydroxy group of hexafluoro-2-propanol with an acid-dissociable group. The incorporation of fluorine atoms can improve transparency to far ultraviolet rays, in particular, $F_2$ excimer laser light (157 nm).

Preferred examples of the fluorine group-containing resin as the acid-decomposable resin (B) include resins having at least one kind of repeating units selected from those represented by the following general formulae (FA) to (FG).

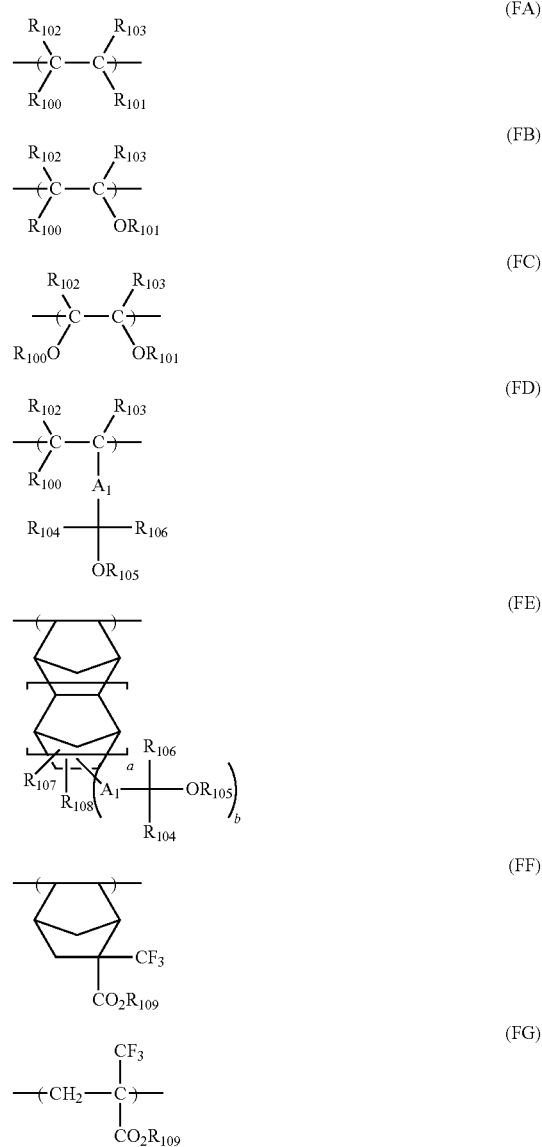

In the general formulae, $R_{100}$ to $R_{103}$ each represent a hydrogen atom, fluorine atom, alkyl group, or aryl group.

$R_{104}$ and $R_{106}$ each represent a hydrogen atom, fluorine atom, or alkyl group, provided that at least one of $R_{104}$ and $R_{106}$ is a fluorine atom or a fluoroalkyl group. Preferably, both $R_{104}$ and $R_{106}$ are trifluoromethyl.

$R_{105}$ is a hydrogen atom, alkyl group, acyl group, alkoxycarbonyl group, or group which dissociates by the action of an acid.

$A_1$ is a single bond or a divalent connecting group, e.g., a linear, branched, or cyclic alkylene group, alkenylene group, arylene group, —OCO—, —COO—, —CON($R_{24}$)—, or connecting group comprising two or more of these. $R_{24}$ is a hydrogen atom or an alkyl group.

$R_{107}$ and $R_{108}$ each are a hydrogen atom, halogen atom, alkyl group, alkoxy group, alkoxycarbonyl group, or group which dissociates by the action of an acid.

$R_{109}$ is a hydrogen atom, alkyl group, or group which dissociates by the action of an acid.

Symbol b is 0, 1, or 2.

The repeating units represented by general formulae (FA) to (FG) each contain at least one, preferably three or more fluorine atoms.

The alkyl groups in general formulae (FA) to (FG) are, for example, alkyl groups having 1-8 carbon atoms. Preferred examples thereof include methyl, ethyl, propyl, n-butyl, sec-butyl, hexyl, 2-ethylhexyl, and octyl.

The cycloalkyl groups may be either monocyclic or polycyclic. Examples of the monocyclic group include ones having 3-8 carbon atoms, such as cyclopropyl, cyclopentyl, cyclohexyl, cycloheptyl, and cyclooctyl. Examples of the polycyclic group include ones having 6-20 carbon atoms, such as adamantyl, norbornyl, isobornyl, camphonyl, dicyclopentyl, α-pinenyl, tricyclodecanyl, tetracyclododecyl, and androstanyl. In each of those monocyclic or polycyclic alkyl groups, one or more of the carbon atoms may have been replaced by a heteroatom, e.g., oxygen atom.

The fluoroalkyl groups are, for example, ones having 1-12 carbon atoms. Preferred examples thereof include trifluoromethyl, perfluoroethyl, perfluoropropyl, perfluorobutyl, perfluorohexyl, perfluorooctyl, perfluorooctylethyl, and perfluorododecyl.

The aryl groups are, for example, aryl groups having 6-15 carbon atoms. Preferred examples thereof include phenyl, tolyl, dimethylphenyl, 2,4,6-trimethylphenyl, naphthyl, anthryl, and 9,10-dimethoxyanthryl.

The aralkyl group is, for example, an aralkyl group having 7-12 carbon atoms. Preferred examples thereof include benzyl, phenethyl, and naphthylmethyl.

The alkenyl group is, for example, an alkenyl group having 2-8 carbon atoms. Preferred examples thereof include vinyl, allyl, butenyl, and cyclohexenyl.

The alkoxy groups are, for example, alkoxy groups having 1-8 carbon atoms. Preferred examples thereof include methoxy, ethoxy, n-propoxy, isopropoxy, butoxy, pentoxy, allyloxy, and octoxy.

The acyl group is, for example, an acyl group having 1-10 carbon atoms. Preferred examples thereof include formyl, acetyl, propanoyl, butanoyl, pivaloyl, octanoyl, and benzoyl.

The acyloxy group is, for example, an acyloxy group having 2-12 carbon atoms. Preferred examples thereof include acetoxy, propionyloxy, and benzoyloxy.

The alkynyl group is, for example, an alkynyl group having 2-5 carbon atoms. Preferred examples thereof include ethynyl, propynyl, and butynyl.

Examples of the alkoxycarbonyl groups include alkoxycarbonyl groups which preferably are secondary or tertiary, more preferably tertiary, such as isopropoxycarbonyl, t-butoxycarbonyl, t-amyloxycarbonyl, and 1-methyl-1-cyclohexyloxycarbonyl.

Examples of the halogen atoms include fluorine, chlorine, bromine, and iodine atoms.

Preferred examples of the alkylene group include ones having 1-8 carbon atoms, such as methylene, ethylene, propylene, butylene, hexylene, and octylene which each may have one or more substituents.

Preferred examples of the alkenylene group include ones having 2-6 carbon atoms, such as ethenylene, propenylene, and butenylene which each may have one or more substituents.

Preferred examples of the cycloalkylene group include ones having 5-8 carbon atoms, such as cyclopentylene and cyclohexylene which each may have one or more substituents.

Preferred examples of the arylene group include ones having 6-15 carbon atoms, such as phenylene, tolylene, and naphthylene which each may have one or more substituents.

Those groups may have substituents. Examples of the substituents include alkyl groups, cycloalkyl groups, aryl groups, and groups having active hydrogen, such as amino, amide, ureido, urethane, hydroxyl, and carboxyl groups. Examples thereof further include halogen atoms (fluorine, chlorine, bromine, and iodine atoms), alkoxy groups (e.g., methoxy, ethoxy, propoxy, and butoxy), thioether groups, acyl groups (e.g., acetyl, propanoyl, and benzoyl), acyloxy groups (e.g., acetoxy, propanoyloxy, and benzoyloxy), alkoxycarbonyl groups (e.g., methoxycarbonyl, ethoxycarbonyl, and propoxycarbonyl), cyano, and nitro.

Examples of the alkyl, cycloalkyl, and aryl groups include the same groups as those enumerated above as examples of such groups. The alkyl groups may be further substituted by one or more fluorine atoms or cycloalkyl groups.

Examples of alkali-soluble groups which dissociate by the action of an acid and are contained in the fluorine group-containing resin according to the invention include —O—C($R_{36}$)($R_{37}$)($R_{38}$), —O—C($R_{36}$)($R_{37}$)(O$R_{39}$), —O—COO—C($R_{36}$)($R_{37}$)($R_{38}$), —O—C($R_{01}$)($R_{02}$)COO—C($R_{36}$)($R_{37}$)($R_{38}$), —COO—C($R_{36}$)($R_{37}$)($R_{38}$), and —COO—C($R_{36}$)($R_{37}$)(O$R_{39}$).

$R_{36}$ to $R_{39}$ each represent an alkyl, cycloalkyl, aryl, aralkyl, or alkenyl group. $R_{01}$ and $R_{02}$ each represent a hydrogen atom or an alkyl, cycloalkyl, alkenyl, aralkyl, or aryl group.

Preferred example thereof include ether or ester groups of tertiary alkyl groups such as t-butyl, t-amyl, 1-alkyl-1-cyclohexyl, 2-alkyl-2-adamantyl, 2-adamantyl-2-propyl, and 2-(4-methylcyclohexyl)-2-propyl groups, acetal or acetal ester groups of, e.g., a 1-alkoxy-1-ethoxy or tetrahydropyranyl group, t-alkyl carbonate groups, and t-alkylcarbonylmethoxy groups.

Specific examples of the repeating structural units represented by general formulae (FA) to (FG) are shown below, but the units in the invention should not be construed as being limited to these.

(F-1)

(F-2)

(F-3)

(F-4)

(F-5)

(Chemical structures F-6 through F-23)

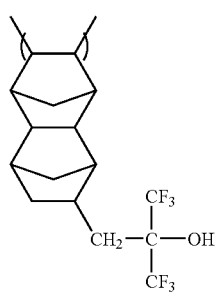
(F-24)
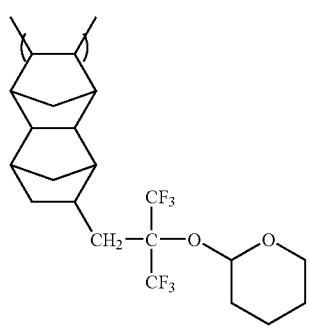
(F-25)
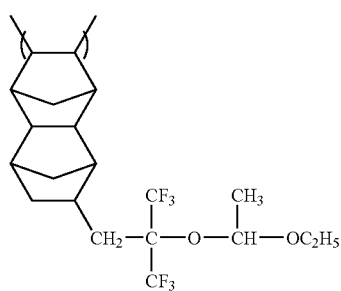
(F-26)
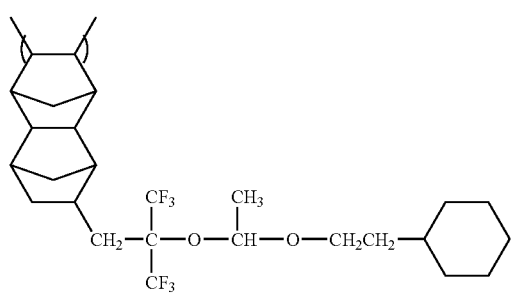
(F-27)
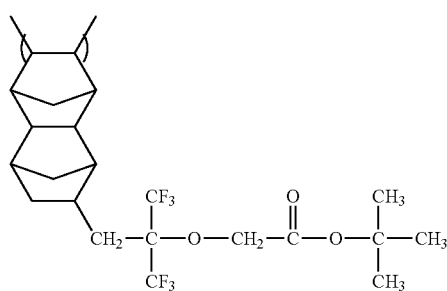
(F-28)
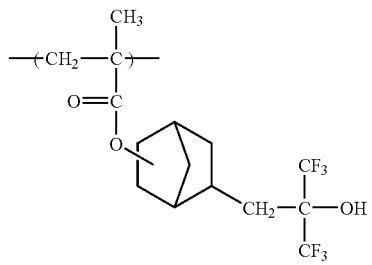
(F-29)
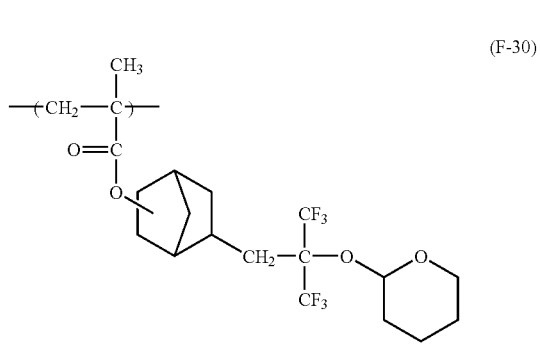
(F-30)
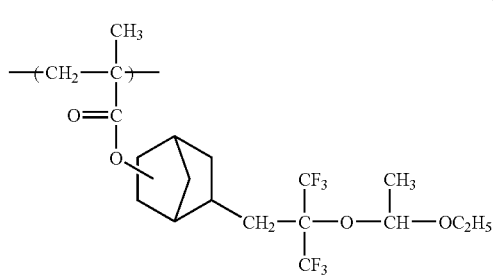
(F-31)
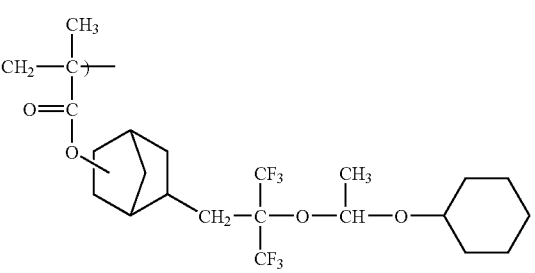
(F-32)
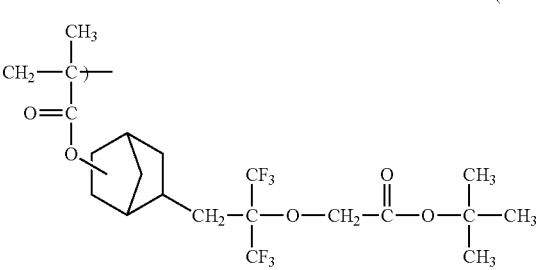
(F-33)

(F-34) 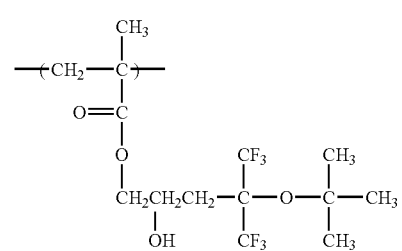
(F-35) 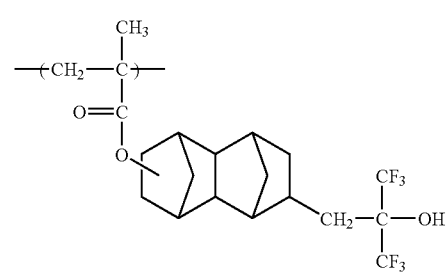
(F-36) 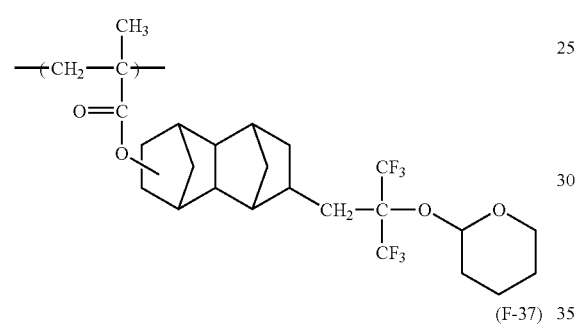
(F-37) 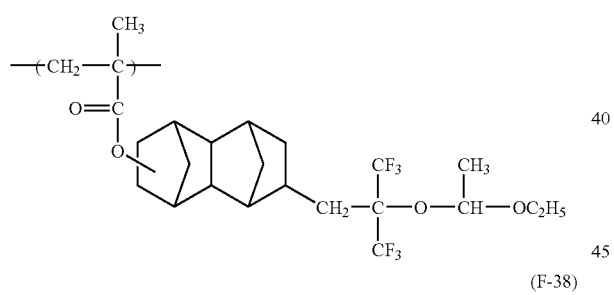
(F-38) 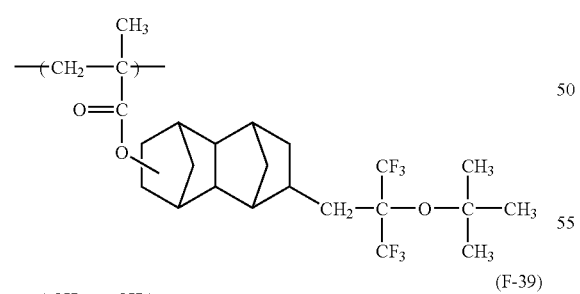
(F-39) 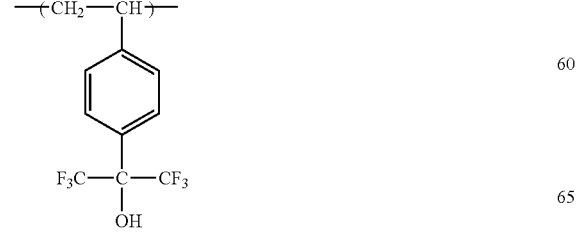
(F-40) 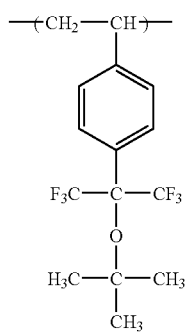
(F-41) 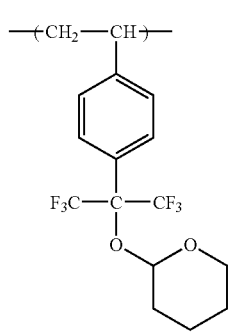
(F-42) 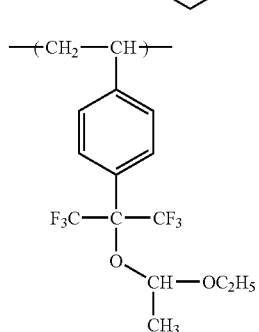
(F-43) 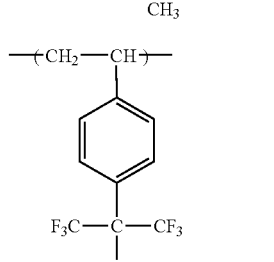
(F-44) 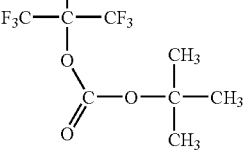
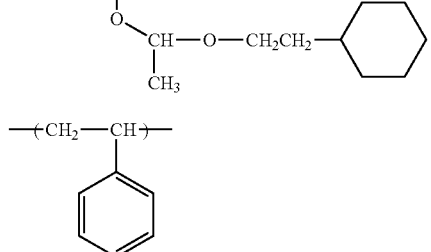

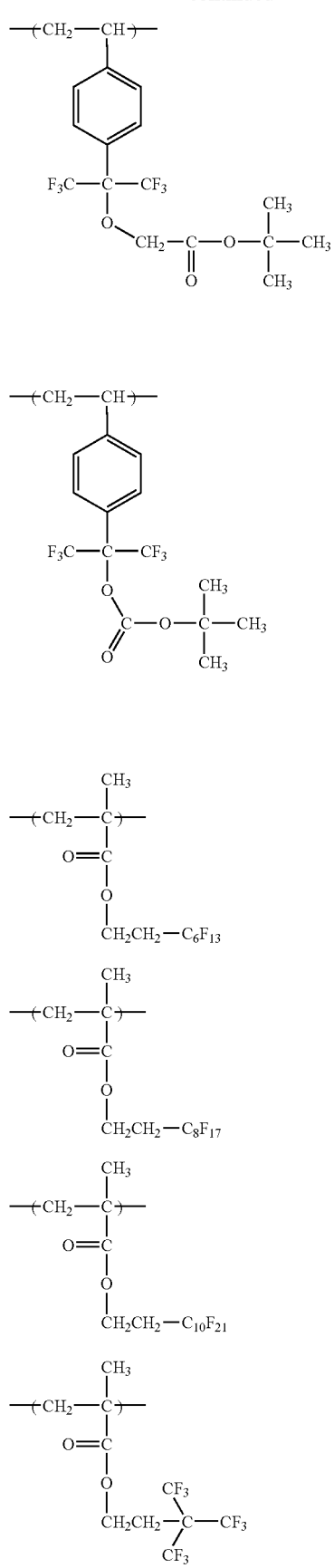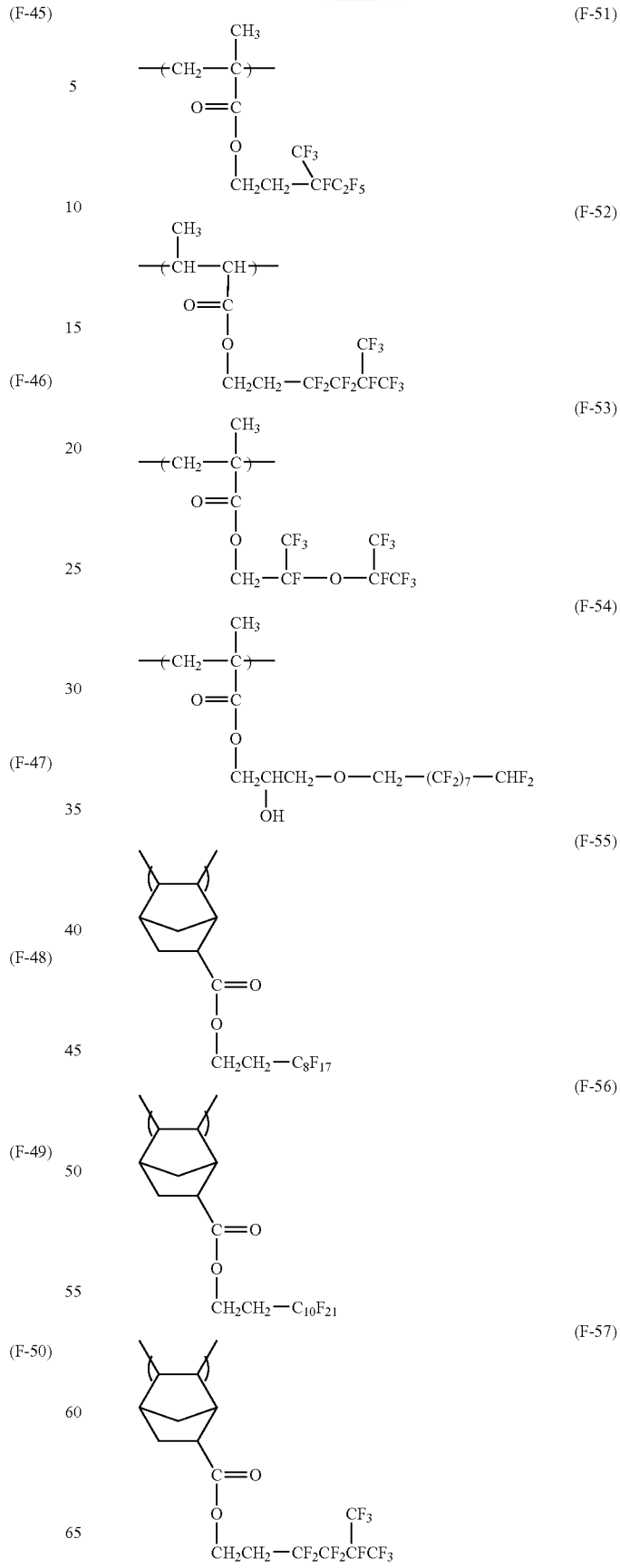

-continued (F-58)
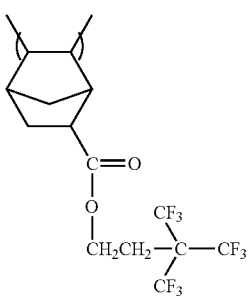

(F-59)
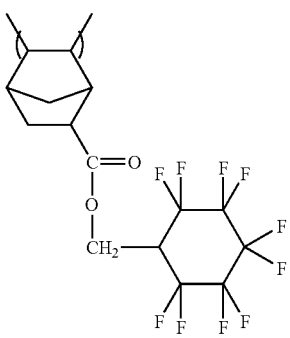

(F-60)
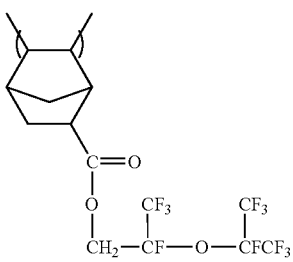

(F-61)
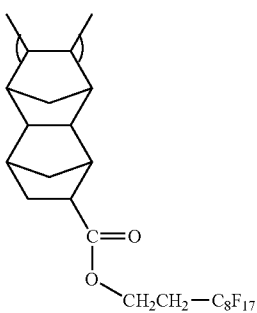

(F-62)
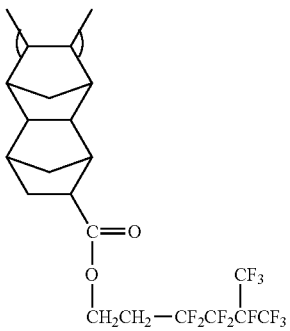

-continued (F-63)
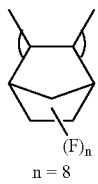
n = 8

(F-64)
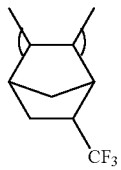

(F-65)
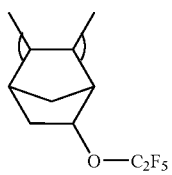

The total content of the repeating units represented by general formulae (FA) to (FG) is generally 10-80% by mole, preferably 30-70% by mole, more preferably 35-65% by mole, based on all repeating units constituting the resin.

The resin (B) according to the invention may contain, besides the repeating structural units described above, units formed by copolymerizing other polymerizable monomers for the purpose of improving the performances of the resist according to the invention.

Examples of usable comonomers include compounds having one addition-polymerizable unsaturated bond other than those mentioned above, which are selected from acrylic esters, acrylamide derivatives, methacrylic esters, methacrylamide derivatives, allyl compounds, vinyl ethers, vinyl esters, styrene and styrene derivatives, and crotonic esters.

From the standpoints of improving dry etching resistance, regulating alkali solubility, improving adhesion to substrates, etc., the fluorine-containing resin described above preferably contains other repeating units derived from one or more comonomers, besides the fluorine atom-containing repeating units described above. Preferred examples of such optional repeating units include the following.

1) Repeating units having an alicyclic hydrocarbon structure represented by any of general formulae (pI) to (pVI) and (II-AB). Specifically, repeating units 1 to 23 shown above and repeating units [II-1] to [II-32] shown above. Preferred are the repeating unit examples 1 to 23 in which Rx is $CF_3$.

2) Repeating units having a lactone structure represented by any of general formulae (Lc) and (V-1) to (V-5). Specifically, repeating units (IV-1) to (IV-16) shown above and repeating units (Ib-1) to (Ib-11) shown above.

3) Repeating units represented by any of the following general formulae (XV), (XVI), and (XVII), which are derived from maleic anhydride, a vinyl ether, or a vinyl compound having a cyano group; specifically, repeating units (C-1) to (C-15) shown below.

These optional repeating units may contain one or more fluorine atoms or contain no fluorine atom.

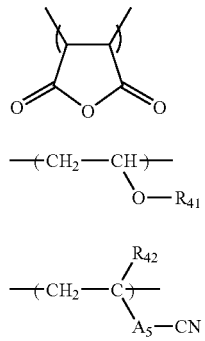

(XV)

—(CH₂—CH)—
         |
         O—R₄₁

(XVI)

$$-\!(CH_2\!-\!C(R_{42})(A_5\!-\!CN))\!-$$

(XVII)

In the formulae, $R_{41}$ represents an alkyl, cycloalkyl, aralkyl, or aryl group. The alkyl group represented by $R_{41}$ may have been substituted by an aryl group.

$R_{42}$ represents a hydrogen atom, halogen atom, cyano, or alkyl group.

$A_5$ represents a single bond, divalent alkylene, alkenylene, cycloalkylene, or arylene group, —O—CO—$R_{22}$—, —CO—O—$R_{23}$—, or —CO—N($R_{24}$)—$R_{25}$—.

$R_{22}$, $R_{23}$, and $R_{25}$ may be the same or different, and each represent a single bond or a divalent alkylene, alkenylene, cycloalkylene, or arylene group which may have an ether, ester, amide, urethane, or ureido group.

$R_{24}$ represents a hydrogen atom or an alkyl, cycloalkyl, aralkyl, or aryl group.

Examples of these substituents are the same as those enumerated above as examples of the substituents in general formulae (FA) to (FG).

Specific examples of the repeating structural units represented by general formulae (XVI) and (XVII) are shown below, but the units in the invention should not be construed as being limited to these.

(C-1)

—(CH₂—CH)—
         |
         O
          \
           CH₃

(C-2)

—(CH₂—CH)—
         |
         O
          \
           C₂H₅

(C-3)

—(CH₂—CH)—
         |
         O
          \
           C₄H₉ᵗ

(C-4)

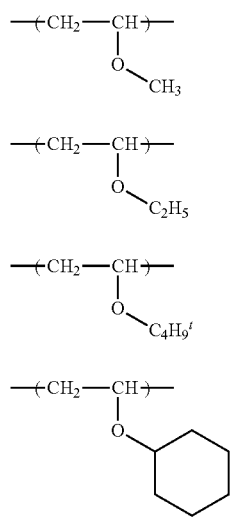

(C-5)

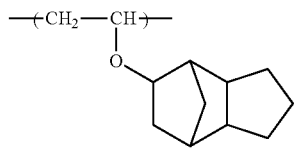

(C-6)

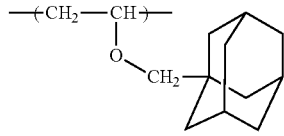

(C-7)

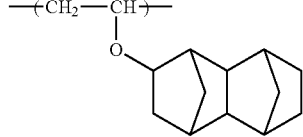

(C-8)

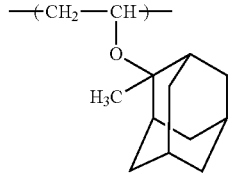

(C-9)

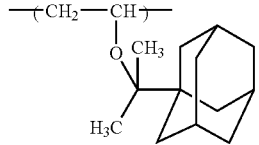

(C-10)

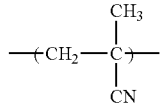

(C-11)

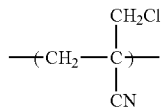

(C-12)

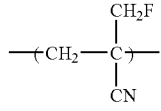

(C-13)

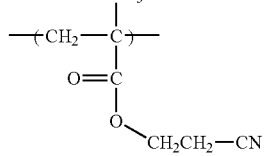

(C-14)

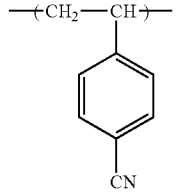

-continued (C-15)

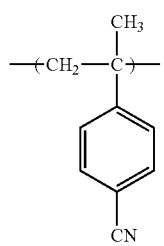

The total content of the optional repeating units, e.g., those represented by general formulae (XV) to (XVII), in the resin to be used is generally 0-70% by mole, preferably 10-60% by mole, more preferably 20-50% by mole, based on all repeating units constituting the resin.

In the fluorine group-containing resin as the acid-decomposable resin (B), acid-dissociable groups may be contained in any repeating units.

The content of the repeating units each containing an acid-dissociable group is preferably 10-70% by mole, more preferably 20-60% by mole, even more preferably 30-60% by mole, based on all repeating units.

The fluorine group-containing resin can be synthesized by radical polymerization in almost the same manner as for the alicyclic-hydrocarbon-based acid-decomposable resin.

The weight-average molecular weight of the resin as ingredient (B) in the invention is preferably 1,000-200,000 in terms of weight-average molecular weight determined through measurement by GPC and calculation for standard polystyrene. By regulating the weight-average molecular weight of the resin to 1,000 or higher, heat resistance and dry etching resistance can be improved. By regulating the weight-average molecular weight thereof to 200,000 or lower, not only developability can be improved but also film-forming properties can be improved because of a considerably reduced viscosity.

In the positive resist composition of the invention, the amount of the resin incorporated as ingredient (B) according to the invention is preferably 40-99.99% by mass, more preferably 50-99.97% by mass, based on all solid components of the whole composition.

[3] (C) Dissolution Inhibitive Compound Having Molecular Weight of 3,000 or Lower and Decomposing by Action of Acid to Show Enhanced Solubility in Alkaline Developer (Hereinafter Referred to Also as "Ingredient (C)" or "Dissolution Inhibitive Compound")

The dissolution inhibitive compound as ingredient (C), which has a molecular weight of 3,000 or lower and decomposes by the action of an acid to come to have enhanced solubility in an alkaline developer, preferably is an alicycilc or aliphatic compound having an acid-dissociable group, such as the cholic acid derivatives containing an acid-dissociable group which are described in Proceeding of SPIE, 2724, 355 (1996), so as not to reduce transmission at wavelengths of 220 nm and shorter. Examples of the acid-dissociable group and alicyclic structure are the same as those described above with regard to the alicyclic-hydrocarbon-based acid-decomposable resin.

In the case where the resist composition of the invention is to be exposed with a KrF excimer laser or irradiated with electron beams, the dissolution inhibitive compound preferably is one containing a structure formed by replacing one or more of the phenolic hydroxy group(s) of a phenol compound by an acid-dissociable group. The phenol compound preferably is one having 1-9 phenol frameworks, and more preferably is one having 2-6 phenol frameworks.

The molecular weight of the dissolution inhibitive compound in the invention is 3,000 or lower, preferably 300-3,000, more preferably 500-2,500.

The amount of the dissolution inhibitive compound to be added is preferably 3-50% by mass, more preferably 5-40% by mass, based on the solid components of the resist composition.

Examples of the dissolution inhibitive compound are shown below, but the compound in the invention should not be construed as being limited to the following examples.

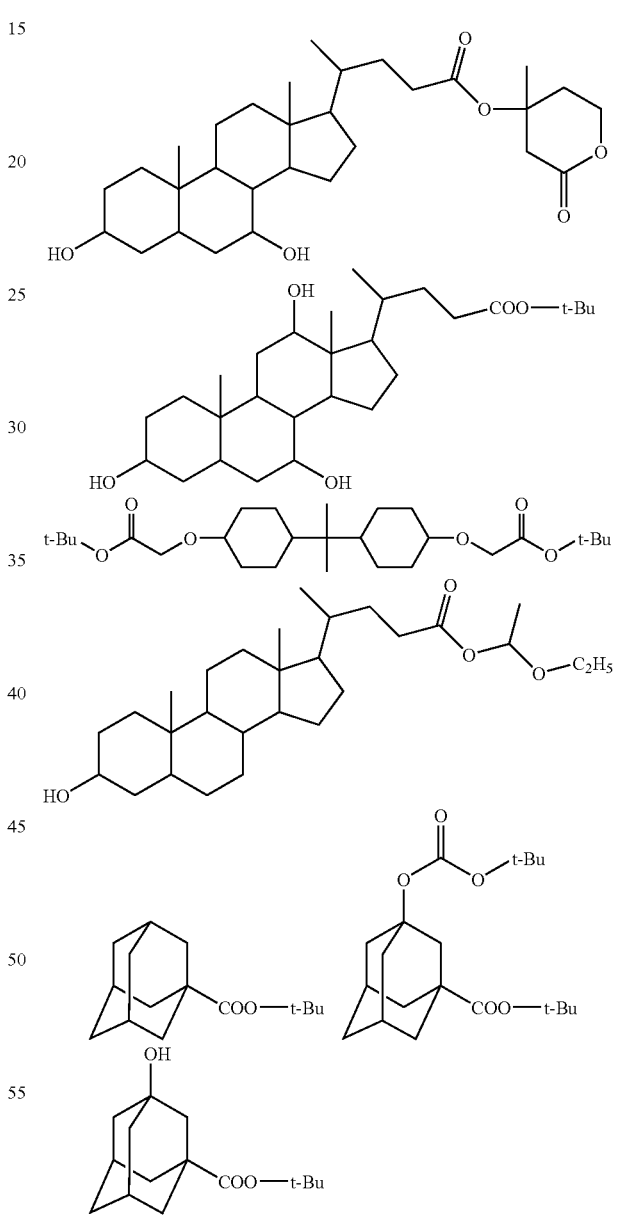

[4] (D) Resin Soluble in Alkaline Developer (Hereinafter Referred to Also as "Ingredient (D)" or "Alkali-Soluble Resin")

The rate of alkali dissolution of the alkali-soluble resin is preferably 20 Å/sec or higher as measured in 0.261-N tetramethylammonium hydroxide (TMAH) (23° C.).

Especially preferred is one having a rate of alkali dissolution of 200 Å/sec or higher (Å is angstrom).

Examples of the alkali-soluble resin to be used in the invention include novolak resins, hydrogenated novolak resins, acetone/pyrogallol resins, poly(o-hydroxystyrene), poly(m-hydroxystyrene), poly(p-hydroxystyrene), hydrogenated poly(hydroxystyrene), halogen- or alkyl-substituted poly(hydroxystyrene), hydroxystyrene/N-substituted maleimide copolymers, o/p- and m/p-hydroxystyrene copolymers, polyhydroxystyrenes partly O-alkylated at the hydoxy groups (e.g., O-methylated, O-(1-methoxy)ethylated, O-(1-ethoxy)ethylated, O-2-tetrahydropyranyl-substituted, and O-(t-butoxycarbonyl)methylated polyhydroxystyrenes having a degree of alkylation of 5-30% by mole), polyhydroxystyenes partly O-acylated at the hydroxy groups (e.g., O-acetylated and O-(t-butoxy)carbonylated polyhydroxystyrenes having a degree of acylation of 5-30% by mole), styrene/maleic anhydride copolymers, styrene/hydroxystyrene copolymers, α-methylstyrene/hydroxystyrene copolymers, carboxyl-containing methacrylic resins and derivatives thereof, and poly(vinyl alcohol) derivatives. However, the alkali-soluble resin should not be construed as being limited to these examples.

Especially preferred alkali-soluble resins are novolak resins, poly(o-hydroxystyrene), poly(m-hydroxystyrene), poly(p-hydroxystyrene), copolymers of these, alkyl-substituted poly(hydroxystyrene)s, partly O-alkylated or O-acylated poly(hydroxystyrene)s, styrene/hydroxystyrene copolymers, and α-methylstyrene/hydroxystyrene copolymers.

The novolak resins can be obtained by subjecting one or more given monomers as a major ingredient to addition condensation with an aldehyde in the presence of an acid catalyst.

The weight-average molecular weight of the alkali-soluble resin is generally 2,000 or higher, preferably 5,000-200,000, more preferably 5,000-100,000.

Weight-average molecular weight herein is defined as a value determined through measurement by gel permeation chromatography and calculation for standard polystyrene.

Those alkali-soluble resins (D) in the invention may be used in combination of two or more thereof.

The amount of the alkali-soluble resin to be used is generally 40-97% by mass, preferably 60-90% by mass, based on the solid components of the whole resist composition.

[5] (E) Acid-Sensitive Crosslinking Agent which Crosslinks the Alkali-Soluble Resin by Action of Acid (Hereinafter Referred to Also as "Ingredient (E)" or "Crosslinking Agent")

A crosslinking agent is used in the negative resist composition of the invention.

The crosslinking agent may be any compound which, by the action of an acid, crosslinks the resin soluble in an alkaline developer. However, the following (1) to (3) are preferred.

(1) Hydroxymethylated, alkoxymethylated, or acyloxymethylated phenol derivatives.

(2) Compounds having N-hydroxymethyl, N-alkoxymethyl, or N-acyloxymethyl groups.

(3) Compounds having epoxy groups.

The alkoxymethyl groups each preferably have up to 6 carbon atoms, and the acyloxymethyl groups each preferably have up to 6 carbon atoms.

Especially preferred examples of those crosslinking agents are shown below.

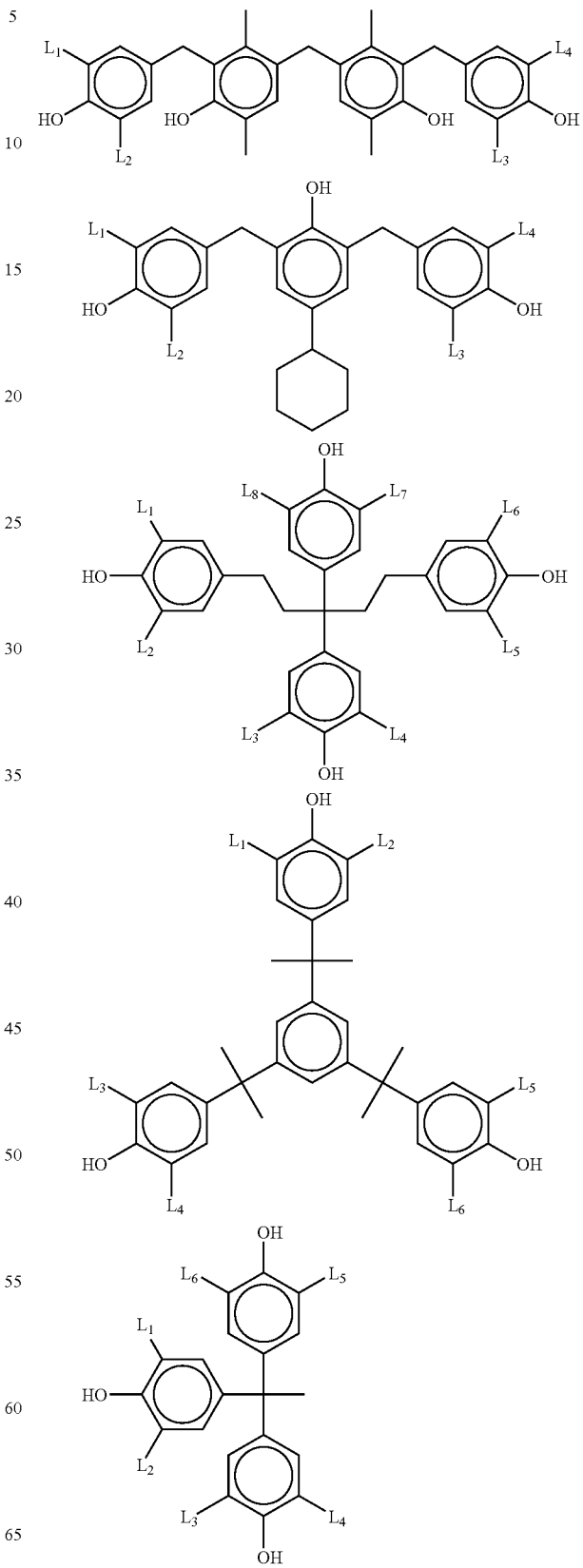

-continued

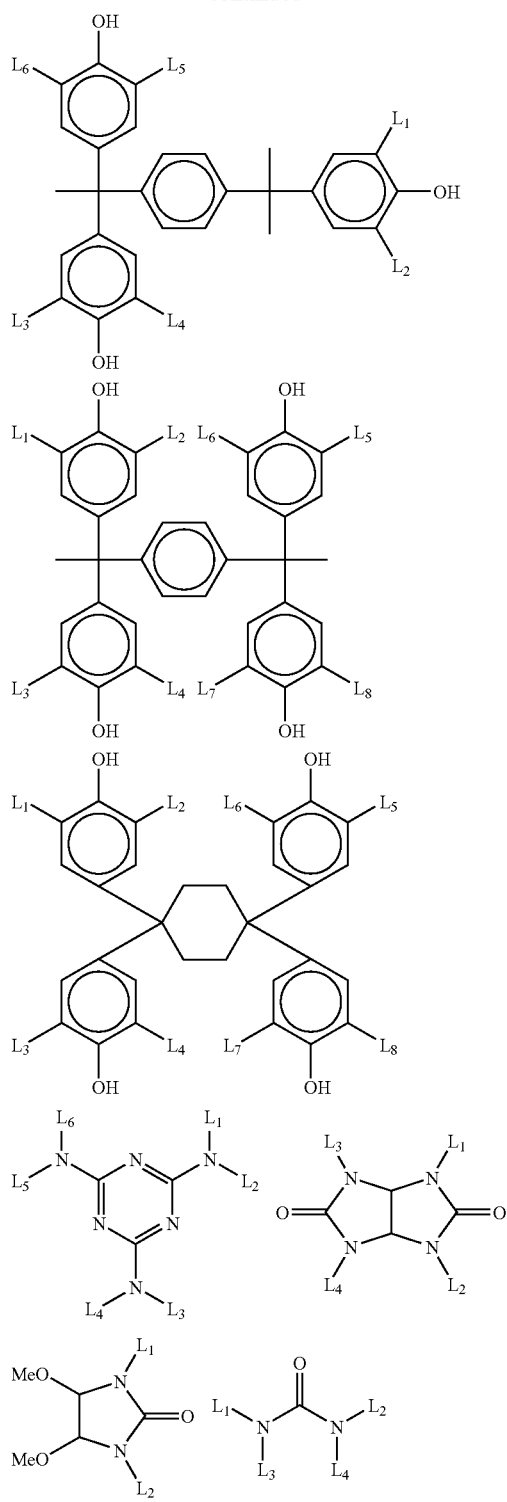

(In the formulae, $L^1$ to $L^8$ may be the same or different and each represent a hydrogen atom, hydroxymethyl, methoxymethyl, ethoxymethyl, or alkyl group having 1-6 carbon atoms.)

The crosslinking agent is used in an amount of generally 3-70% by mass, preferably 5-50% by mass, based on the solid components of the resist composition.

<Other Ingredients>

[6] (F) Basic Compound

It is preferred that the resist composition of the invention should contain a basic compound (F) so as to be reduced in performance changes with the lapse of time from exposure to heating.

Preferred examples thereof include structures represented by the following formulae (A) to (E).

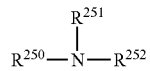

(A)

In formula (A), $R^{250}$, $R^{251}$, and $R^{252}$ each independently are a hydrogen atom, an alkyl group having 1-20 carbon atoms, a cycloalkyl group having 3-20 carbon atoms, or an aryl group having 6-20 carbon atoms, provided that $R^{250}$ and $R^{251}$ may be bonded to each other to form a ring. These groups may have one or more substituents. The alkyl or cycloalkyl group having one or more substituents preferably is an aminoalkyl group having 1-20 carbon atoms, aminocycloalkyl group having 3-20 carbon atoms, hydroxyalkyl group having 1-20 carbon atoms, or hydroxycycloalkyl group having 3-20 carbon atoms.

Those alkyl groups each may contain an oxygen, sulfur, or nitrogen atom in the alkyl chain.

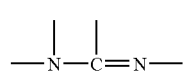

(B)

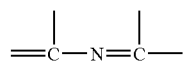

(C)

(D)

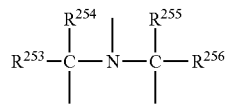

(E)

(In formula (E), $R^{253}$, $R^{254}$, $R^{255}$, and $R^{256}$ each independently represent an alkyl group having 1-6 carbon atoms or a cycloalkyl group having 3-6 carbon atoms.)

Preferred compounds include guanidine, aminopyrrolidine, pyrazole, pyrazoline, piperazine, aminomorpholine, aminoalkylmorpholines, and piperidine, which each may having one or more substituents. More preferred compounds include compounds having an imidazole structure, diazabicyclo structure, onium hydroxide structure, onium carboxylate structure, trialkylamine structure, aniline structure, or pyridine structure, alkylamine derivatives having a hydroxy group and/or ether bond, and aniline derivatives having a hydroxy group and/or ether bond.

Examples of the compounds having an imidazole structure include imidazole, 2,4,5-triphenylimidazole, and benzimidazole. Examples of the compounds having a diazabicyclo structure include 1,4-diazabicyclo[2.2.2]octane, 1,5-diazabicyclo[4.3.0]non-5-ene, and 1,8-diazabicyclo[5.4.0]undec-7-ene. Examples of the compounds having an onium hydroxide structure include triarylsulfonium hydroxides, phenacylsulfonium hydroxide, and sulfonium hydroxides having a 2-oxoalkyl group, and specific examples thereof include triphenylsulfonium hydroxide, tris(t-butylphenyl)sulfonium hydroxide, bis(t-butylphenyl)iodonium hydroxide, phenacylthiophenium hydroxide, and 2-oxopropylthiophenium hydroxide. The compounds having an onium carboxylate structure are those compounds having an onium hydroxide structure in which the anion part has been replaced by a carboxylate, and examples thereof include acetates, adamantane-1-carboxylates, and perfluoroalkylcarboxylates. Examples of the compounds having a trialkylamine structure include tri(n-butyl)amine and tri(n-octyl)amine. Examples of the aniline compounds include 2,6-diisopropylaniline and N,N-dimethylaniline. Examples of the alkylamine derivatives having a hydroxy group and/or ether bond include ethanolamine, diethanolamine, triethanolamine, and tris(methoxyethoxyethyl)amine. Examples of the aniline derivatives having a hydroxy group and/or ether bond include N,N-bis(hydroxyethyl)aniline.

Those basic compounds may be used alone or in combination of two or more thereof. The amount of the basic compounds to be used is generally 0.001-10% by mass, preferably 0.01-5% by mass, based on the solid components of the resist composition. From the standpoint of sufficiently obtaining the effect of the addition, the amount of the compounds is preferably 0.001% by mass or larger. From the standpoints of sensitivity and the developability of unexposed areas, the amount of the compounds is preferably 10% by mass or smaller.

[7] (G) Fluorochemical and/or Silicone Surfactant

The resist composition of the invention preferably further contains any one of or two or more of fluorochemical and/or silicone surfactants (fluorochemical surfactants, silicone surfactants, and surfactants containing both fluorine atoms and silicon atoms).

When the resist composition of the invention contains a fluorochemical and/or silicone surfactant, it can show satisfactory sensitivity and resolution when irradiated with an exposure light having a wavelength of 250 nm or shorter, especially 220 nm or shorter, and give a resist pattern having satisfactory adhesion and reduced in development defects.

Examples of the fluorochemical and/or silicone surfactants include the surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862, and U.S. Pat. Nos. 5,405,720, 5,360,692, 5,529,881, 5,296,330, 5,436,098, 5,576,143, 5,294,511, and 5,824,451. It is also possible to use the following commercial surfactants as they are.

Examples of usable commercial surfactants include fluorochemical or silicone surfactants such as F-Top EF301 and FE303 (manufactured by New Akita Chemical Company), Fluorad FC430 and 431 (manufactured by Sumitomo 3M Ltd.), Megafac F171, F173, F176, F189, and R08 (manufactured by Dainippon Ink & Chemicals, Inc.), Surflon S-382 and SC101, 102, 103, 104, 105, and 106 (manufactured by Asahi Glass Co., Ltd.), and Troysol S-366 (manufactured by Troy Chemical Co., Ltd.). Polysiloxane polymer KP-341 (manufactured by Shin-Etsu Chemical Co., Ltd.) can also be used as a silicone surfactant.

Also usable besides the known surfactants shown above is a surfactant comprising a polymer having a fluoroaliphatic group and derived from a fluoroaliphatic compound produced by the telomerization method (also called telomer method) or oligomerization method (also called oligomer method). The fluoroaliphatic compound can be synthesized by the method described in JP-A-2002-90991.

The polymer having a fluoroaliphatic group preferably is a copolymer of a monomer having a fluoroaliphatic group with a poly(oxyalkylene) acrylate and/or a poly(oxyalkylene) methacrylate. This copolymer may be one in which the monomer units are randomly distributed or be a block copolymer. Examples of the poly(oxyalkylene) group include poly(oxyethylene), poly(oxypropylene), and poly(oxybutylene). The poly(oxyalkylene) group may be a unit having, in the same chain, alkylenes having different chain lengths, such as a poly(blocks of oxyethylene, oxypropylene, and oxyethylene) or poly(blocks of oxyethylene and oxypropylene) group. The copolymer of a monomer having a fluoroaliphatic group with a poly(oxyalkylene) acrylate (or methacrylate) is not limited to binary copolymers, and may be a copolymer of three or more monomers which is obtained by copolymerization in which two or more different monomers each having a fluoroaliphatic group, two or more different poly(oxyalkylene) acrylates (or methacrylates), etc. are simultaneously copolymerized.

Examples of commercial surfactants include Megafac F178, F-470, F-473, F-475, F-476, and F-472 (manufactured by Dainippon Ink & Chemicals, Inc.). Examples of the polymer having a fluoroaliphatic group further include a copolymer of an acrylate (or methacrylate) having a $C_6F_{13}$ group with a poly(oxyalkylene) acrylate (or methacrylate), a copolymer of an acrylate (or methacrylate) having a $C_6F_{13}$ group with poly(oxyethylene) acrylate (or methacrylate) and poly(oxypropylene) acrylate (or methacrylate), a copolymer of an acrylate (or methacrylate) having a $C_8F_{17}$ group with a poly(oxyalkylene) acrylate (or methacrylate), and a copolymer of an acrylate (or methacrylate) having a $C_8F_{17}$ group with poly(oxyethylene) acrylate (or methacrylate) and poly(oxypropylene) acrylate (or methacrylate).

The amount of the fluorochemical and/or silicone surfactant to be used is preferably 0.0001-2% by mass, more preferably 0.001-1% by mass, based on the total amount of the resist composition (excluding the solvent).

[8] (H) Organic Solvent

The resist composition of the invention to be used is prepared by dissolving the ingredients in a given organic solvent.

Examples of usable organic solvents include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methylpyruvate, ethyl pyruvate, propyl pyruvate, N,N-dimethylformamide, dimethyl sulfoxide, N-methylpyrrolidone, and tetrahydrofuran.

In the invention, organic solvents may be used alone or as a mixture of two or more thereof. It is, however, preferred to use a mixed solvent prepared by mixing at least one solvent containing one or more hydroxy groups in the structure with at least one solvent containing no hydroxy group. Use of this mixed solvent is effective in diminishing particle generation during resist fluid storage.

Examples of the solvent containing one or more hydroxy groups include ethylene glycol, ethylene glycol monomethyl ether, ethylene glycol monoethyl ether, propylene glycol, propylene glycol monomethyl ether, propylene glycol monoethyl ether, and ethyl lactate. Preferred of these are propylene glycol monomethyl ether and ethyl lactate.

Examples of the solvent containing no hydroxy group include propylene glycol monomethyl ether acetate, ethyl ethoxypropionate, 2-heptanone, γ-butyrolactone, cyclohexanone, butyl acetate, N-methylpyrrolidone, N,N-dimethylacetamide, and dimethyl sulfoxide. Especially preferred of these are propylene glycol monomethyl ether acetate, ethyl ethoxypropionate, 2-heptanone, γ-butyrolactone, cyclohexanone, and butyl acetate. Most preferred are propylene glycol monomethyl ether acetate, ethyl ethoxypropionate, and 2-heptanone.

The proportion (by mass) of the solvent containing one or more hydroxy groups to the solvent containing no hydroxy group is generally from 1/99 to 99/1, preferably from 10/90 to 90/10, more preferably from 20/80 to 60/40. A mixed solvent in which the content of the solvent containing no hydroxy group is 50% by mass or higher is especially preferred from the standpoint of evenness of application.

<Other Additives>

A dye, plasticizer, surfactant other than ingredient (G) described above, photosensitizer, compound accelerating dissolution in developing solutions, and other additives may be further incorporated into the resist composition of the invention according to need.

The compound accelerating dissolution in developing solutions which is usable in the invention is a low-molecular compound having a molecular weight of 1,000 or lower and having two or more phenolic OH groups or one or more carboxy groups. In the case where the compound has one or more carboxy groups, it preferably is an alicyclic or aliphatic compound.

The amount of such dissolution-accelerating compounds to be added is preferably 2-50% by mass, more preferably 5-30% by mass, based on the resin as ingredient (B) or the resin as ingredient (D). From the standpoints of diminishing development residues and preventing pattern deformation during development, the amount thereof is preferably 50% by mass or smaller.

The phenolic compound having a molecular weight of 1,000 or lower can be easily synthesized by persons skilled in the art while referring to methods described in, e.g., JP-A-4-122938, JP-A-2-28531, U.S. Pat. No. 4,916,210, and European Patent 219,294.

Examples of the alicyclic or aliphatic compound having one or more carboxyl groups include carboxylic acid derivatives having a steroid structure, such as cholic acid, deoxycholic acid, and lithocholic acid, adamantanecarboxylic acid derivatives, adamantanedicarboxylic acid, cyclohexanecarboxylic acid, and cyclohexanedicarboxylic acid. However, the alicyclic or aliphatic compound should not be construed as being limited to these.

Surfactants other than the fluorochemical and/or silicone surfactant (G) described above may be added in the invention. Examples thereof include nonionic surfactants such as polyoxyethylene alkyl ethers, polyoxyethylene alkylaryl ethers, polyoxyethylene/polyoxypropylene block copolymers, aliphatic esters of sorbitan, and aliphatic esters of polyoxyethylene-sorbitan.

Those surfactants may be used alone or in combination of two or more thereof.

<<Method of Use>>

When the resist composition of the invention is used, the ingredients described above are dissolved in a given organic solvent, preferably the mixed solvent described above, and the resultant solution is applied to a given substrate in the following manner.

For example, the resist composition is applied to a base such as one for use in producing precision integrated-circuit elements (e.g., a silicon base coated with silicon dioxide) by an appropriate coating technique using a spinner, coater, or the like and then dried to form a photosensitive film.

This photosensitive film is irradiated with actinic rays or a radiation through a given mask, subsequently baked (heated), and then developed. Thus, a satisfactory pattern can be obtained.

Examples of the actinic rays or radiation include infrared rays, visible light, ultraviolet rays, far ultraviolet rays, X-rays, and electron beams. Preferred are far ultraviolet rays having a wavelength of preferably 250 nm or shorter, more preferably 220 nm or shorter, such as, e.g., KrF excimer laser light (248 nm), ArF excimer laser light (193 nm), and $F_2$ excimer laser light (157 nm), X-rays, electron beams, and the like. In particular, ArF excimer laser light, $F_2$ excimer laser light, and EWV (13 nm) are preferred.

In the development step, an alkaline developer is used in the following manner. As an alkaline developer for the resist composition can be used an alkaline aqueous solution of, e.g., an inorganic alkali such as sodium hydroxide, potassium hydroxide, sodium carbonate, sodium silicate, sodium metasilicate, or ammonia water, a primary amine such as ethylamine or n-propylamine, a secondary amine such as diethylamine or di-n-butylamine, a tertiary amine such as triethylamine or methyldiethylamine, an alcoholamine such as dimethylethanolamine or triethanolamine, a quaternary ammonium salt such as tetramethylammonium hydroxide or tetraethylammonium hydroxide, or a cyclic amine such as pyrrole or piperidine.

It is also possible to add an alcohol or a surfactant in an appropriate amount to the alkaline developer to be used.

The alkali concentration of the alkaline developer is generally 0.1-20% by mass.

The pH of the alkaline developer is generally 10.0-15.0.

EXAMPLES

The invention will be explained below in more detail by reference to Examples, but the contents of the invention should not be construed as being limited by the following Examples.

<Synthesis of Compound (A)>

Synthesis Example 1

Synthesis of Compound ((II)-1/(I)-44 (=1/1))

To a mixture of 25 mL of acetonitrile and 15 mL of water were added 8.44 g (18.6 mmol) of diiodoperfluorobutane, 8.50 g (48.8 mmol) of sodium hydrosulfite, and 4.60 g (55 mmol) of sodium hydrogen carbonate. The resultant mixture was stirred at room temperature for 1 hour. This reaction mixture solution was filtered and the filtrate was cooled with ice. As a result, a white solid precipitated. This precipitate was taken out by filtration and dried to obtain sodium perfluorobutane-1,4-disulfinate in an amount of 6.8 g (98%). Subsequently, 7.2 g (19.2 mmol) of the sodium perfluorobutane-1,4-disulfinate was added to a mixture of 80 mL of aqueous hydrogen peroxide solution (30%) and 8 mL of acetic acid, and the resultant mixture was stirred at 60° C. for 4 hours. A reaction proceeded stoichiometrically. After completion of the reaction was ascertained by $^{19}$F-NMR spectroscopy, the reaction mixture was neutralized by adding 30 mL of 1-N NaOH solution thereto. Thus, an aqueous solution of perfluorobutane-1,4-disulfonic acid ((I)-44) was obtained.

$^{19}$F-NMR (300 MHz, $CD_3OD$) δ −114 (t, 4F), −120 (t, 4F)

To a mixture of 400 mL of acetonitrile and 200 mL of water were added 14.5 g (20.2 mmol) of the iodide of cation (II)-1 and 7.07 g (42.4 mmol) of silver acetate. The resultant mixture was stirred at room temperature for 1 hour. This reaction mixture solution was filtered to obtain a solution of the acetate of cation (II)-1.

To the aqueous solution of perfluorobutane-1,4-disulfonic acid ((I)-44) was added 13.6 g (19.2 mmol) of the solution of the acetate of cation (II)-1. This mixture was stirred at room temperature for 3 hours. Thereto was added 500 mL of chloroform. The organic layer was washed successively with water, saturated aqueous sodium sulfite solution, water, saturated aqueous ammonium chloride solution, and water. Subsequently, the solvent was removed with an evaporator and the residue was vacuum-dried to obtain the target compound.

<Synthesis of Resin (B)>

Synthesis Example 1

Synthesis of Resin (1) (Side Chain Type)

Into a reactor were introduced 2-ethyl-2-adamantyl methacrylate and butyrolactone methacrylate in a proportion of 55/45. These ingredients were dissolved in methyl ethyl ketone/tetrahydrofuran=5/5 to prepare 100 mL of a solution having a solid concentration of 20%. Polymerization initiator V-65, manufactured by Wako Pure Chemical, was added to the solution in an amount of 2 mol %. This mixture was added dropwise to 10 mL of methyl ethyl ketone heated to 60° C., over 4 hours in a nitrogen atmosphere. After completion of the dropwise addition, the liquid reaction mixture was heated for 4 hours and polymerization initiator V-65 was added thereto again in an amount of 1 mol %. The resultant mixture was stirred for 4 hours. After completion of the reaction, the liquid reaction mixture was cooled to room temperature and added to 3 L of a mixed solvent composed of distilled water/isopropyl alcohol=1/1 to cause crystallization therefrom. Thus, resin (1) was recovered as the precipitated white powder.

This resin had a polymer composition in terms of monomer unit ratio, as determined by $^{13}$C NMR spectroscopy, of 46/54. The weight-average molecular weight thereof as determined through measurement by GPC and calculation for standard polystyrene was 10,700.

Resins (2) to (12) were synthesized in the same manner as in Synthesis Example 1.

The structures and molecular weights of resins (1) to (12) are shown below.

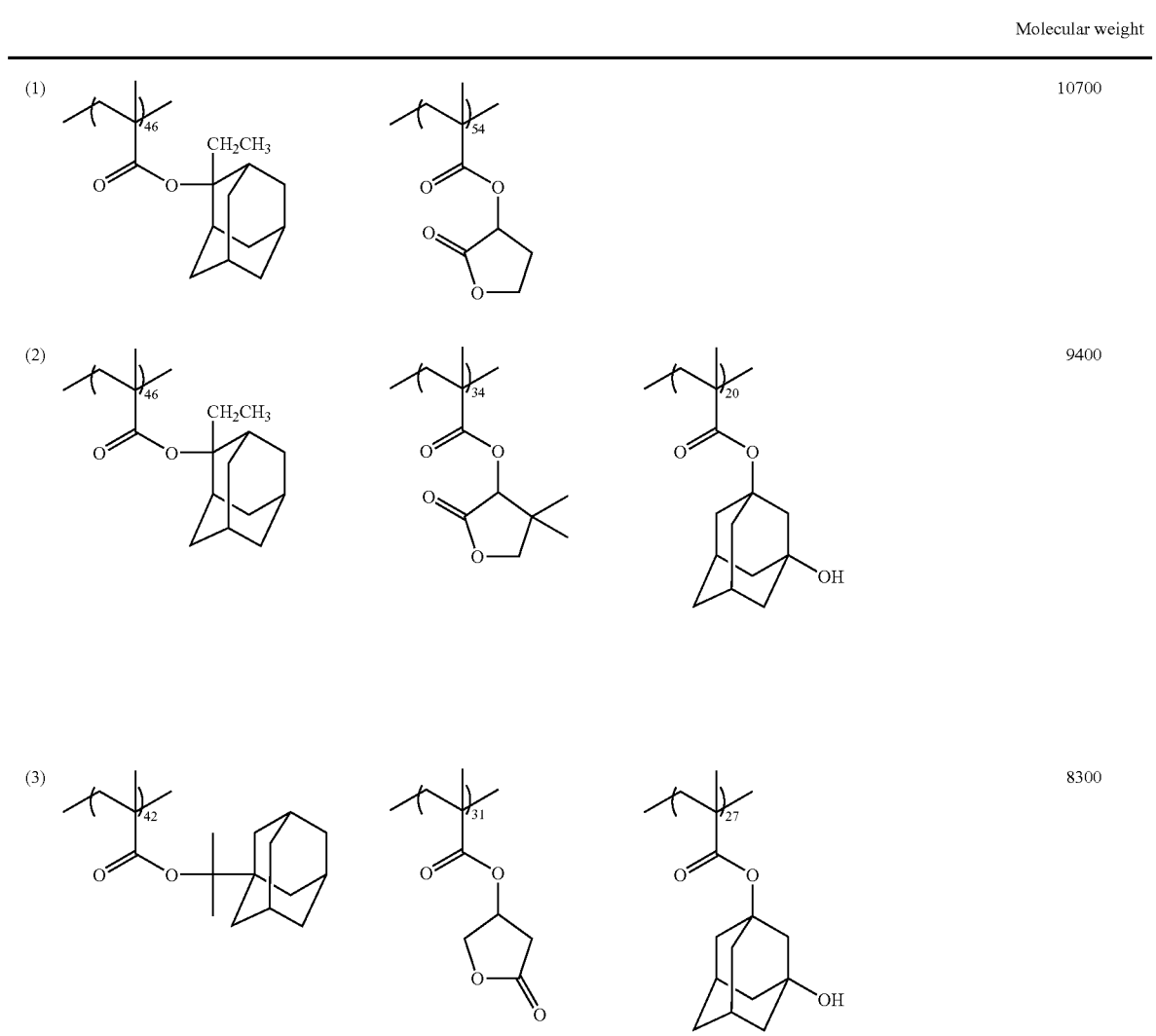

|  | Molecular weight |
|---|---|
| 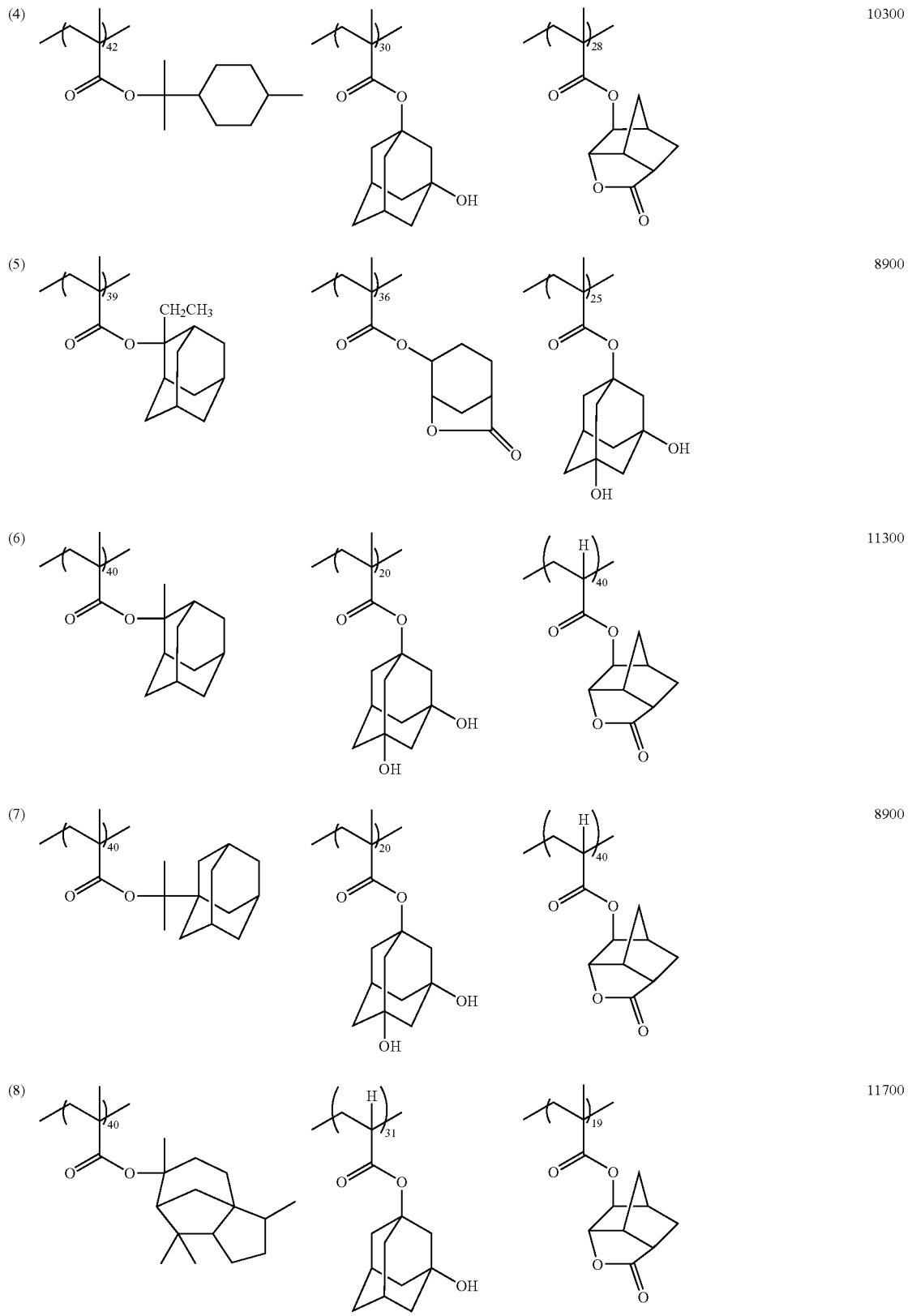 | 10300 |
| | 8900 |
| | 11300 |
| | 8900 |
| | 11700 |

| | Molecular weight |
|---|---|
| (9) [structures with n=40, 20, 40] | 9800 |
| (10) [structures with n=40, 20, 40] | 8700 |
| (11) [structures with n=40, 20, 40] | 13400 |
| (12) [structures with n=38, 20, 30, 12] | 10900 |

Examples 1 to 8 and Comparative Examples 1 to 5

<Resist Preparation>

The ingredients shown in Table 1 were dissolved in the solvent in the amounts shown in Table 2 to prepare a solution. This solution was filtered through a 0.1-μm polytetrafluoroethylene filter or polyethylene filter. Thus, positive resist solutions were prepared. The positive resist solutions prepared were evaluated by the methods shown below. The results obtained are shown in Table 1.

The following abbreviations were used in the Tables.

[Basic Compounds]
DBN: 1,5-diazabicyclo[4.3.0]non-5-ene
TPI: 2,4,5-triphenylimidazole
TPSA: triphenylsulfonium acetate
HEP: N-hydroxyethylpiperidine
DIA: 2,6-diisopropylaniline
DCMA: dicyclohexylmethylamine
TPA: tripentylamine
TOA: tri-n-octylamine HAP: hydroxyantipyrine
TBAH: tetrabutylammonium hydroxide
TMEA: tris(methoxyethoxyethyl)amine
PEA: N-phenyldiethanolamine
[Surfactants]
W-1: Megafac F176 (manufactured by Dainippon Ink & Chemicals, Inc.) (fluorochemical)
W-2: Megafac R08 (manufactured by Dainippon Ink & Chemicals, Inc.) (fluorochemical and silicone)
W-3: polysiloxane polymer KP-341 (manufactured by Shin-Etsu Chemical Co., Ltd.) (silicone)
W-4: Troysol S-366 (manufactured by Troy Chemical Co., Ltd.)
[Solvents]
A1: propylene glycol methyl ether acetate
A2: 2-heptanone
A3: ethyl ethoxypropionate
A4: γ-butyrolactone
A5: cyclohexanone
B1: propylene glycol methyl ether
B2: ethyl lactate
<Resist Evaluation>

Antireflection film DUV-42, manufactured by Brewer Science, was applied in an even thickness of 600 Å with a spin coater to a silicon substrate treated with hexamethyldisilazane. The coating was dried at 100° C. for 90 seconds on a hot plate and then heated and dried at 190° C. for 240 seconds. Thereafter, each positive resist solution was applied thereto with a spin coater and dried at 120° C. for 90 seconds to form a 0.30-μm resist film.

This resist film was exposed to light with an ArF excimer laser stepper (manufactured by ISI; NA=0.6) through a mask. Immediately after the exposure, the resist film was heated on a hot plate at 120° C. for 90 seconds. Furthermore, the resist film was developed with a 2.38% by mass aqueous solution of tetramethylammonium hydroxide at 23° C. for 60 seconds, rinsed with pure water for 30 seconds, and then dried to obtain a line pattern.

(PEB Temperature Dependence)

The exposure amount necessary for reproducing a mask pattern comprising 130-nm lines and spaces in a ratio of 1/1 through 90-second heating at 120° C. was taken as the optimal exposure amount. Subsequently, each resist film was exposed in the optimal exposure amount and then subjected to post-exposure heating at each of two temperatures which were higher by 2° C. and lower by 2° C., respectively, than that post-exposure heating temperature (i.e., 122° C. and 118° C.). The two line-and-space patterns thus obtained were examined to determine the line widths $L_1$ and $L_2$, respectively. PEB temperature dependence was defined as the line width change per unit PEB temperature change, 1° C., and was calculated using the following equation.

PEB temperature dependence (nm/° C.)=$|L_1-L_2|/4$

The smaller the value, the smaller the performance change with temperature and the better the performance.

(Sensitivity)

The exposure amount necessary for reproducing a mask pattern comprising 130-nm lines and spaces in a ratio of 1/1 was taken as sensitivity.

TABLE 1

| | Resin | Compound (A) (=molar ratio), molecular weight, <mass proportion*> | Compound (Ab) (=molar ratio) <mass proportion*> | Compound (Aa) (=molar ratio) <mass proportion*> | Compound (Aab) (=molar ratio) <mass proportion*> | Basic compound | Surfactant | Solvent (mass ratio) | PEB temperature dependence (nm/° C.) | Sensitivity (mJ/cm²) |
|---|---|---|---|---|---|---|---|---|---|---|
| Ex. 1 | (2) | (II)-5/(I)-44 (=1/1) 1005.15, <10> | — | — | — | TMEA | W-1 | A5/B1 (5/5) | 1.5 | 15 |
| Ex. 2 | (3) | (II)-7/(I)-48 (=1/1) 824.54, <5> | (IV)-1/(I)-48 (=2/1) <2> | (II)-7/(III)-18 (=1/2) <3> | — | DCMA | W-3 | A5/A1 (5/5) | 2.2 | 19 |
| Ex. 3 | (6) | (II)-5/(I)-43 (=1/1) 955.14, <4> | (IV)-1/(I)-43 (=2/1) <6> | — | — | TPI | W-1 | A1/B1 (3/2) | 2.0 | 17 |
| Ex. 4 | (7) | (II)-1/(I)-43 (=1/1) 899.04, <6> | — | — | (IV)-2/(III)-16 (=1/1) <4> | DIA | W-1 | A5/A1 (4/6) | 2.4 | 22 |
| Ex. 5 | (11) | (II)-1/(I)-43 (=1/1) 899.04, <2> | (IV)-1/(I)-43 (=2/1) <2> | — | (IV)-6/(III)-16 (=1/1) <6> | TMEA | W-1 | A5 | 2.7 | 24 |
| Ex. 6 | (11) | (II)-1/(I)-43 (=1/1) 899.04, <4> | — | (II)-1/(III)-16 (=1/2) <2> | (IV)-6/(III)-16 (=1/1) <4> | TMEA | W-1 | A5 | 3.0 | 23 |
| Ex. 7 | (7) | (II)-10/(I)-43 (=2/3) 1224.55, <10> | — | — | — | TMEA | W-1 | A5/A1 (5/5) | 1.3 | 15 |
| Ex. 8 | | (II)-7/(I)-43 (=1/1) 758.79, <10> | — | — | — | TMEA | — | pure water | 1.0 | 10 |
| Comp. Ex. 1 | (3) | — | — | — | (IV)-2/(III)-16 (=1/1) <10> | TMEA | W-1 | A5 | 5.8 | 33 |
| Comp. Ex. 2 | (2) | — | — | (II)-1/(III)-16 (=1/2) <10> | — | TMEA | W-1 | A5 | 4.8 | 35 |
| Comp. Ex. 3 | (2) | — | (IV)-1/(I)-48 (=2/1) <10> | — | — | TMEA | W-1 | A5 | 4.8 | 38 |

TABLE 1-continued

|  | Resin | Compound (A) (=molar ratio), molecular weight, <mass proportion*> | Compound (Ab) (=molar ratio) <mass proportion*> | Compound (Aa) (=molar ratio) <mass proportion*> | Compound (Aab) (=molar ratio) <mass proportion*> | Basic compound | Surfactant | Solvent (mass ratio) | PEB temperature dependence (nm/° C.) | Sensitivity (mJ/cm$^2$) |
|---|---|---|---|---|---|---|---|---|---|---|
| Comp. Ex. 4 | (2) | — | (IV)-1/(I)-48 (=2/1) <5> | — | (IV)-1/(III)-16 (=1/1) <5> | TMEA | W-1 | A5 | 5.3 | 37 |
| Comp. Ex. 5 | (2) | — | — | (II)-1/(III)-16 (=1/2) <4> | (IV)-2/(III)-16 (=1/1) <6> | TMEA | W-1 | A5 | 5.5 | 36 |

<mass proportion*> indicates the mass proportion of each compound to the sum of compounds (A), (Aa), (Ab), and (Aab) which is taken as 10.

TABLE 2

|  | Resin | Total amount of compounds (A), (Ab), (Aa), and (Aab) | Basic compound | Surfactant | Solvent |
|---|---|---|---|---|---|
| Ex. 1 | 5 g | 0.15 g | 0.015 g | 0.00052 g | 70 g |
| Ex. 2 | 5 g | 0.15 g | 0.015 g | 0.00052 g | 70 g |
| Ex. 3 | 5 g | 0.30 g | 0.03 g | 0.00053 g | 66 g |
| Ex. 4 | 5 g | 0.50 g | 0.05 g | 0.00055 g | 50 g |
| Ex. 5 | 5 g | 0.50 g | 0.05 g | 0.00055 g | 50 g |
| Ex. 6 | 5 g | 0.50 g | 0.05 g | 0.00055 g | 50 g |
| Ex. 7 | 5 g | 0.30 g | 0.03 g | 0.00053 g | 66 g |

TABLE 2-continued

|  | Resin | Total amount of compounds (A), (Ab), (Aa), and (Aab) | Basic compound | Surfactant | Solvent |
|---|---|---|---|---|---|
| Ex. 8 | — | 5.0 g | 0.50 g | 0.00055 g | 100 g |
| Comp. Ex. 1 | 5 g | 0.15 g | 0.015 g | 0.00052 g | 70 g |
| Comp. Ex. 2 | 5 g | 0.15 g | 0.015 g | 0.00052 g | 70 g |
| Comp. Ex. 3 | 5 g | 0.15 g | 0.015 g | 0.00052 g | 70 g |
| Comp. Ex. 4 | 5 g | 0.15 g | 0.015 g | 0.00052 g | 70 g |
| Comp. Ex. 5 | 5 g | 0.15 g | 0.015 g | 0.00052 g | 70 g |

It is apparent from the results given in Table 1 that the positive resist compositions of the invention in ArF exposure have small PEB temperature dependence and high sensitivity.

Example 9 and Comparative Example 6

<Resist Preparation and Evaluation>
The ingredients shown in Table 3 were dissolved in the solvent to prepare a solution. This solution was filtered through a 0.1-μm polytetrafluoroethylene filter or polyethylene filter. Thus, negative resist solutions were prepared.

Each negative resist solution prepared was evenly applied with a spin coater to a silicon substrate treated with hexamethyldisilazane. The coating was heated and dried on a hot plate at 120° C. for 90 seconds to form a 0.6-μm resist film.

This resist film was pattern-wise exposed to light with a KrF excimer laser stepper (NA=0.63) using a mask for line-and-space pattern formation. Immediately after the exposure, the resist film was heated on a hot plate at 110° C. for 90 seconds. Furthermore, the resist film was developed with a 2.38% by mass aqueous solution of tetramethylammonium hydroxide at 23° C. for 60 seconds, rinsed with pure water for 30 seconds, and then dried to obtain a line pattern. The PEB temperature dependence and sensitivity of each resist solution were evaluated in the same manners as in Example 1. The results obtained are shown in Table 3.

TABLE 3

|  | Resin (5 g) | Compound (A) (=molar ratio), molecular weight, (0.30 g) | Compound (Aab) (=molar ratio) (0.30 g) | Crosslinking agent (0.75 g) | Basic compound (0.03 g) | Surfactant (0.00060 g) | Solvent (75 g) (mass ratio) | PEB temperature dependence (nm/° C.) | Sensitivity (mJ/cm$^2$) |
|---|---|---|---|---|---|---|---|---|---|
| Ex. 9 | P-1 | (II)-5/(I)-44 (=1/1) 1005.15 | — | Glycoluril A | TMEA | W-1 | A5/B1 (5/5) | 1.7 | 20 |
| Comp. Ex. 6 | P-1 | — | (III)-2/(IV)-16 (=1/1) | Glycoluril A | TMEA | W-1 | A5/B1 (5/5) | 6.0 | 42 |

In Table 3, the following abbreviations were used.
P-1: alkali-soluble resin (VP-5000, manufactured by Nippon Soda; poly(p-hydroxystyrene); weight-average molecular weight, 6,000)
Glycoluril A: compound having the following structure

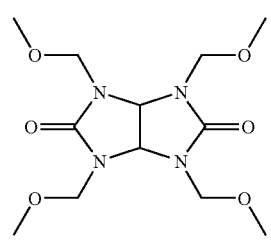

It is apparent from the results given in Table 3 that the negative resist composition of the invention in KrF exposure has small PEB temperature dependence and high sensitivity.

According to the invention, a resist composition improved in PEB temperature dependence and sensitivity and a method of pattern formation with the composition can be provided.

The entire disclosure of each and every foreign patent application from which the benefit of foreign priority has been claimed in the present application is incorporated herein by reference, as if fully set forth.

What is claimed is:

1. A resist composition comprising
   (A) a compound having a molecular weight of 3,000 or lower which has in its molecule a structure having two or more monovalent anions and a structure having two or more monovalent cations; and
   further comprising a compound having in its molecule a structure having one monovalent anion,
   a resin selected from (B) a resin which decomposes by the action of an acid to come to have enhanced its solubility in an alkaline developer and (D) a resin soluble in an alkaline developer; and
   (H) an organic solvent.

2. The resist composition of claim 1,
   wherein the compound (A) has at least one of (i) a structure represented by the following general formula (I) and (ii) a structure represented by the following general formula (II):

wherein
   $A_1$ represents a connecting group having a valence of $n_1$;
   $A_2$ represents a single bond, a divalent aliphatic group, or an arylene group, provided that the $n_1$ $A_2$'s may be the same or different;
   $Y_1$ represents $SO_3$, $CO_2$, or $PO_3H$, provided that the $Y_1$'s may be the same or different; and
   $n_1$ represents an integer of 2 to 4,

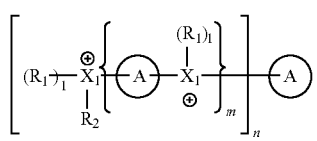

wherein
   $X_1$ represents a sulfur atom, an iodine atom, or a nitrogen atom, provided that the $X_1$'s may be the same or different;
   $R_1$ and $R_2$ each independently represent an alkyl group, a cycloalkyl group, or an aryl group, provided that when two or more $R_1$'s are present, the $R_1$'s may be the same or different and that when two or more $R_2$'s are present, the $R_2$'s may be the same or different;
   A represents a hydrocarbon structure which connects $X_1$'s to each other, provided that when two or more A's are present, the A's may be the same or different;
   $R_1$ and $R_2$, $R_1$ and A, or $R_2$ and A may be bonded to each other to form a ring;
   l represents 0, 1, or 2, provided that when $X_1$ is a nitrogen atom, then l is 2, when $X_1$ is a sulfur atom, then l is 1, and when $X_1$ is an iodine atom, then l is 0;
   m represents an integer of 0 to 10; and
   n represents an integer of 1 to 6,
   provided that when m is 0, then n is an integer of 2 or larger.

3. The resist composition of claim 2, wherein at least one of the $Y_1$'s in general formula (I) is selected from $SO_3$ and $CO_2$, and at least one of the group represented by $A_1$ and the groups represented by $A_2$ has one or more fluorine atoms.

4. The resist composition of claim 2, wherein $Y_1$ represents $CO_2$ or $PO_3H$.

5. The resist composition of claim 2, wherein the connecting group represented by $A_1$ is selected from the group consisting of an alkylene group, a cycloalkylene group, an alkenylene group, a single bond, an ether bond, an ester bond, an amide bond, a sulfide bond, a urea bond, and a connecting group made up of two or more of these connected to each other.

6. The resist composition of claim 2, wherein $A_2$ represents a divalent aliphatic group or an arylene group.

7. The resist composition of claim 2, wherein $X_1$ represents an iodine atom or a nitrogen atom.

8. The resist composition of claim 1, wherein the structure having one monovalent anion is represented by the following general formula (III):

wherein
   $A_3$ represents an alkyl group, an alicyclic group, or an aryl group; and
   $Y_2$ represents $SO_3$, $CO_2$, or $PO_3H$.

9. The resist composition of claim 8, wherein $Y_2$ in general formula (III) is selected from $SO_3$ and $CO_2$.

10. The resist composition of claim 1, which further comprises a compound having a structure represented by the following general formula (IV):

wherein
    $X_2$ represents a sulfur atom, an iodine atom, or a nitrogen atom;
    $R_{1a}$ represents an alkyl group, a cycloalkyl group, or an aryl group, provided that the $R_{1a}$'s may be the same or different and that two or more of the $R_{1a}$'s may be bonded to each other to form a ring; and
    q represents 2, 3, or 4, provided that when $X_2$ is a nitrogen atom, then q is 4, when $X_2$ is a sulfur atom, then q is 3, and when $X_2$ is an iodine atom, then q is 2.

11. A method of pattern formation which comprises:
    forming a film from the resist composition of claim 1;
    exposing the film to a light, so as to form an exposed film; and
    developing the exposed film.

12. The resist composition of claim 1, wherein the resin (B) comprises fluorine atoms in the main chain or side chains thereof.

13. The resist composition of claim 12, wherein the resin (B) comprises a hexafluoroisopropanol structure.

14. The resist composition of claim 1, wherein the resin (B) comprises hydroxystyrene structural units.

15. The resist composition of claim 1, wherein the resin (B) comprises a monocyclic or polycyclic, alicyclic hydrocarbon structure.

16. The resist composition of claim 15, wherein the resin (B) further comprises repeating units having a lactone structure.

17. The resist composition of claim 1, which further comprises (C) a dissolution inhibitive compound having a molecular weight of 3,000 or lower which decomposes by the action of an acid to come to have its enhanced solubility in an alkaline developing solution.

18. The resist composition of claim 1 which further comprises at least one of:
    (F) a basic compound; and
    (G) a surfactant having at least one of a fluorine atom and a silicon atom.

19. The resist composition of claim 18, wherein the basic compound (F) is (i) a compound having a structure selected from an imidazole structure, diazabicyclo structure, onium hydroxide structure, onium carboxylate structure, trialkylamine structure, aniline structure and pyridine structure, (ii) an alkylamine derivative having at least one of a hydroxyl group and an ether bond, or (iii) an aniline derivative having at least one of a hydroxyl group and an ether bond.

* * * * *